United States Patent
Berner et al.

(10) Patent No.: US 6,203,582 B1
(45) Date of Patent: Mar. 20, 2001

(54) MODULAR SEMICONDUCTOR WORKPIECE PROCESSING TOOL

(75) Inventors: Robert W. Berner; Daniel J. Woodruff; Wayne J. Schmidt; Kevin W. Coyle, all of Kalispell, MT (US); Vladimir Zila, Carbough (CA); Worm Lund, Bellevue, WA (US)

(73) Assignee: Semitool, Inc., Kalispell, MT (US)

(*) Notice: Subject to any disclaimer, the term of this patent is extended or adjusted under 35 U.S.C. 154(b) by 0 days.

(21) Appl. No.: 08/680,068

(22) Filed: Jul. 15, 1996

(51) Int. Cl.[7] .......................... H01L 21/00; H01L 21/64; B65G 49/07
(52) U.S. Cl. .......................... 29/25.01; 414/941
(58) Field of Search .......................... 29/25.01; 438/800, 438/908, 973, FOR 437; 414/936, 937, 938, 939, 940, 941

(56) References Cited

U.S. PATENT DOCUMENTS

| | | |
|---|---|---|
| 3,968,885 | 7/1976 | Hassan et al. . |
| 4,431,361 | 2/1984 | Bayne . |
| 4,449,885 | 5/1984 | Hertel et al. . |
| 4,693,017 | 9/1987 | Oehler et al. . |
| 4,924,890 | 5/1990 | Giles . |
| 4,962,726 | 10/1990 | Matsushita et al. . |
| 5,026,239 | 6/1991 | Chiba et al. . |
| 5,054,988 | 10/1991 | Shiraiwa . |
| 5,055,036 | 10/1991 | Asano et al. . |
| 5,083,364 | * 1/1992 | Olbrich et al. . |
| 5,110,248 | 5/1992 | Asano et al. . |
| 5,125,784 | 6/1992 | Asano . |
| 5,168,886 | 12/1992 | Thompson et al. . |
| 5,168,887 | 12/1992 | Thompson et al. . |
| 5,174,045 | 12/1992 | Thompson et al. . |
| 5,178,639 | 1/1993 | Nishi . |
| 5,180,273 | 1/1993 | Sakaya et al. . |
| 5,186,594 | 2/1993 | Toshima et al. . |
| 5,232,511 | 8/1993 | Bergman . |
| 5,235,995 | 8/1993 | Bergman et al. . |
| 5,238,500 | 8/1993 | Bergman . |
| 5,252,137 | 10/1993 | Tateyama et al. . |
| 5,301,700 | 4/1994 | Kamikawa et al. . |
| 5,332,445 | 7/1994 | Bergman . |
| 5,377,708 | * 1/1995 | Bergman et al. . |
| 5,388,945 | 2/1995 | Garric et al. . |
| 5,464,313 | 11/1995 | Ohsawa . |
| 5,500,081 | 3/1996 | Bergman . |
| 5,544,421 | * 8/1996 | Thompson et al. . |
| 5,575,611 | * 11/1996 | Thompson et al. . |
| 5,658,387 | * 8/1997 | Reardon et al. . |
| 5,660,517 | * 8/1997 | Thompson et al. . |
| 5,678,320 | * 10/1997 | Thompson et al. . |

FOREIGN PATENT DOCUMENTS

| | | |
|---|---|---|
| 0047132 | 3/1982 | (EP) . |
| 0452939 | 10/1991 | (EP) . |
| 544311 | * 6/1993 | (EP) . |
| 0582019 | 9/1994 | (EP) . |
| 2217107 | * 10/1989 | (GB) . |
| 64-48442 | 2/1989 | (JP) . |
| 4-144150 | 5/1992 | (JP) . |
| 5-146984 | 6/1993 | (JP) . |
| 5-211224 | 8/1993 | (JP) . |
| WO 95/06326 | 3/1995 | (WO) . |

* cited by examiner

Primary Examiner—David E. Graybill
(74) Attorney, Agent, or Firm—Polit & Associates, LLC

(57) ABSTRACT

The present invention provides for a semiconductor workpiece processing tool. The semiconductor workpiece processing tool includes an interface section comprising at least one interface module and a processing section comprising a plurality of processing modules for processing the semiconductor workpieces. The semiconductor workpiece processing tool has a conveyor for transferring the semiconductor workpieces between the interface modules and the processing modules.

14 Claims, 46 Drawing Sheets

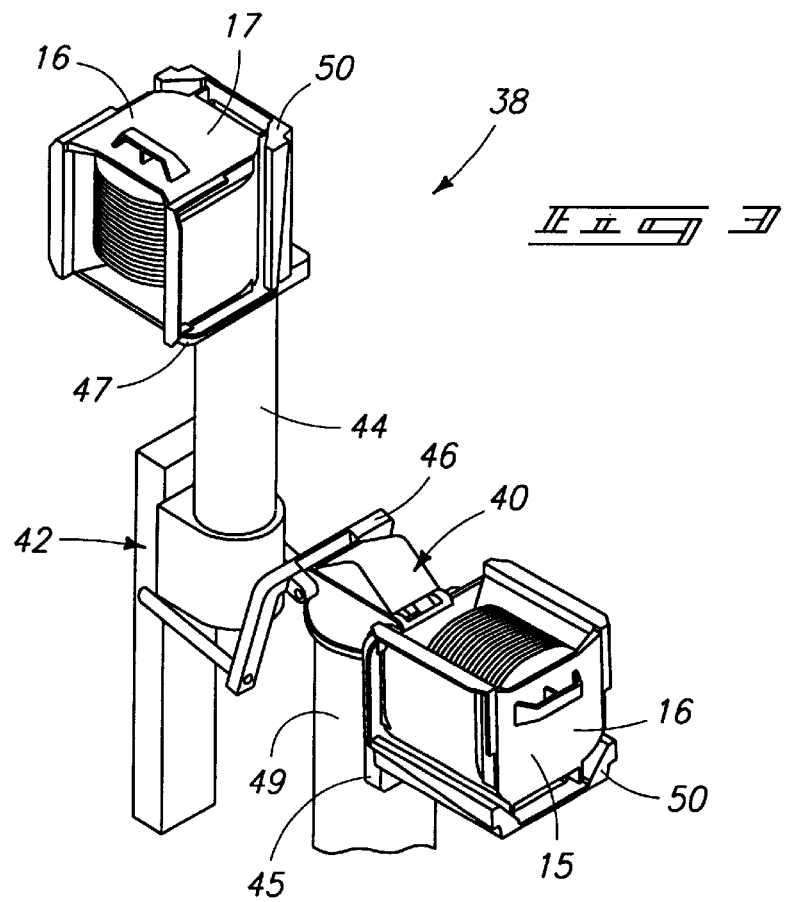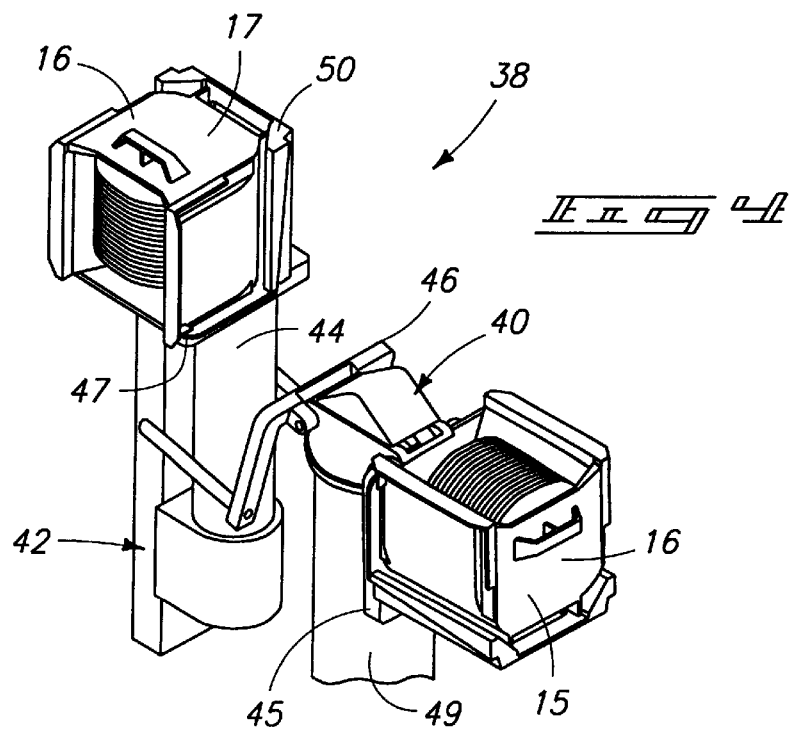

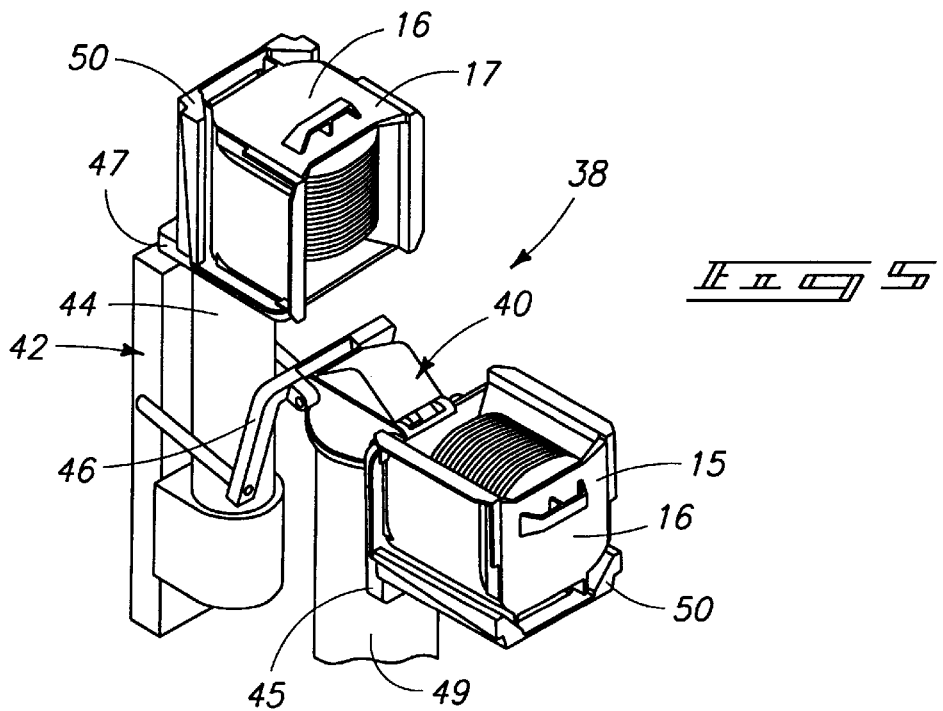
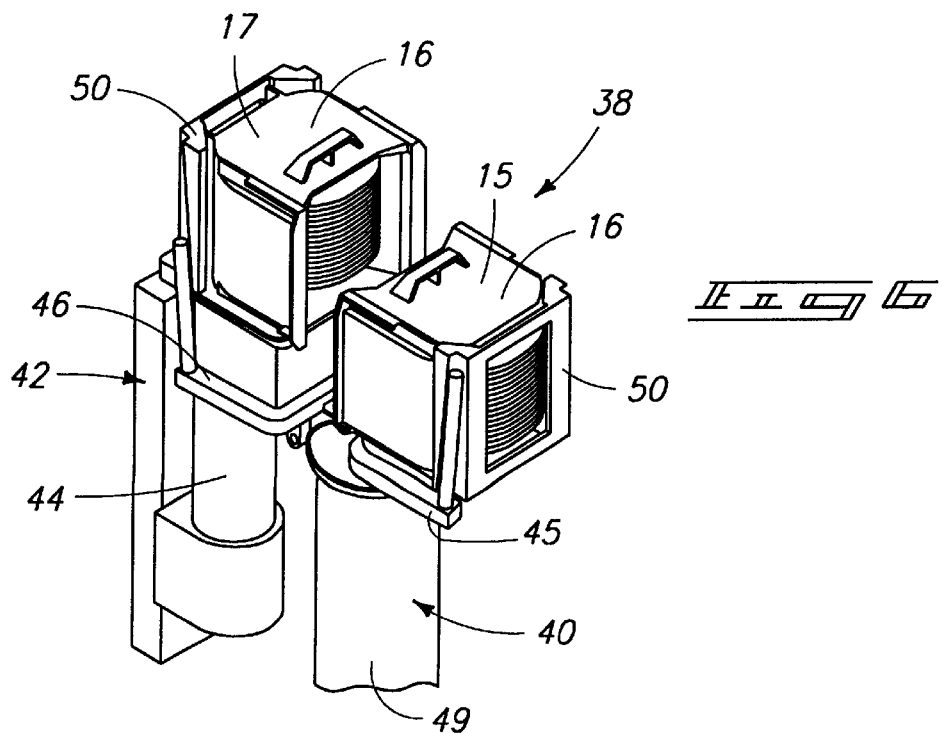

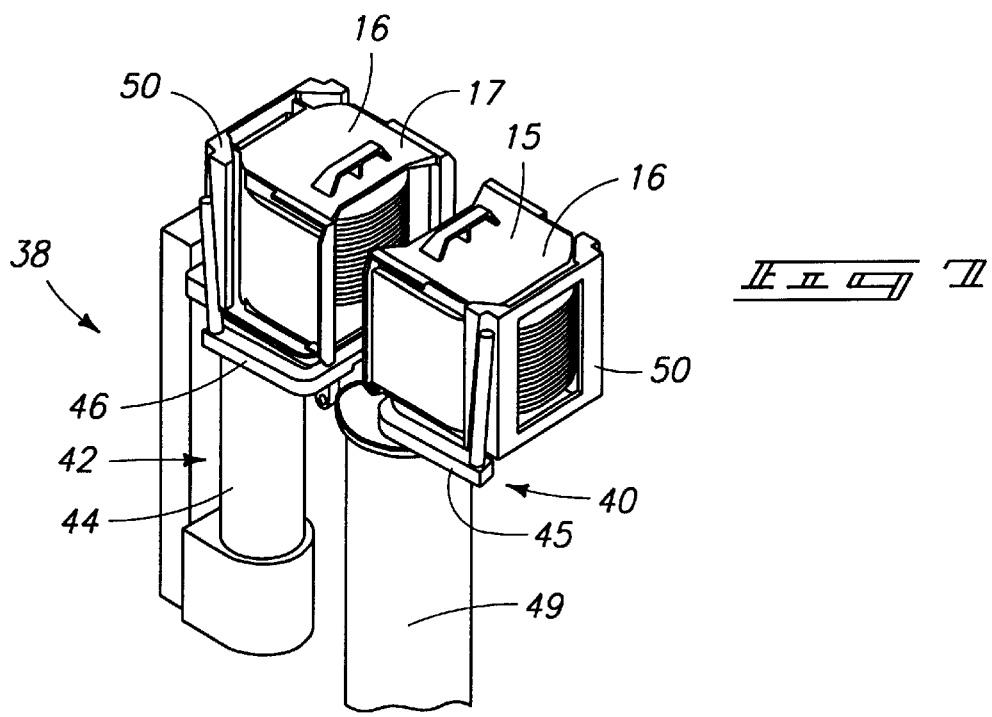
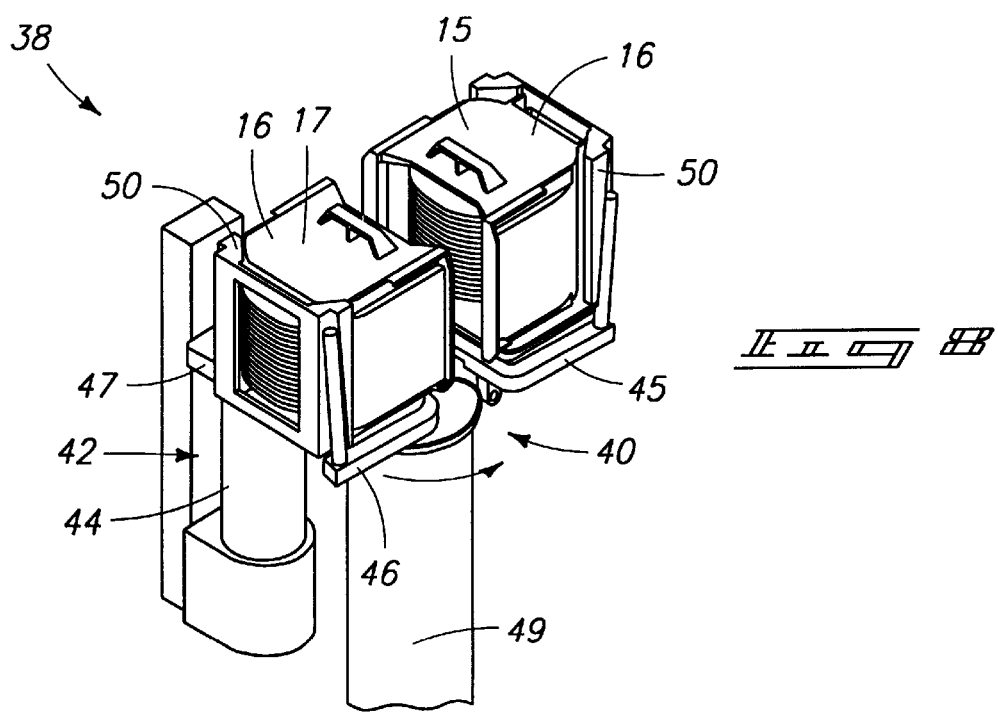

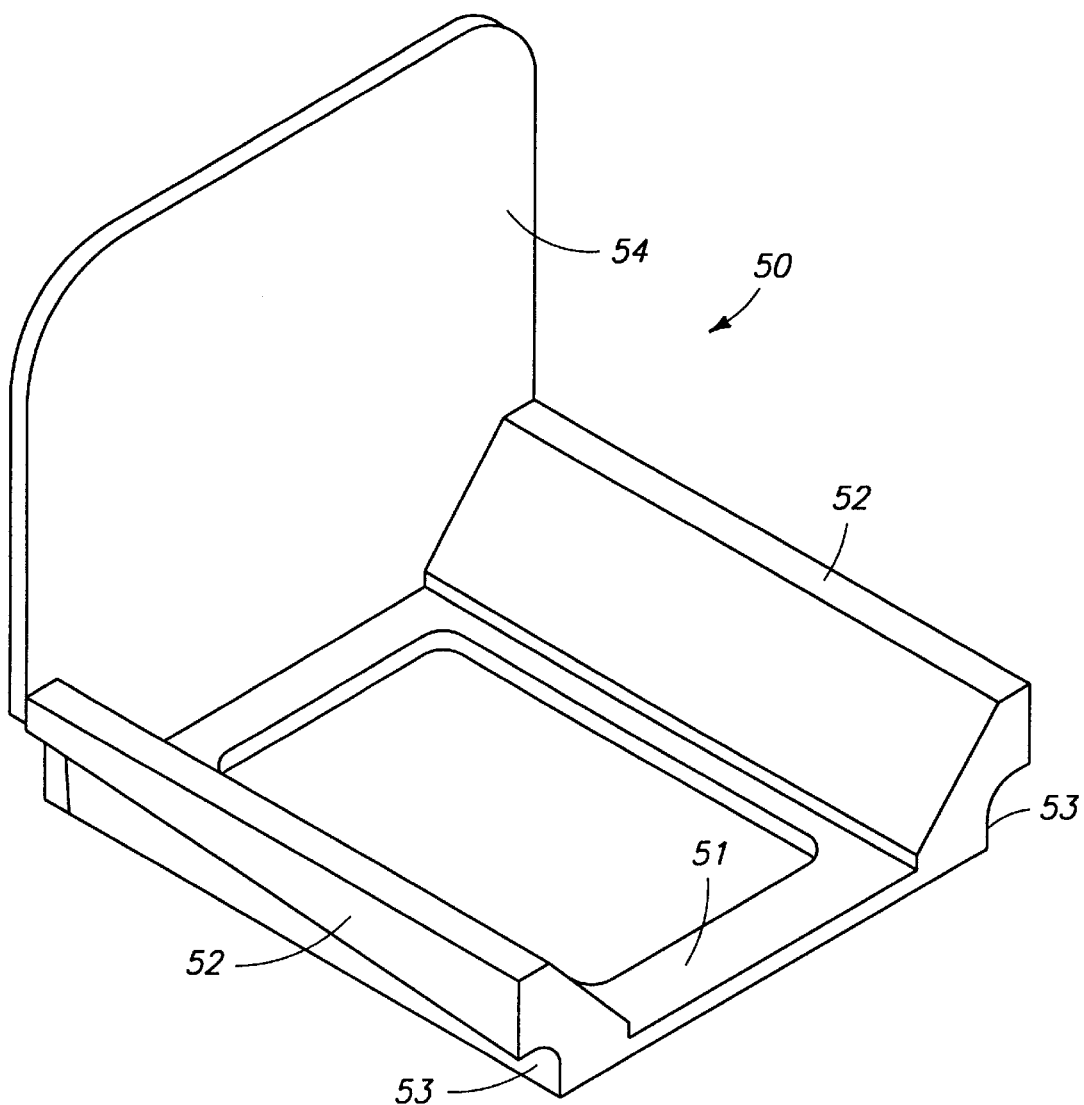

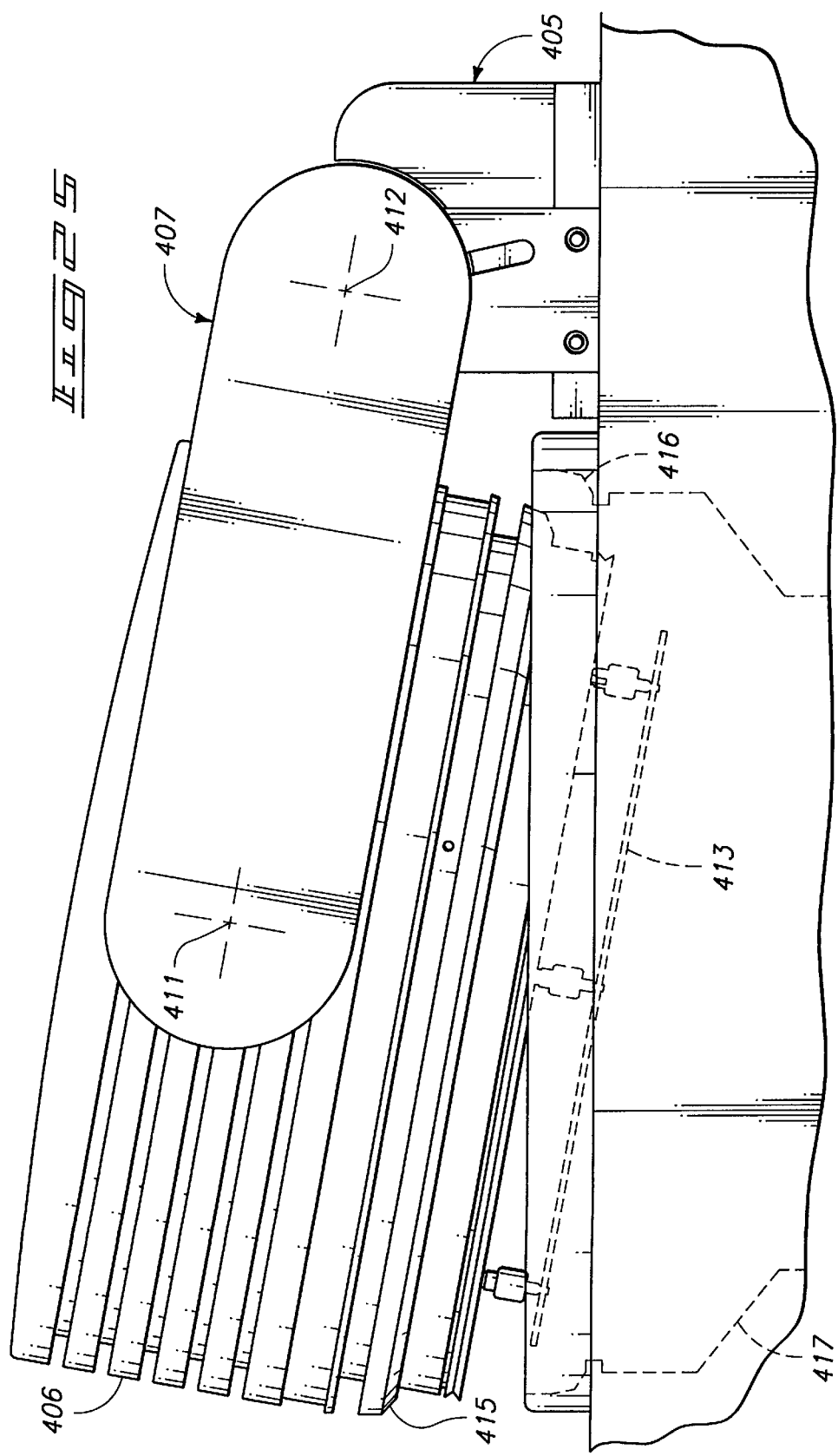

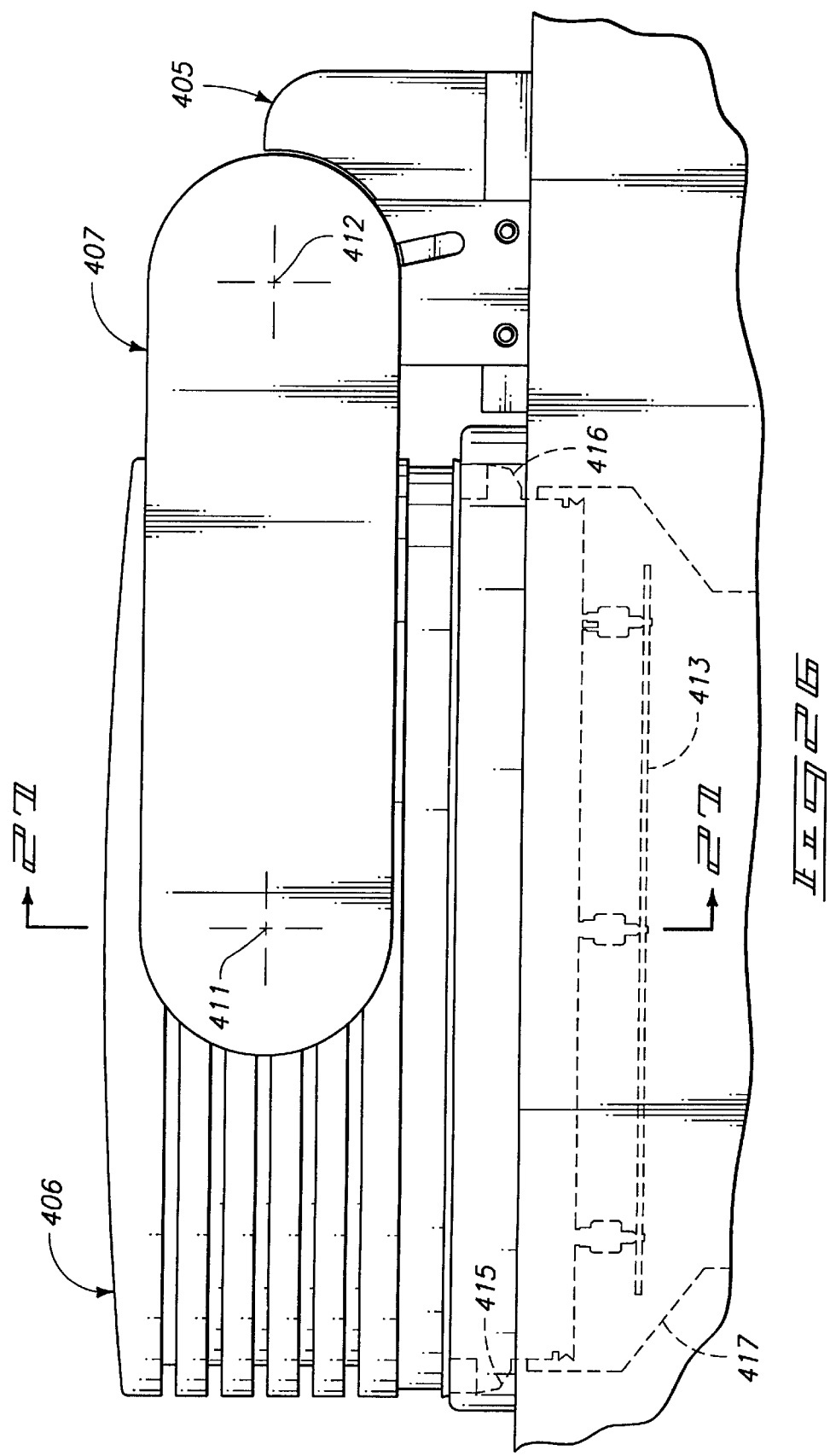

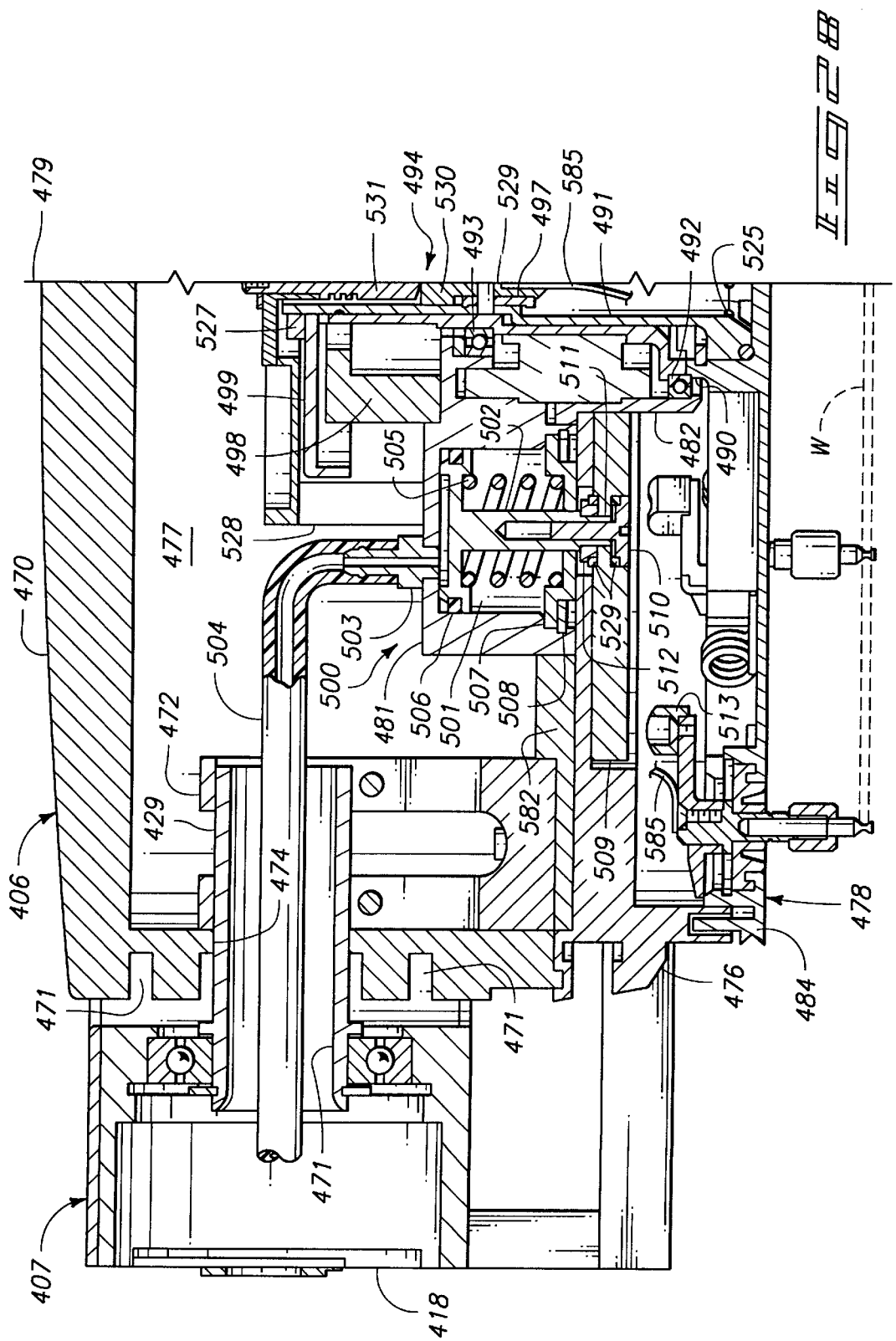

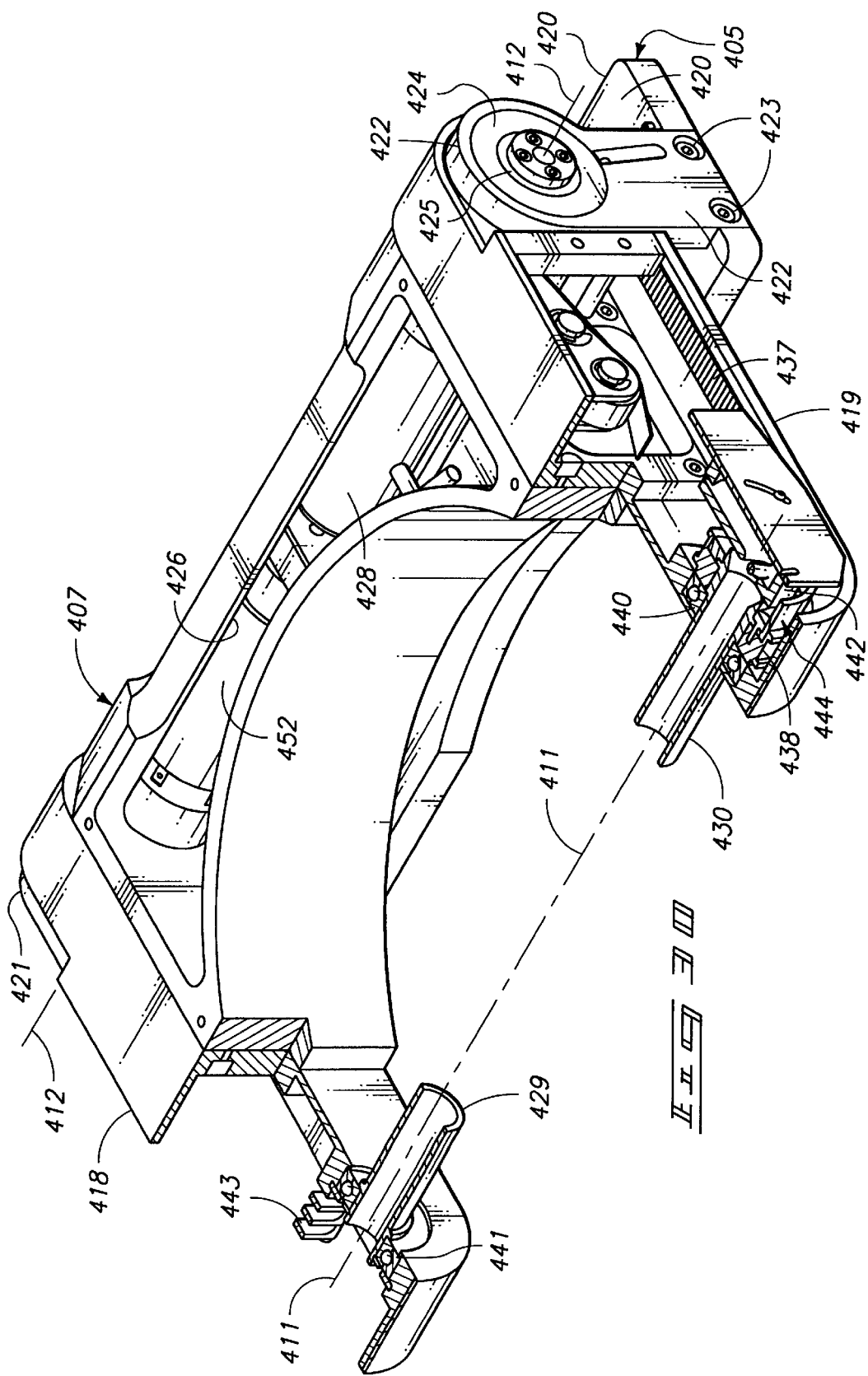

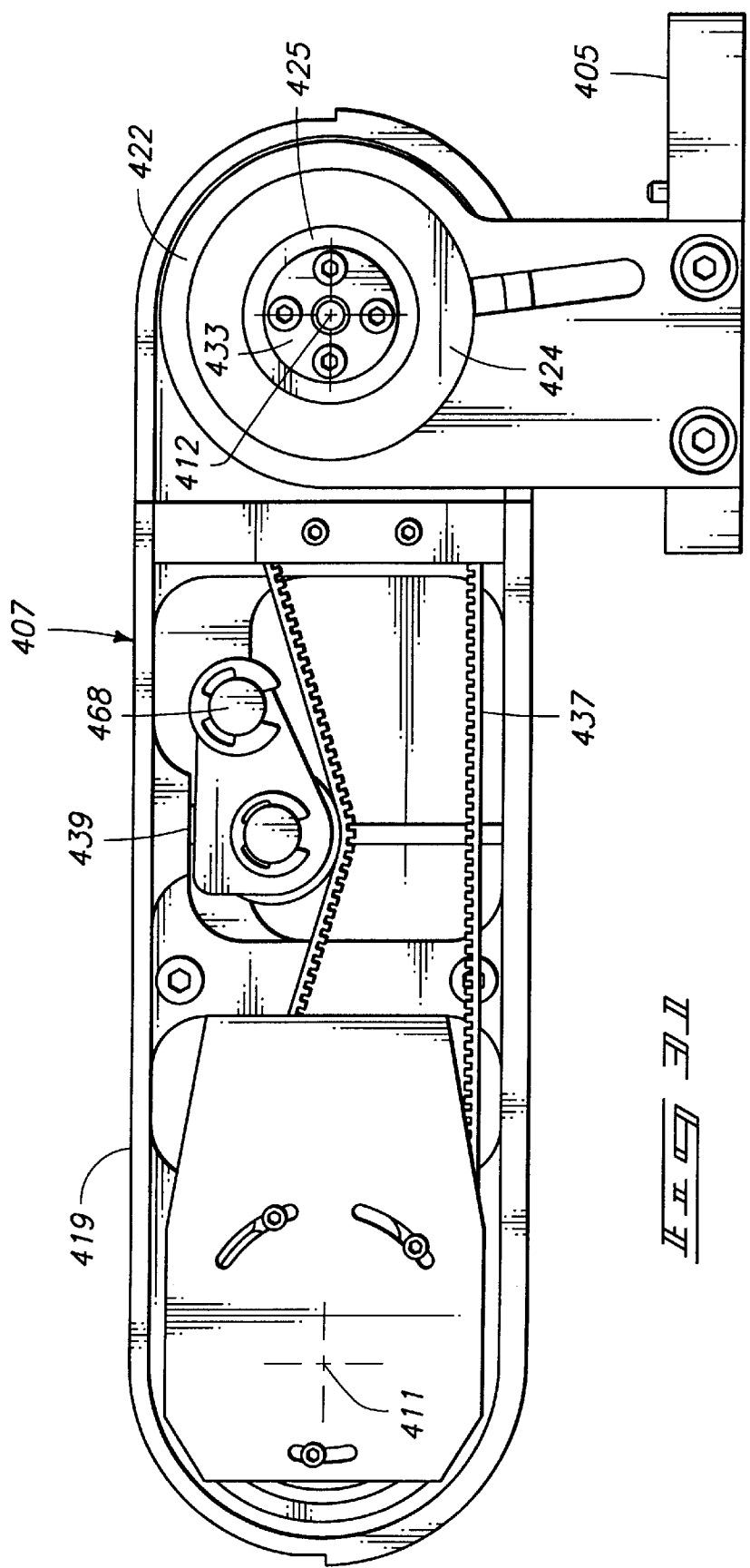

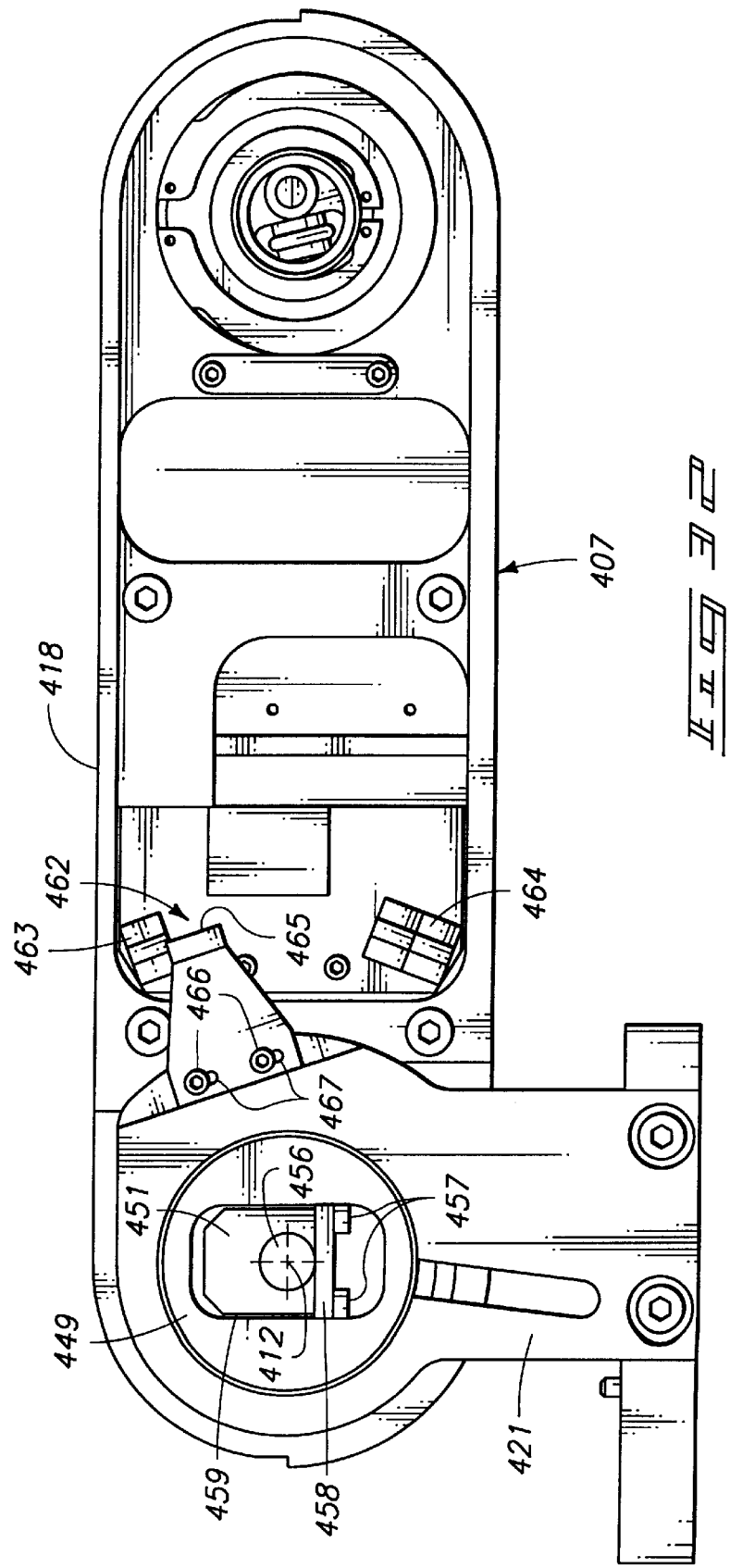

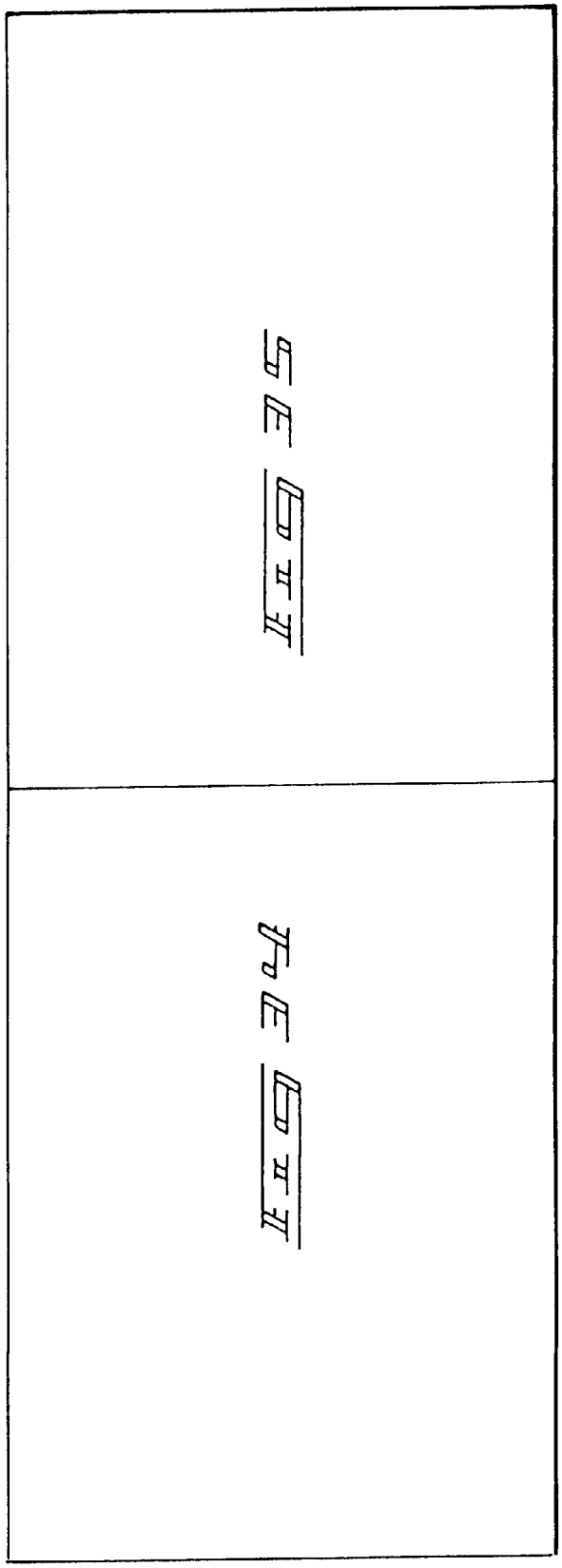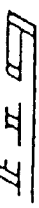

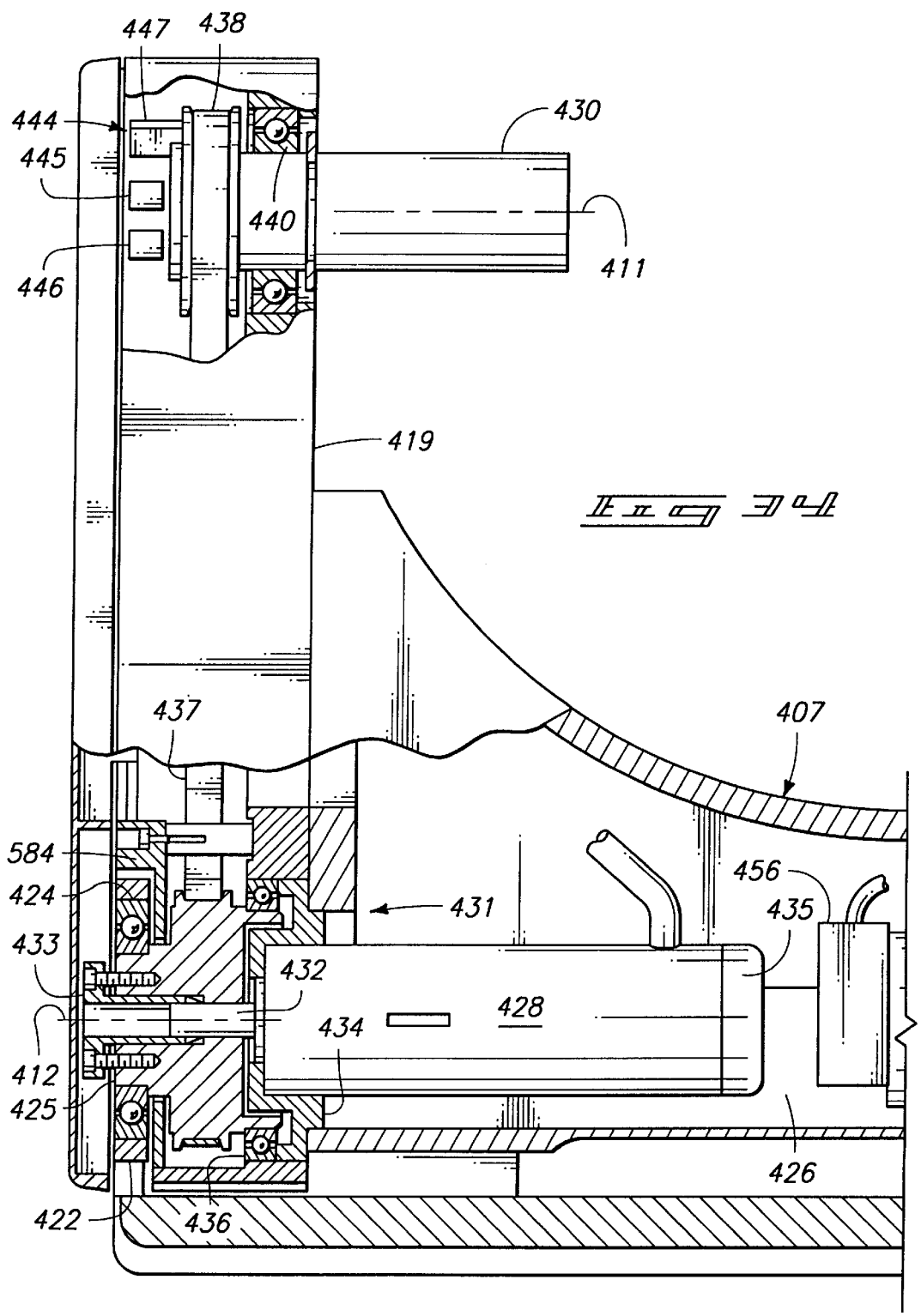

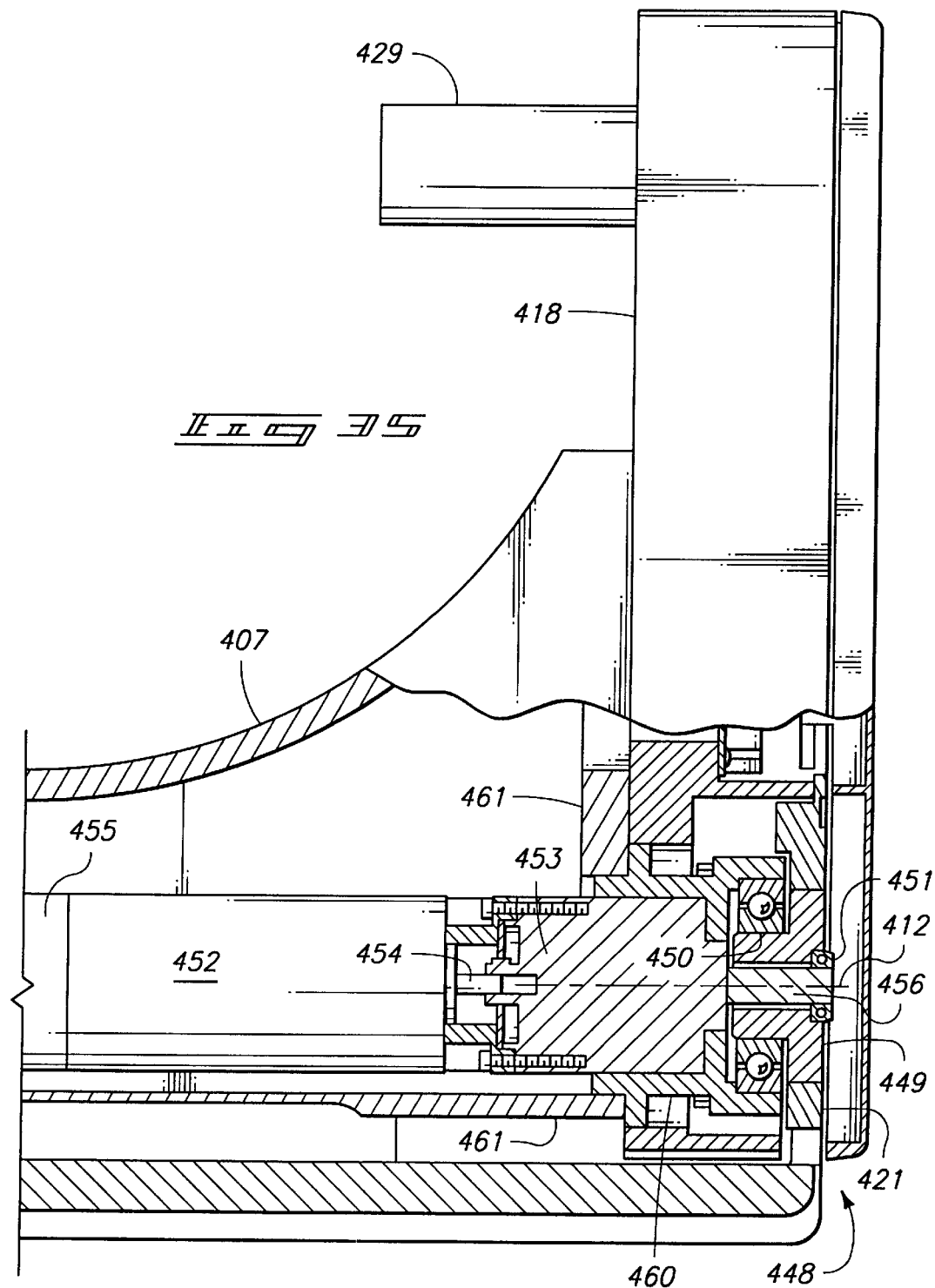

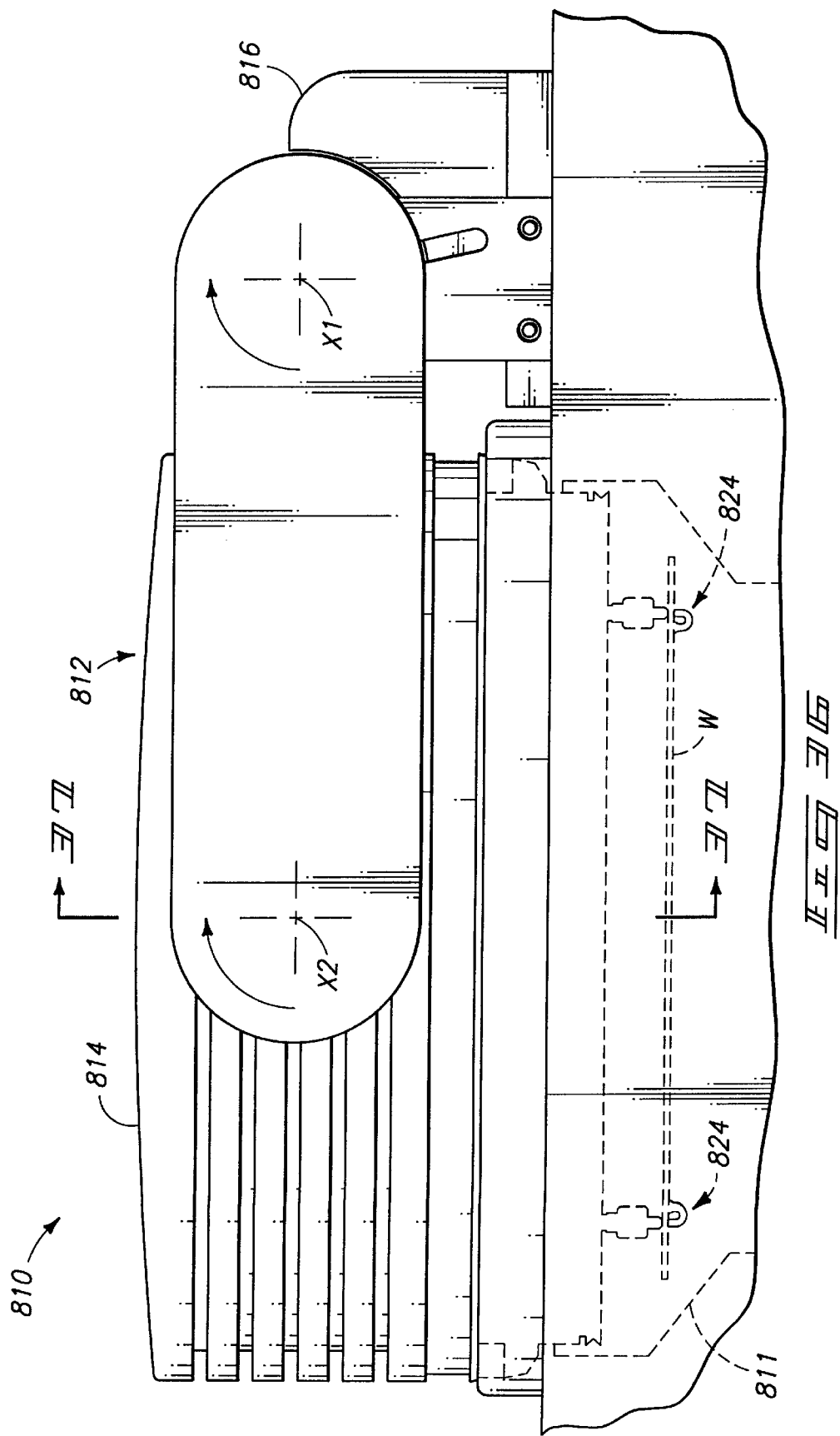

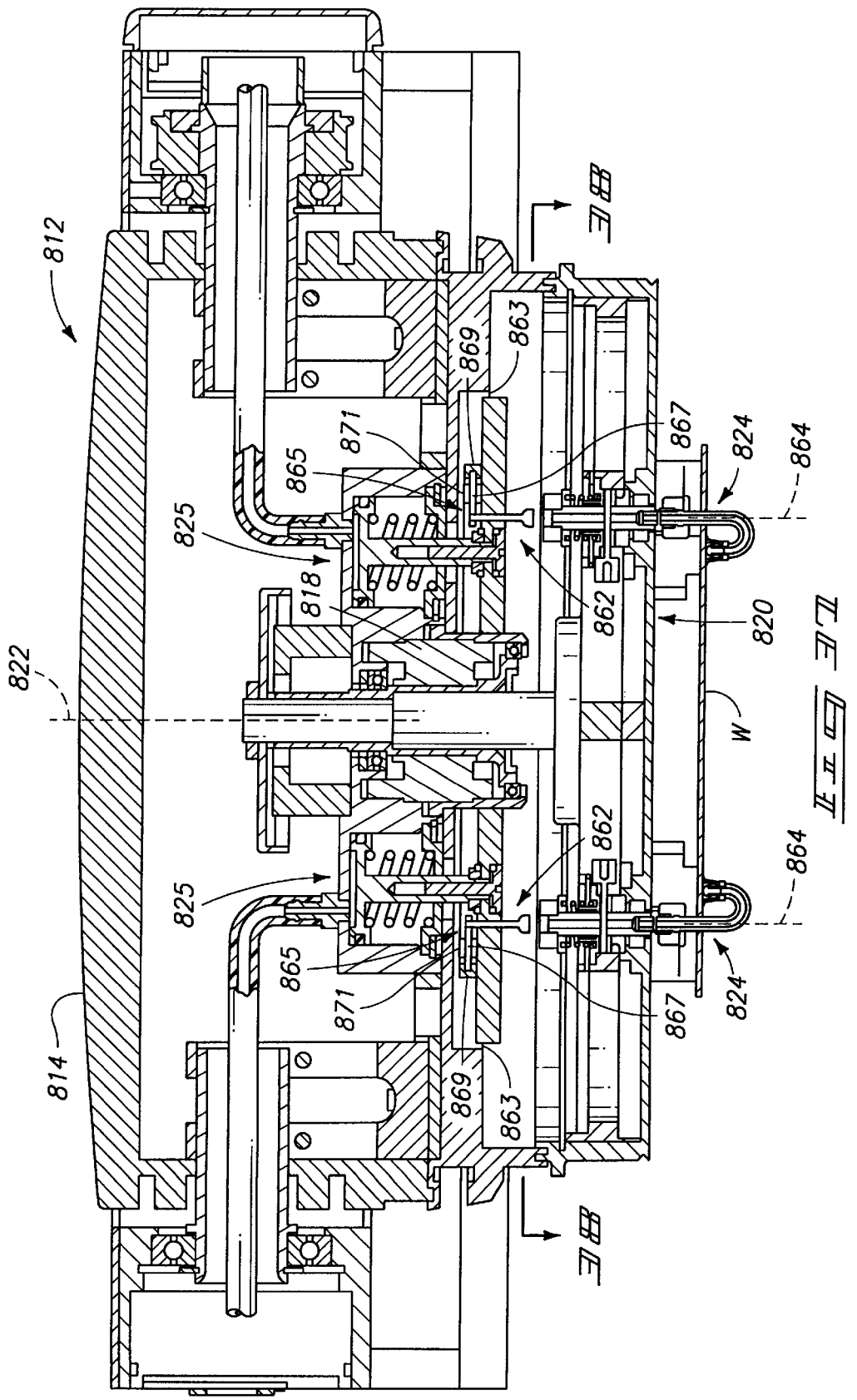

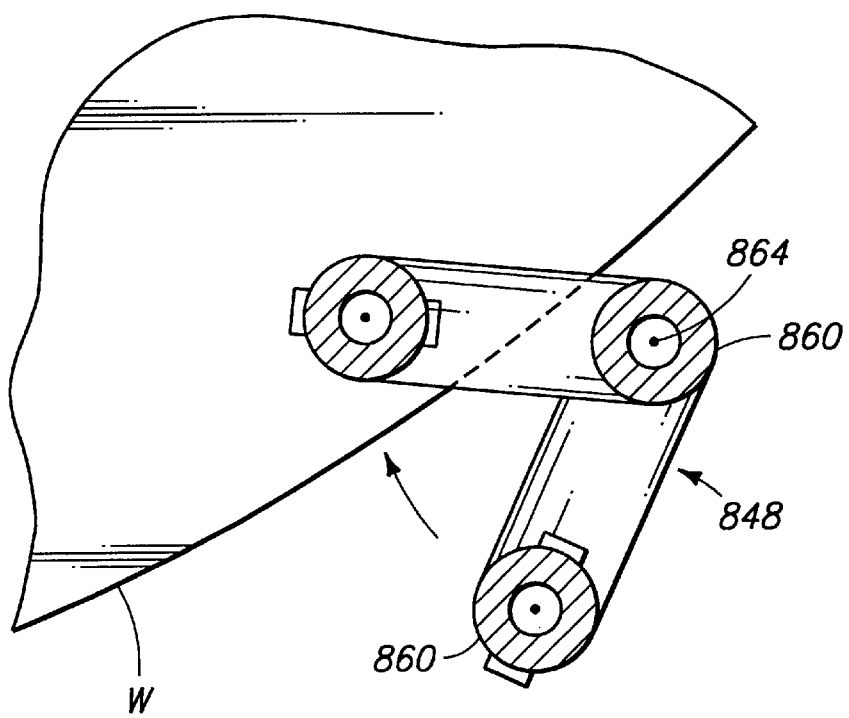
$\rule{2cm}{0.4pt}$ Fig 42
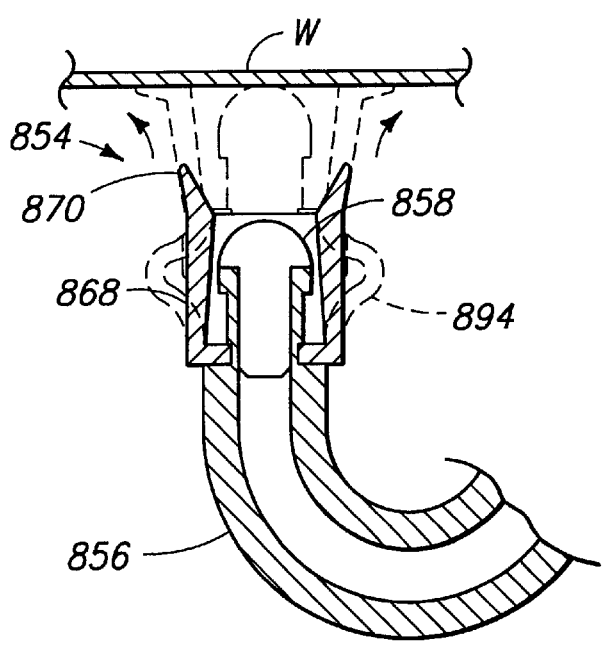
$\rule{2cm}{0.4pt}$ Fig 43

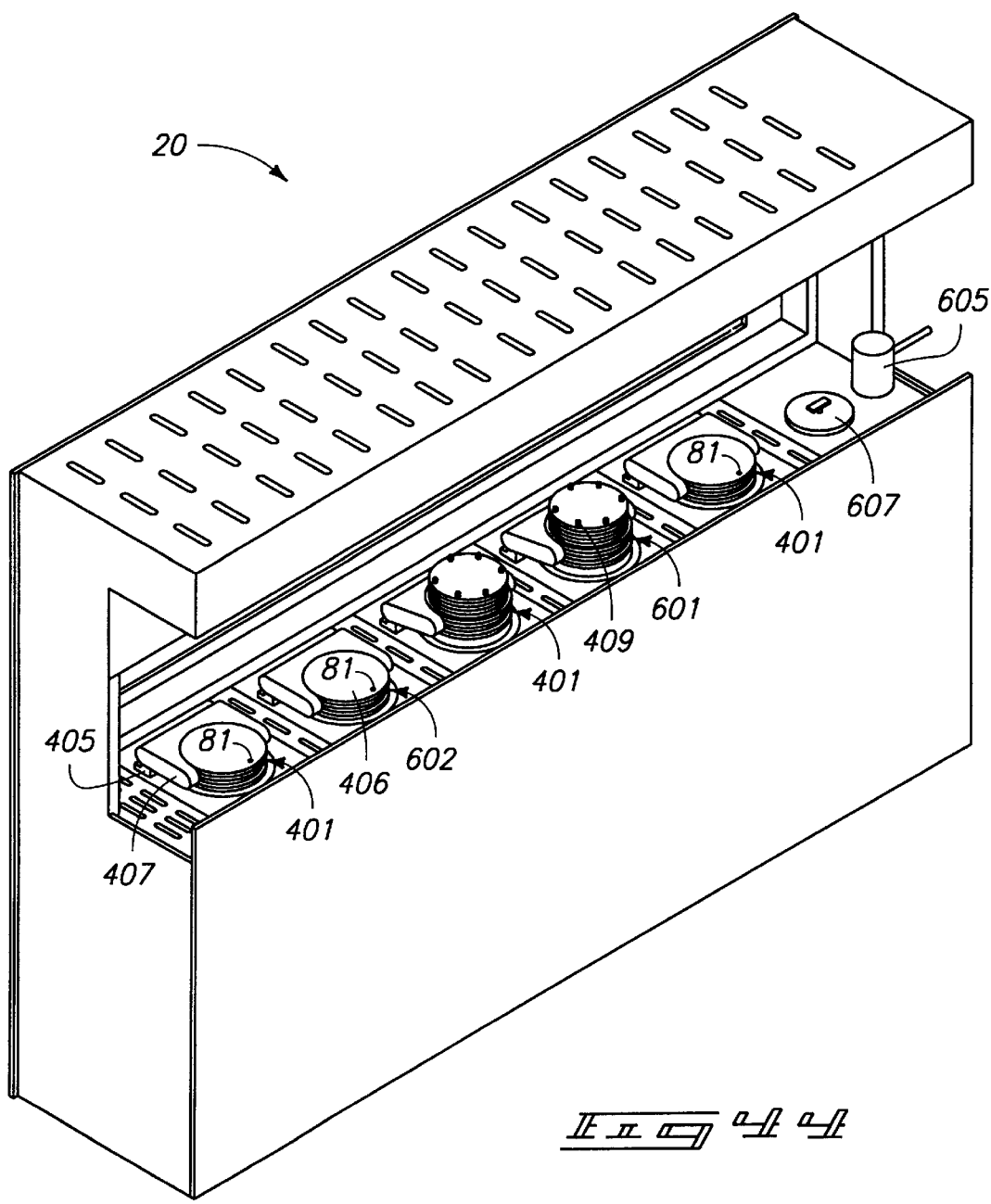

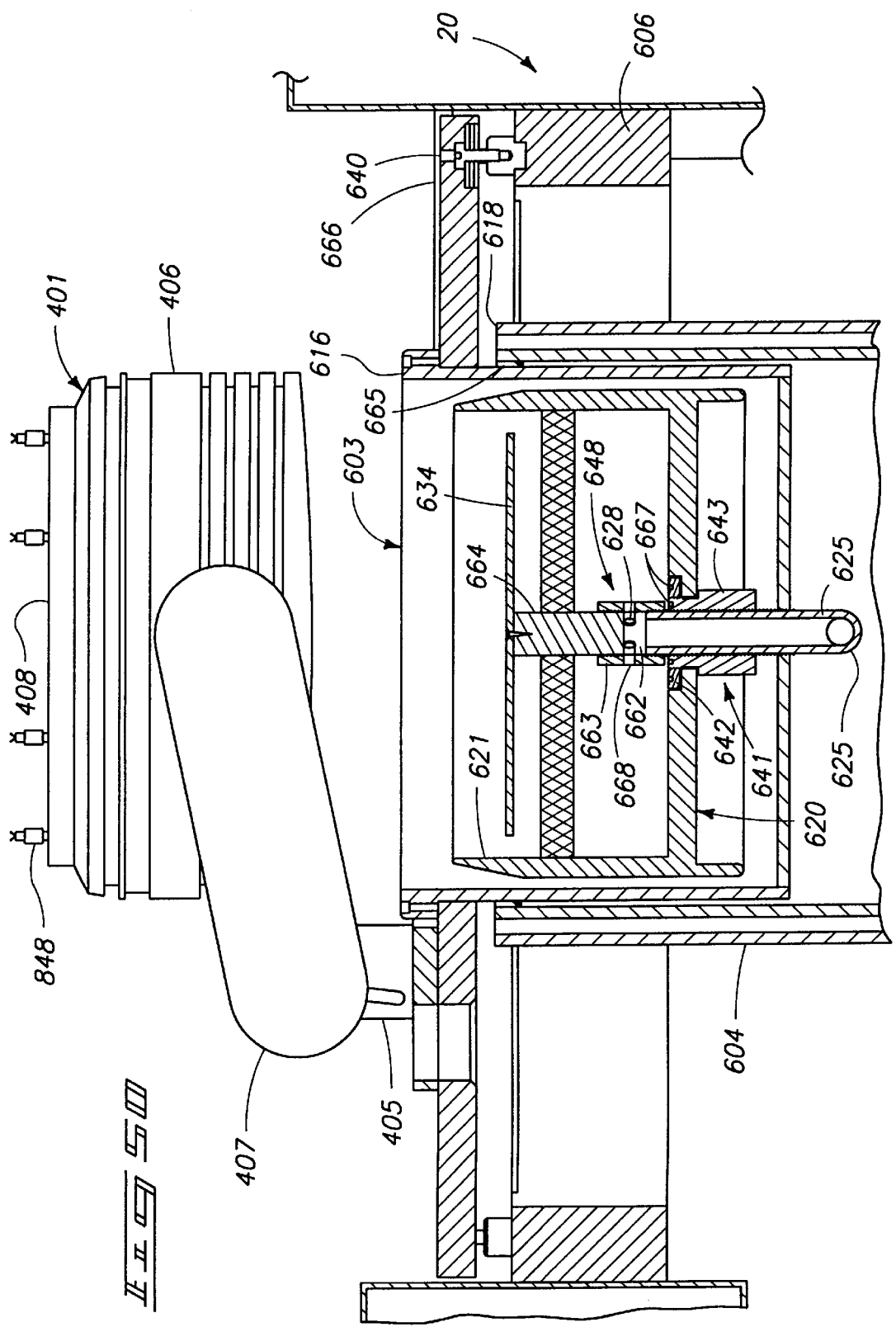

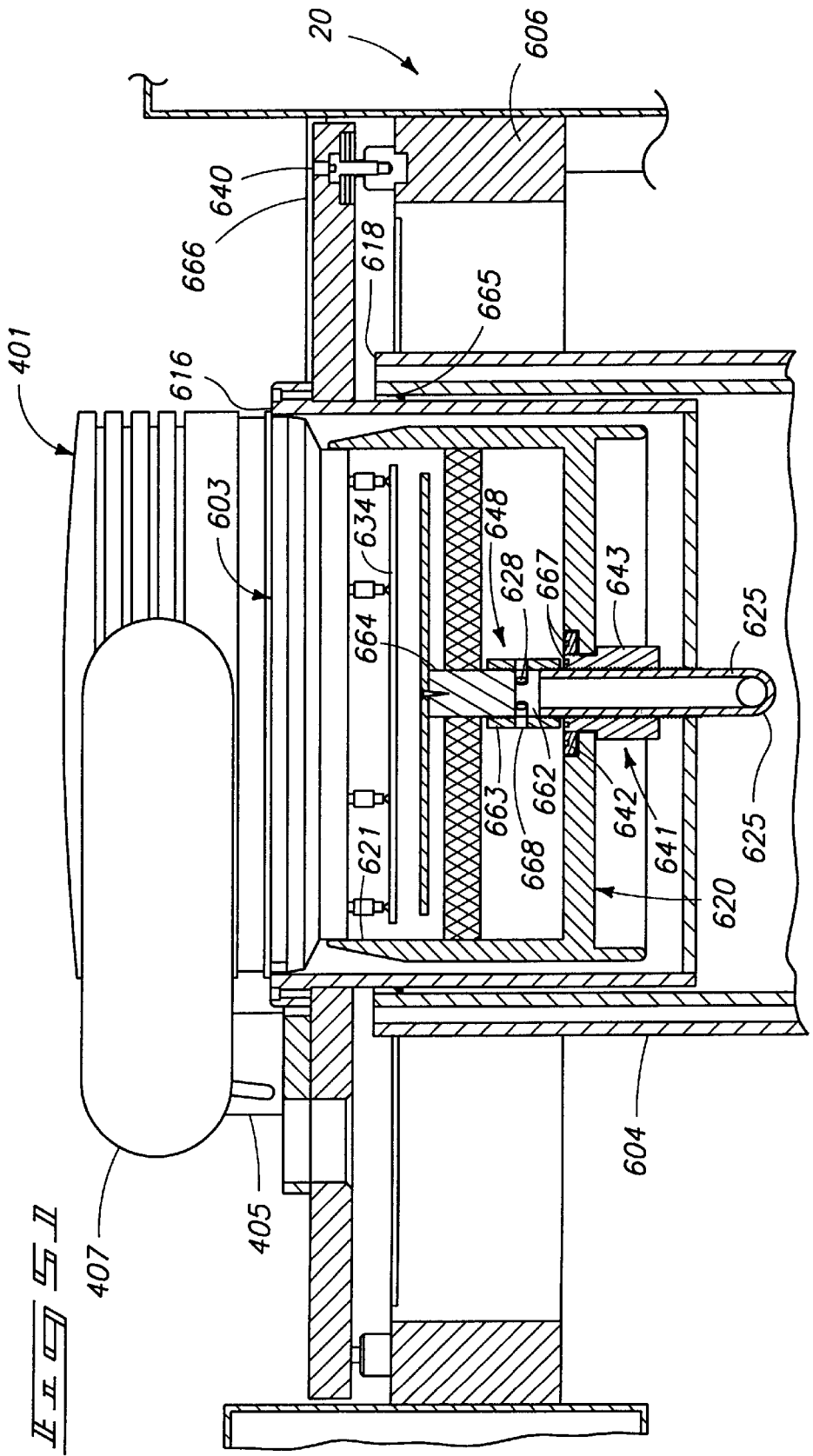

MODULAR SEMICONDUCTOR WORKPIECE PROCESSING TOOL

TECHNICAL FIELD

The present invention relates to tools for performing liquid and gaseous processing of semiconductor workpieces, and more particularly to tools which process semiconductor workpieces requiring low contaminant levels.

BACKGROUND OF THE INVENTION

Semiconductor workpieces, such as wafers and the like, are the subject of extensive processing to produce integrated circuits, data disks and similar articles. During such processing it is often necessary to treat a particular workpiece or workpiece surface with either gaseous or liquid chemicals. Such treatment allows for films or layers of material to be deposited or grown on a workpiece surface. One method of accomplishing this is to expose the particular workpiece to desired processing environments in which desired chemicals are present to form or grow such films or layers. Some processing regimes involve moving the workpiece within the processing environment to effectuate film or layer coverage.

It has been increasingly desirable to minimize the size of features in integrated circuits during such processing to provide circuits having reduced size and increased integration and capacity. However, the reduction in feature size of such circuits is limited by contaminants such as particles, crystals, metals and organics which can cause defects and render the circuit inoperational. These limitations in feature size caused by contaminants have prevented utilization of full resolution capability of known processing techniques.

It is therefore highly desirable to conduct such semiconductor workpiece processing within a regulated environment which preferably involves some type of automated or computer controlled processing. The regulated environment has minimal human contact to provide a low contaminant environment. Providing a regulated environment reduces the chances of an inadvertent contamination which could render the workpiece useless.

Therefore, an increased need exists for providing a processing environment which adequately performs semiconductor workpiece processing steps in the presence of minimal contaminants.

BRIEF DESCRIPTION OF THE DRAWINGS

Preferred embodiments of the invention are described below with reference to the accompanying drawings, which are briefly described below.

FIGS. 3–8 are a diagrammatic representation of a workpiece cassette turnstile and elevator of a preferred interface module of the semiconductor workpiece processing tool according to the present invention operating to exchange workpiece cassettes between a hold position and an extraction position.

FIG. 9 is an isometric view of a preferred workpiece cassette tray engageable with the turnstile of an interface module of the semiconductor workpiece processing tool.

FIG. 25 is a side elevation view of the processing head of FIG. 5 showing the head in a rotated position ready to lower the wafer into the process station.

FIG. 26 is a side elevation view of the processing head of FIG. 5 showing the head operator pivoted to deploy the processing head and wafer into the bowl of the process station.

FIG. 30 is an isometric view of the operator base and operator arm of the apparatus of the present invention with the protective cover removed.

FIG. 31 is a right side elevation view of the operator arm of the present invention showing the processing head pivot drive mechanism.

FIG. 32 is a left side elevation view of the operator arm of the present invention showing the operator arm drive mechanism.

FIG. 33 is schematic plan view of the operator arm indicating the portions detailed in FIGS. 34 and 35.

FIG. 34 is a partial sectional plan view of the right side of the operator arm showing the processing head drive mechanism.

FIG. 35 is a partial sectional plan view of the left side of the operator arm showing the operator arm drive mechanism.

FIG. 36 is a side elevational view of a semiconductor workpiece holder constructed according to a preferred aspect of the invention.

FIG. 37 is a front sectional view of the FIG. 1 semiconductor workpiece holder.

FIG. 41 is a fragmentary cross-sectional enlarged view of a finger assembly and associated rotor structure.

FIG. 42 is a view taken along line 7—7 in FIG. 4 and shows a portion of the preferred finger assembly moving between an engaged and disengaged position.

FIG. 43 is a view of a finger tip of the preferred finger assembly and shows an electrode tip in a retracted or disengaged position (solid lines) and an engaged position (phantom lines) against a semiconductor workpiece.

FIG. 44 is an isometric view of the apparatus of the present invention showing a five station plating module.

FIG. 46 is an isometric view showing the plating tank and the process bowls of the system of FIG. 44.

FIG. 50 is a side sectional view of the apparatus of the present invention showing a workpiece support positioned over an electroplating process bowl.

FIG. 51 is a side sectional view of the apparatus of the present invention showing a workpiece support supporting a workpiece for processing within an electroplating process bowl.

DETAILED DESCRIPTION OF THE PREFERRED EMBODIMENTS

Figure 1:
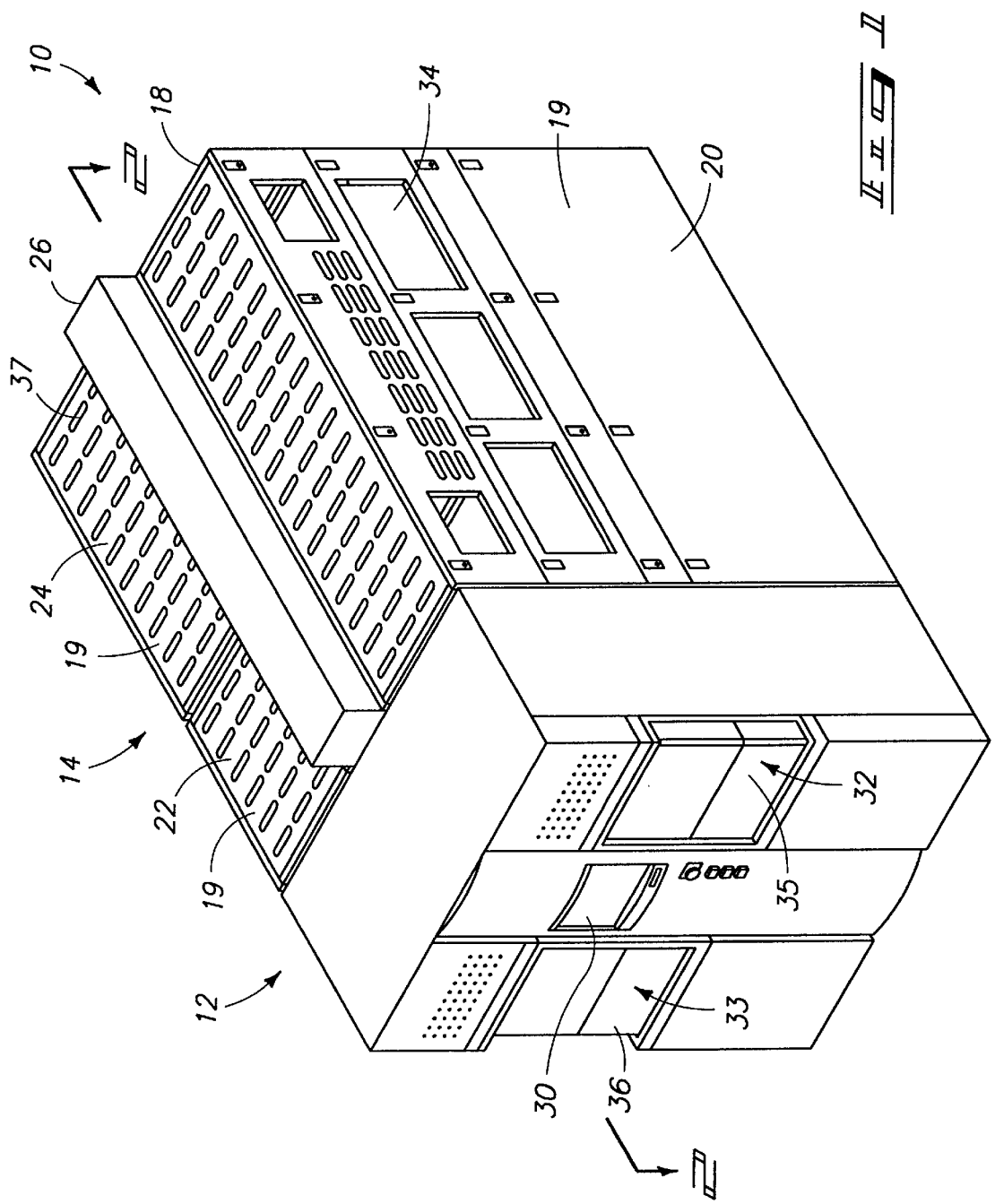
FIG. 1 is an isometric view of the semiconductor workpiece processing tool in accordance with the present invention.

This disclosure of the invention is submitted in furtherance of the constitutional purposes of the U.S. Patent Laws "to promote the progress of science and useful arts" (Article 1, Section 8).

TABLE 1

Listing of Subsections of Detailed Description and Pertinent Items with Reference Numerals and Page Numbers

| | | | | |
|---|---|---|---|---|
| Processing Tool Generally | | 12 | workpiece transport units 62, 64 | 16 |
| semiconductor workpiece processing | | 12 | user interface 30 | 17 |
| tool 10 | | | window 34 | 17 |
| interface section 12 | | 13 | vents 37 | 17 |
| processing section 14 | | 13 | two interface modules 38, 39 | 18 |
| workpiece cassettes 16 | | 13 | workpiece cassette turnstile 40, 41 | 18 |
| first port 32 | | 13 | workpiece cassette elevator 42, 43 | 18 |
| second port 33 | | 13 | workpiece cassette support 47, 48 | 18 |
| powered doors 35, 36 | | 13 | semiconductor workpiece conveyor 60 | 19 |
| plating module 20 | | 14 | workpiece holder 810 | 19 |
| pre-wet module 22 | | 14 | workpiece support 401 | 20 |
| resist strip module 24 | | 14 | finger assemblies 409 | 20 |
| rear closure surface 18 | | 15 | Interface Module | 22 |
| air Supply 26 | | 15 | saddles 45, 46 | 23 |
| exhaust ducts 58, 59 | | 15 | turnstile shaft 49 | 24 |
| frame 65 | | 15 | powered shaft 44 | 25 |
| workpiece transport unit guide 66 | | 15 | transfer arm rotation encoder 197 | 40 |
| Workpiece Cassette Tray | | 26 | transfer arm elevation motor 195 | 41 |
| workpiece cassette tray 50 | | 26 | transfer arm elevation encoder 198 | 41 |
| base 51 | | 26 | Absolute encoders 199 | 41 |
| upright portion 54 | | 26 | Processing Module Control | 41 |
| lateral supports 52 | | 26 | slave controller 145, 146 | 42 |
| groove 53 | | 26 | process components 184 | 42 |
| Semiconductor Workpiece Conveyor | | 27 | servo controller 177 | 42 |
| paths of movement 68, 70 | | 28 | interface controller 180 | 42 |
| guide rails 63, 64 | | 28 | slave processor 172 | 43 |

TABLE 1-continued

Listing of Subsections of Detailed Description and
Pertinent Items with Reference Numerals and Page Numbers

Figure 16:
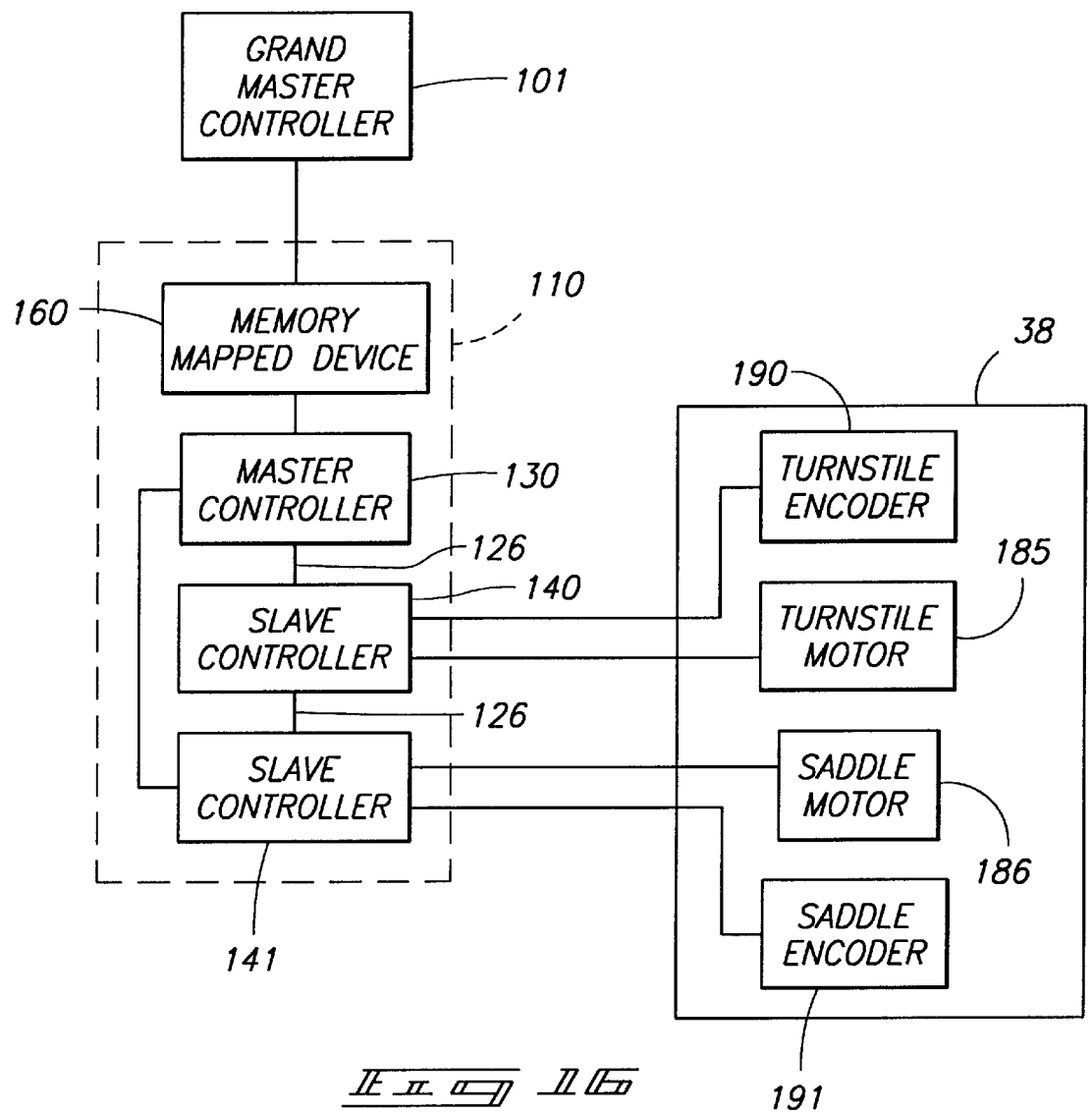
FIG. 16 is a functional block diagram of an interface module control subsystem coupled with components of a workpiece cassette interface module of the processing tool.
Figure 17:
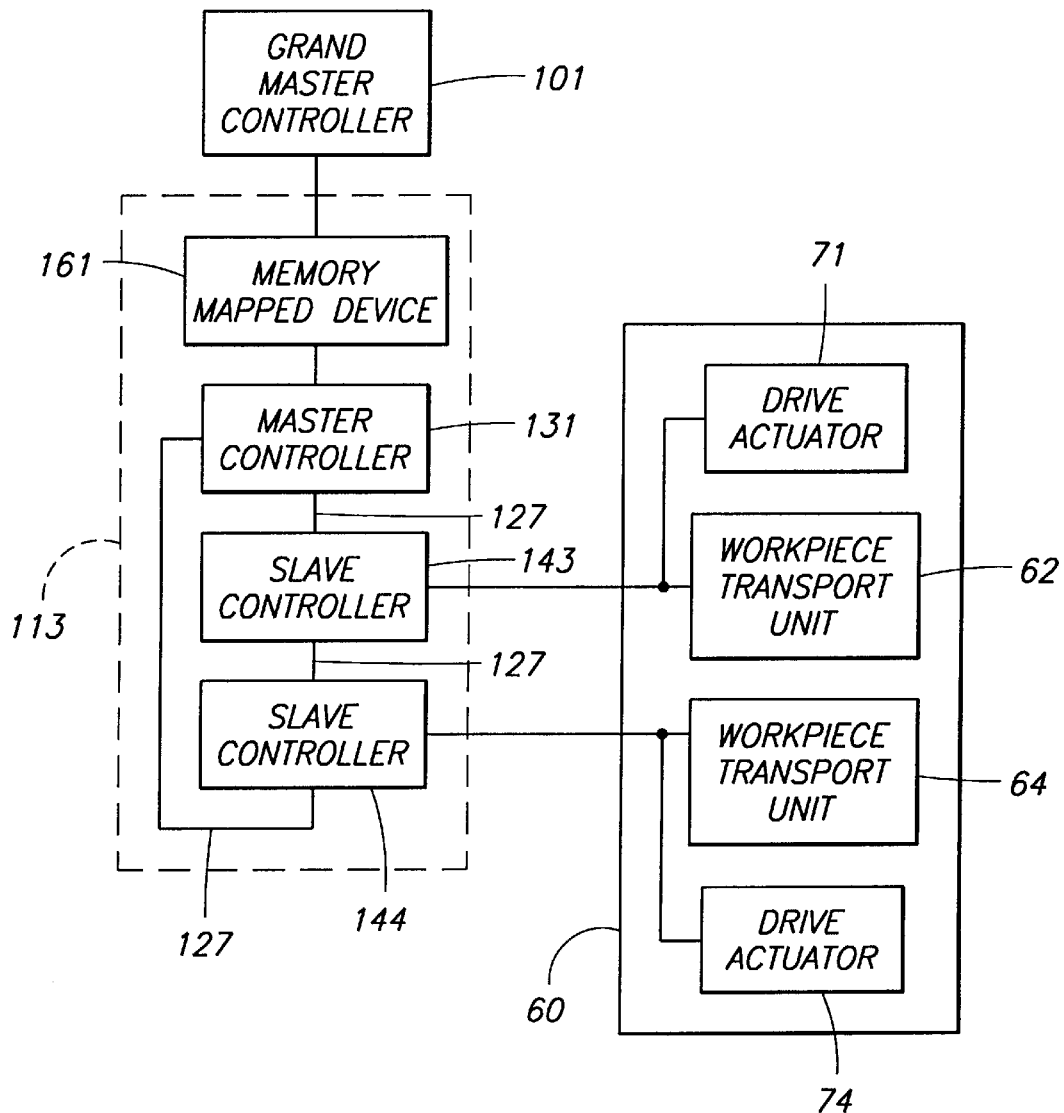
FIG. 17 is a functional block diagram of a workpiece conveyor control subsystem coupled with components of a workpiece conveyor of the processing tool.
Figure 18:
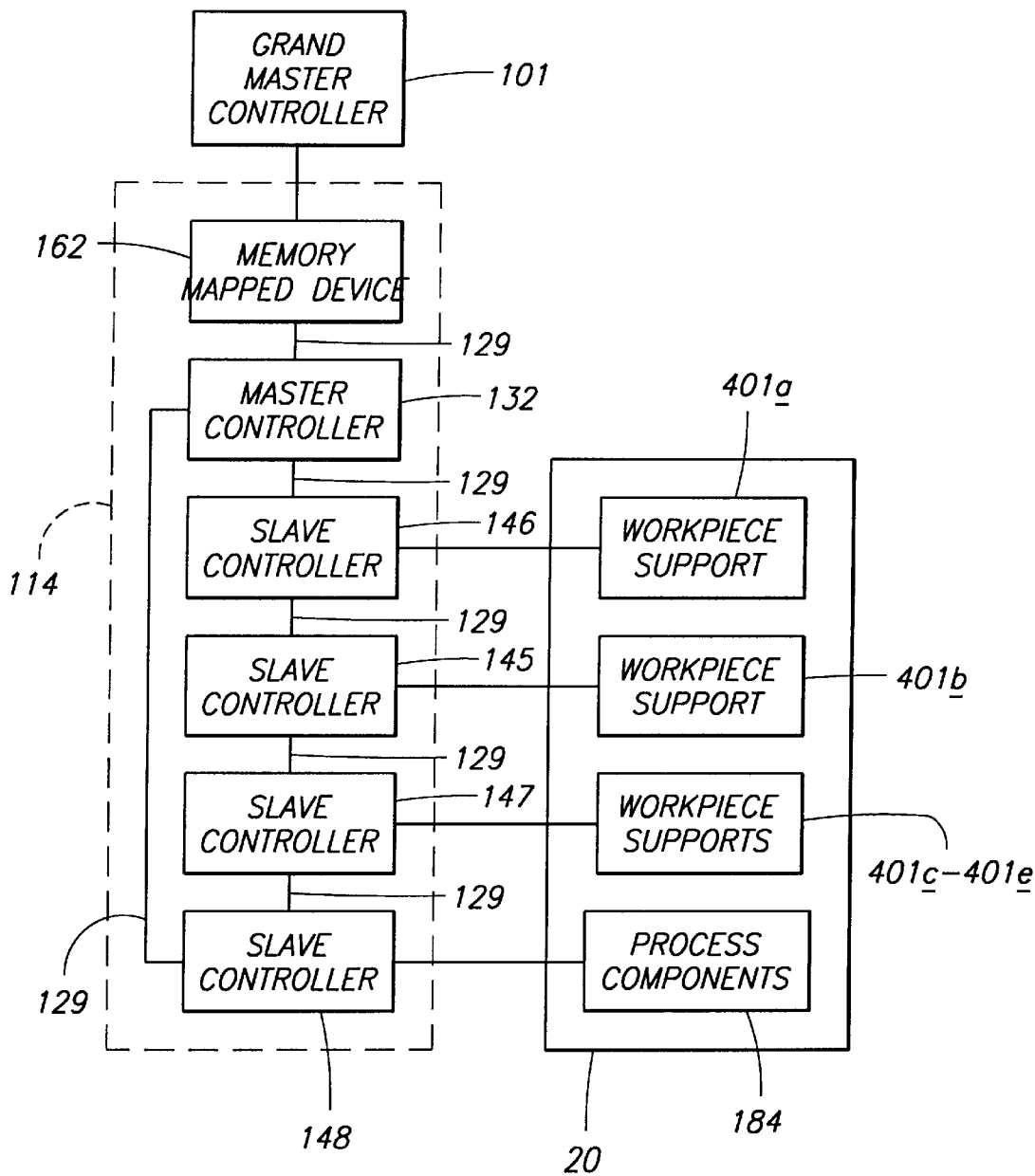
FIG. 18 is a functional block diagram of a workpiece processing module control subsystem coupled with components of a workpiece processing module of the processing tool.

| | | | | |
|---|---|---|---|---|
| Extensions 69, 75 | 28 | servo controller 177 | 43 | |
| drive operators 71, 74 | 28 | operator arm 407 | 43 | |
| electromagnet 79 | 29 | lift drive shaft 456 | 43 | |
| Cable guards 72, 73 | 29 | lift motion encoder 455 | 43 | |
| linear bearing 76 | 29 | lift arm 407 | 43 | |
| horizontal roller 77 | 29 | rotate motor 428 | 43 | |
| Semiconductor Workpiece Transport Units | 30 | processing head 406 | 43 | |
| tram 84 | 30 | shafts 429, 430 | 43 | |
| workpiece transfer arm assembly | 30 | Incremental rotate encoder 435 | 43 | |
| workpiece transfer arm elevator 90 | 30 | Spin motor 480 | 43 | |
| cover 85 | 30 | workpiece holder 478 | 43 | |
| first arm extension 87 | 30 | spin encoder 498 | 43 | |
| shaft 83 | 30 | fingertips 414 | 43 | |
| second arm extension 88 | 31 | pneumatic valve actuator 201 | 43 | |
| axis 82 | 31 | pneumatic piston 502 | 43 | |
| wafer support 89 | 31 | relay 202 | 44 | |
| light or other beam emitter 81 | 32 | pump 605 | 44 | |
| CCD array 91 | 32 | Interface Module Control | 45 | |
| Control System Generally | 32 | Slave processor 170 | 45 | |
| control system 100 | 32 | servo controller 175 | 46 | |
| grand master controller 101 | 33 | elevator lift motor 187 | 46 | |
| interface module control 110 | 33 | elevator rotation motor 188 | 46 | |
| conveyor control 113 | 33 | ift encoder 192 | 47 | |
| processing module controls 114, 115 | 33 | rotation encoder 193 | 47 | |
| additional grand master controllers 102 | 33 | Absolute encoders 199 | 47 | |
| additional processing module control 119 | 34 | Methods | 47 | |
| memory mapped devices 160, 161, 162 | 34 | Workpiece Support | 49 | |
| master controllers 130, 131, 132 | 34 | semiconductor processing machine 400 | 49 | |
| Master/Slave Configuration | 35 | workpiece supports 401 | 49 | |
| data link 126, 127, 129 as shown in FIG. 16–FIG. 18 | 36 | Workpiece support 402 | 49 | |
| | | Workpiece support 403 | 50 | |
| slave controllers 140, 141, 142 | 36 | semiconductor manufacturing chamber 404 | 50 | |
| turnstile motor 185 | 38 | | | |
| incremental turnstile encoder 190 | 38 | beam emitter 81 | 50 | |
| saddle motor 186 | 38 | operator base 405 | 50 | |
| saddle encoder 191 | 38 | processing head 406 | 50 | |
| Conveyor Control Subsystem | 39 | operator arm 407 | 50 | |
| slave processor 171 | 40 | wafer holder 408 | 50 | |
| servo controller 176 | 40 | fingers 409 | 50 | |
| linear encoder 196 | 40 | Workpiece holder 408 | 50 | |
| transfer arm motor 194 | 40 | workpiece spin axis 410 | 50 | |
| operator pivot axis 412 | 50 | process pivot axis 411 | 50 | |
| workpiece W | 51 | lift optical switch low 463 | 61 | |
| fingertips 414 | 51 | lift optical switch high 464 | 61 | |
| | 51 | lift flag 465 | 62 | |
| processing bowl 517 | 51 | lift motor encoder 455 | 62 | |
| left and right forks 418 and 419 | 52 | lift motor 452 | 62 | |
| Operator Base | 52 | slotted lift flag mounting slots 467 | 62 | |
| operator base back portion 420 | 52 | lift flag fasteners 466 | 62 | |
| operator base left yoke arm 421 | 53 | Processing Head | 62 | |
| operator base right yoke arm 422 | 53 | processing head housing 470 | 63 | |
| yoke arm fasteners 423 | 53 | circumferential grooves 471 | 63 | |
| operator arm bearings 424 | 53 | rotate shaft openings 474 and 475 | 63 | |
| operator arm 425 | 53 | left and right processing head mounts 472 | 63 | |
| Operator Arm | 53 | | | |
| process arm rear cavity 426 | 54 | processing head door 476 | 63 | |
| lift motor 452 | 54 | processing head void 477 | 63 | |
| rotate motor 428 | 54 | Processing Head Spin Motor | 64 | |
| processing head left pivot shaft | 54 | workpiece holder 478 | 64 | |
| processing head right pivot shaft 430 | 54 | spin axis 479 | 64 | |
| Operator Arm-Processing Head Rotate Mechanism | 54 | spin motor 480 | 64 | |
| | | top motor housing 481 | 65 | |
| Processing head rotate mechanism 431 | 54 | spin motor shaft 483 | 65 | |
| rotate shaft 432 | 54 | workpiece holder rotor 484 | 65 | |
| securing collar 433 | 55 | | 65 | |
| rotate motor support 434 | 55 | rotor hub 485 | 65 | |
| rotate encoder 435 | 55 | rotor hub recess 486 | 65 | |
| rotate pulley inboard bearing 436 | 56 | workpiece shaft snap-ring 488 | 65 | |
| rotate belt 437 | 56 | rotor recess groove 489 | 65 | |
| processing head pulley 438 | 56 | spin encoder 498 | 66 | |
| rotate belt tensioner 439 | 56 | optical tachometer 499 | 66 | |
| tensioner hub 468 | 57 | Processing Head Finger Actuators | 68 | |
| processing head shaft bearing 440 | 57 | Pneumatic piston 502 | 69 | |
| processing head rotate bearing 469 | 57 | actuator spring 505 | 69 | |
| processing head shaft bearing 441 | 57 | cavity end cap 507 | 69 | |
| cable brackets 442 and 443 | 57 | retaining ring 508 | 69 | |

TABLE 1-continued

Listing of Subsections of Detailed Description and
Pertinent Items with Reference Numerals and Page Numbers

| Item | Page | Item | Page |
|---|---|---|---|
| rotate overtravel protect 444 | 58 | pneumatic inlet 503 | 69 |
| rotate flag 447 | 58 | pneumatic supply line 504 | 69 |
| Rotate optical switches 445 and 446 | 59 | actuator plate 509 | 69 |
| Operator Arm-Lift Mechanism | 59 | actuator plate connect screw 510 | 69 |
| operator arm lift mechanism 448 | 59 | Wave springs 529 | 69 |
| lift motor shaft 454 | 59 | bushing 512 | 69 |
| lift gear drive 453 | 60 | pneumatic piston recess 511 | 69 |
| lift drive shaft 456 | 60 | finger actuator contacts 513 | 70 |
| lift bushing 449 | 60 | Processing Head Workpiece Holder | 70 |
| anchor plate 458 | 60 | finger actuator lever 514 | 70 |
| anchor fasteners 457 | 60 | finger stem 515 | 70 |
|  | 60 | finger diaphragm 519 | 70 |
| Lift bearing 450 | 60 | workpiece holder rotor 484 | 71 |
| lift bearing support 460 | 60 | finger opening 521 | 71 |
| operator arm frame 461 | 60 | rotor diaphragm lip 523 | 71 |
| lift anchor 451 | 61 | finger spring 520 | 71 |
| lift overtravel protect 462 | 61 | finger actuator tab 522 | 71 |
| 518 | 71 | finger collar or nut 517 | 71 |
| finger actuator mechanism 500 | 71 | bend 866 | 83 |
| cavity 501 | 72 | Finger Assembly Seal | 84 |
| Semiconductor Workpiece Holder - Electroplating Embodiment | 72 | 868 | 84 |
|  |  | rim portion 870 | 84 |
| semiconductor workpiece holder 810 | 72 | Methods and Operation | 85 |
| bottom half or bowl 811 | 73 | Methods Re Presenting Workpiece | 88 |
| Processing Head and Processing Head Operator | 73 | Electroplating Processing Station | 91 |
|  |  | electroplating module 20 | 91 |
| workpiece support 812 | 73 | workpiece support 401 | 92 |
| spin head assembly 814 | 73 | processing head 406 | 92 |
| lift/rotate assembly 816 | 73 | operator arm 407 | 92 |
| motor 818 | 74 | operator base 405 | 92 |
| rotor 820 | 74 | fingers 409 | 92 |
| rotor spin axis 822 | 74 | beam emitter 81 | 93 |
| finger assembly 824 | 74 | plating chamber assemblies 603 | 93 |
| actuator 825 | 75 | process fluid reservoir 604 | 93 |
| rotor center piece 826 | 75 | immersible pump 605 | 93 |
| spokes 828 | 75 | module frame or chassis 606 | 93 |
| rotor perimeter piece 830 | 75 | pump discharge filter 607 | 93 |
| Finger Assembly | 76 | outer reservoir wall 608 | 93 |
| finger assembly frame 832 | 77 | inner reservoir wall 609 | 93 |
| angled slot 832a | 77 | reservoir safety volume 611 | 94 |
| finger assembly frame outer flange 834 | 77 | inner vessel 612 | 94 |
| inner drive plate portion 836 | 77 | reservoir overflow opening 610 | 94 |
| Finger Assembly Drive System | 77 | heat exchanger 613 | 94 |
| bearing 838 | 77 | exchanger inlet 614 | 94 |
| collet 840 | 77 | exchanger outlet 615 | 94 |
| bearing receptacle 839 | 77 | Bowl Assembly | 94 |
| spring 842 | 78 | reservoir top 618 | 95 |
| spring seat 844 | 78 | process bowl or plating chamber 616 | 95 |
| Finger Assembly Electrical System | 78 | bowl side 617 | 95 |
| pin connector 846 | 79 | bowl bottom 619 | 95 |
| finger 848 | 79 | cup assembly 620 | 95 |
| nut 850 | 79 | fluid cup 621 | 95 |
| anti-rotation pin 852 | 79 | cup side 622 | 95 |
| finger tip 854 | 79 | cup bottom 623 | 95 |
| electrode contact 858 | 80 | fluid inlet line 625 | 95 |
| Finger Assembly Drive System Interface | 80 | bowl bottom opening 627 | 95 |
| finger actuator 862 | 80 | cup fluid inlet opening 624 | 95 |
| 863 | 80 | inlet line end point 631 | 95 |
| first movement path axis 864 | 81 | Fluid outlet openings 628 | 95 |
| secondary linkage 865 | 81 | inlet plenum 629 | 95 |
| link arm 867 | 81 | cup filter 630 | 95 |
| actuator torque ring 869 | 81 | metallic anode 634 | 96 |
| pneumatic operator 871 | 81 | annular gap or space 635 | 96 |
| Engaged and Disengaged Positions | 82 | outer cup wall 636 | 96 |
| arrow A | 82 | first annular space or process fluid | 96 |
| workpiece standoff 865 | 83 | overflow space 632 |  |
| bowl bottom center plate 639 | 97 | cup upper edge 633 | 96 |
| fluid return openings 638 | 97 | bowl upper edge 637 | 96 |
| process module deck plate 666 | 99 | crossbars 626 | 97 |
| levelers 640 | 99 |  |  |
| compliant bowl seal 665 | 100 |  |  |
| cup height adjuster 641 | 100 |  |  |
| cup height adjustment jack 643 | 100 |  |  |
| cup lock nut 642 | 100 |  |  |
| height adjustment jack 641 | 100 |  |  |
| adjustment tool access holes 667 | 100 |  |  |

TABLE 1-continued

Listing of Subsections of Detailed Description and
Pertinent Items with Reference Numerals and Page Numbers

| | |
|---|---|
| anode height adjuster 646 | 101 |
| threaded anode post 664 | 101 |
| threaded anode adjustment sleeve 663 | 101 |
| sleeve openings 668 | 101 |
| fluid outlet chamber 662 | 101 |
| Fluid Transfer Equipment | 102 |
| pump suction 647 | 102 |
| pump body 653 | 102 |
| pump discharge 648 | 102 |
| electric pump motor 650 | 102 |
| removable filter top 649 | 103 |
| supply manifold 652 | 103 |
| fluid return line 654 | 103 |
| optional end point 655 | 103 |
| back pressure regulator 656 | 103 |
| Control Devices | 104 |
| flow sensors 657 | 104 |
| flow signal line 659 | 104 |
| flow restrictors 658 | 104 |
| flow control signal line 660 | 104 |
| Plating Methods | 105 |

* (End of Table 1) *

Processing Tool Generally

Referring to FIG. 1, a present preferred embodiment of the semiconductor workpiece processing tool 10 is shown. The processing tool 10 may comprise an interface section 12 and processing section 14. Semiconductor workpiece cassettes 16 containing a plurality of semiconductor workpieces, generally designated W, may be loaded into the processing tool 10 or unloaded therefrom via the interface section 12. In particular, the workpiece cassettes 16 are preferably loaded or unloaded through at least one port such as first port 32 within a front outwardly facing wall of the processing tool 10. An additional second port 33 may be provided within the interface section 12 of the processing tool 10 to improve access and port 32 may be utilized as an input and port 33 may be utilized as an output.

Respective powered doors 35, 36 may be utilized to cover access ports 32, 33 thereby isolating the interior of the processing tool 10 from the clean room. Each door 35, 36 may comprise two portions. The upper portions and lower portion move upward and downward, respectively, into the front surface of the processing tool 10 to open ports 32, 33 and permit access therein.

Workpiece cassettes 16 are typically utilized to transport a plurality of semiconductor workpieces. The workpiece cassettes 16 are preferably oriented to provide the semiconductor workpieces therein in an upright or vertical position for stability during transportation of the semiconductor workpieces into or out of the processing tool 10.

The front outwardly facing surface of the processing tool 10 may advantageously join a clean room to minimize the number of harmful contaminants which may be introduced into the processing tool 10 during insertion and removal of workpiece cassettes 16. In addition, a plurality of workpiece cassettes 16 may be introduced into processing tool 10 or removed therefrom at one time to minimize the opening of ports 32, 33 and exposure of the processing tool 10 to the clean room environment.

The interface section 12 joins a processing section 14 of the processing tool 10. The processing section 14 may include a plurality of semiconductor workpiece processing modules for performing various semiconductor process steps. In particular, the embodiment of the processing tool 10 shown in FIG. 1 includes a plating module 20 defining a first lateral surface of the processing section 14. The processing section 14 of the tool 10 may advantageously include additional modules, such as pre-wet module 22 and resist strip module 24, opposite the plating module 20.

Alternatively, other modules for performing additional processing functions may also be provided within the processing tool 10 in accordance with the present invention. Pre-wet module 22 and resist strip module 24 define a second lateral surface of the processing tool 10. The specific processing performed by processing modules of the processing tool 10 may be different or of similar nature. Various liquid and gaseous processing steps can be used in various sequences. The processing tool 10 is particularly advantageous in allowing a series of complex processes to be run serially in different processing modules set up for different processing solutions. All the processing can be advantageously accomplished without human handling and in a highly controlled working space 11, thus reducing human operator handling time and the chance of contaminating the semiconductor workpieces.

The processing modules of the process tool 10 in accordance with the present invention are preferably modular, interchangeable, stand-alone units. The processing functions performed by the processing tool 10 may be changed after installation of the processing tool 10 increasing flexibility and allowing for changes in processing methods. Additional workpiece processing modules may be added to the processing tool 10 or replace existing processing modules 19.

The processing tool 10 of the present invention preferably includes a rear closure surface 18 joined with the lateral sides of the processing tool 10. As shown in FIG. 1, an air supply 26 may be advantageously provided intermediate opposing processing modules of the processing section 14. The interface section 12, lateral sides of the processing section 14, closure surface 18, and air supply 26 preferably provide an enclosed work space 11 within the processing tool 10. The air supply 26 may comprise a duct coupled with a filtered air source (not shown) for providing clean air into the processing tool 10 of the present invention. More specifically, the air supply 26 may include a plurality of vents intermediate the processing modules 19 for introducing clean air into work space 11.

Figure 10:
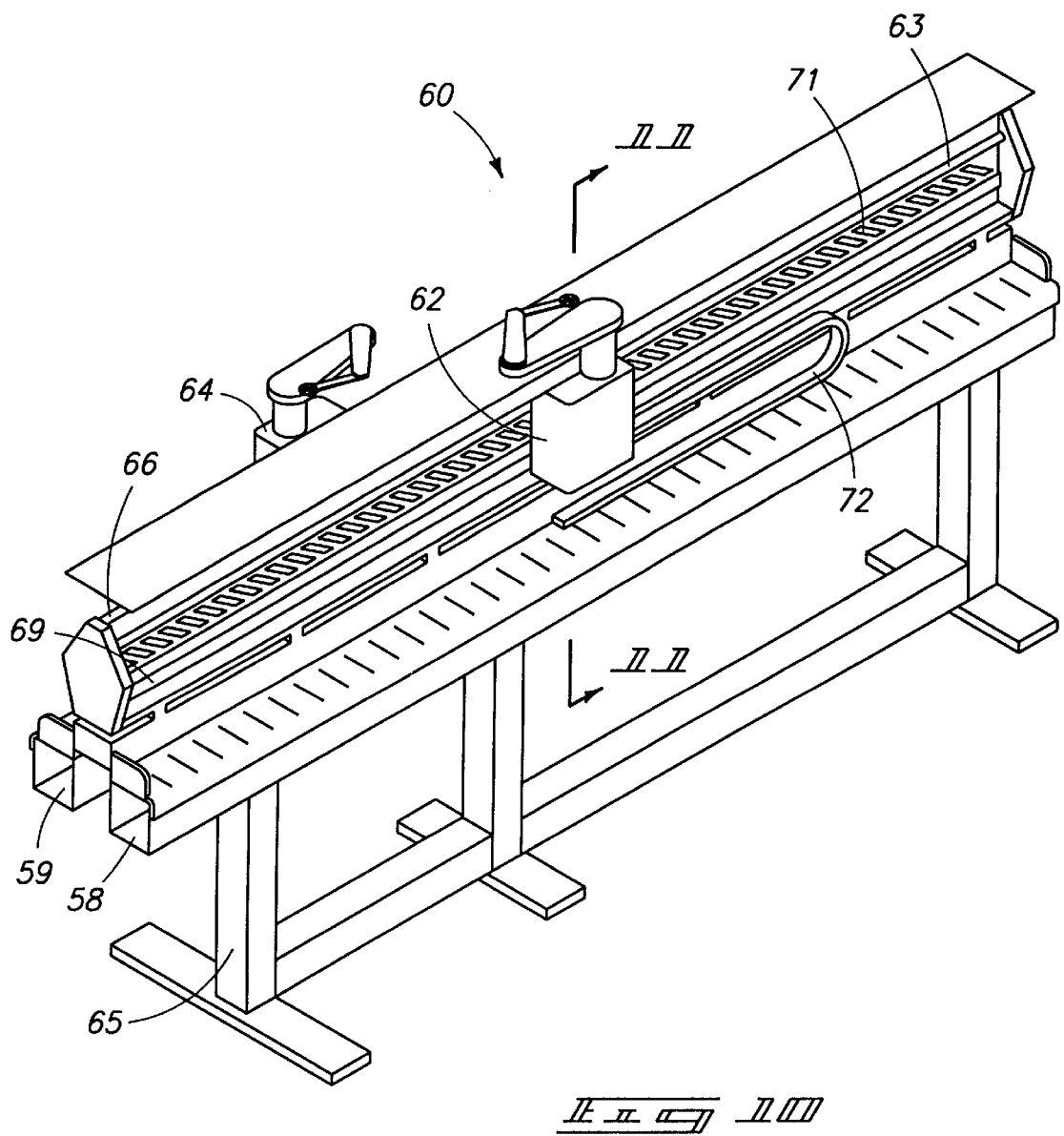
FIG. 10 is an isometric view of an embodiment of a semiconductor workpiece conveyor of the semiconductor workpiece processing tool in accordance with the present invention.

Referring to FIG. 10, exhaust ducts 58, 59 may be provided adjacent the frame 65 of a workpiece transport unit guide 66 to remove the circulated clean air and the contaminants therein. Exhaust ducts 58, 59 may be coupled with the each of the processing modules 19 for drawing supplied clean air therethrough. In particular, clean air is supplied to the workspace 11 of the processing tool 10 via air supply 26. The air may be drawn adjacent the workpiece transport units 62, 64 and into the processing modules 19 via a plurality of vents 57 formed within a shelf or process deck thereof by an exhaust fan (not shown) coupled with the output of exhaust ducts 58, 59. Each processing module 19 within the processing tool 10 may be directly coupled with ducts 58, 59. The air may be drawn out of the ducts 58, 59 of the processing tool 10 through the rear closant surface 18 or through a bottom of surface of the processing tool 10. Providing an enclosed work space and controlling the environment within the work space greatly reduces the presence of contaminants with the processing tool 10.

Each of the processing modules 20, 22, 24 may be advantageously accessed through the rear panel of the respective module forming the lateral side of the processing tool 10. The lateral sides of the processing tool 10 may be adjacent a gray room environment. Gray rooms have fewer precautions against contamination compared with the clean rooms. Utilizing this configuration reduces plant costs while allowing access to the processing components and electronics of each workpiece module 19 of the processing tool 10 which require routine maintenance.

A user interface 30 may be provided at the outwardly facing front surface of the processing tool as shown in FIG. 1. The user interface 30 may advantageously be a touch screen cathode ray tube control display allowing finger contact to the display screen to effect various control functions within the processing tool 10. An additional user interface 30 may also be provided at the rear of the processing tool 10 or within individual processing modules 20, 22, 24 so that processing tool 10 operation can be effected from alternate locations about the processing tool 10. Further, a portable user interface 30 may be provided to permit an operator to move about the processing tool 10 and view the operation of the processing components therein. The user interface 30 may be utilized to teach specified functions and operations to the processing modules 19 and semiconductor workpiece transport units 62, 64.

Each module 20, 22, 24 within the processing tool 10 preferably includes a window 34 allowing visual inspection of processing tool 10 operation from the gray room. Further, vents 37 may be advantageously provided within a top surface of each processing module 20, 22, 24. Processing module electronics are preferably located adjacent the vents 37 allowing circulating air to dissipate heat generated by such electronics.

Figure 2:
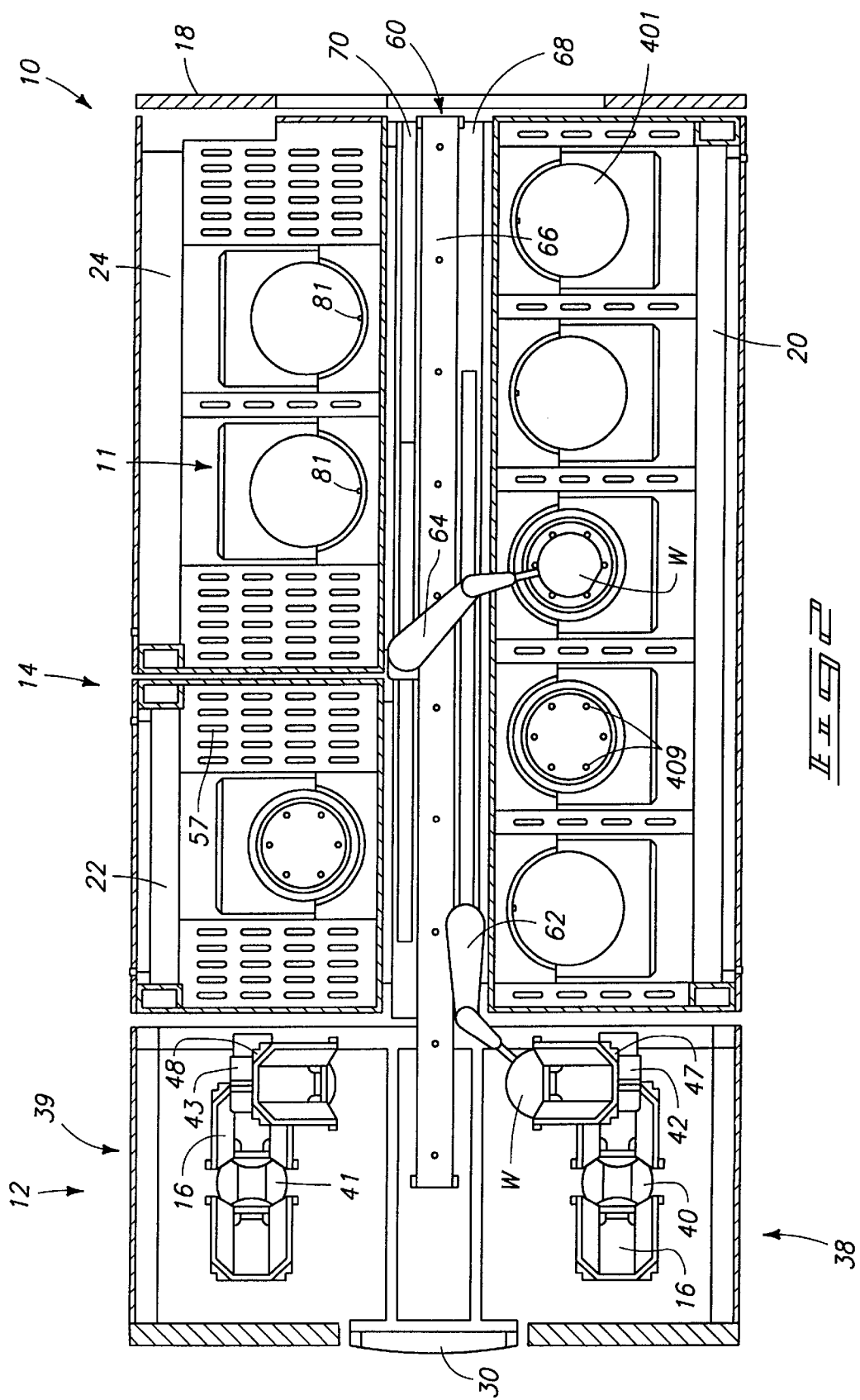
FIG. 2 is a cross-sectional view taken along line 2—2 of the semiconductor workpiece processing tool shown in FIG. 1.

The work space 11 within the interface section 12 and processing section 14 of an embodiment of the processing tool 10 is shown in detail in FIG. 2.

The interface section 12 includes two interface modules 38, 39 for manipulating workpiece cassettes 16 within the processing tool 10. The interface modules 38, 39 receive workpiece cassettes 16 through the access ports 32, 33 and may store the workpiece cassettes 16 for subsequent processing of the semiconductor workpieces therein. In addition, the interface modules 38, 39 store the workpiece cassettes for removal from the processing tool 10 upon completion of the processing of the semiconductor workpieces within the respective workpiece cassette 16.

Each interface module 38, 39 may comprise a workpiece cassette turnstile 40, 41 and a workpiece cassette elevator 42, 43. The workpiece cassette turnstiles 40, 41 generally transpose the workpiece cassettes 16 from a stable vertical orientation to a horizontal orientation where access to the semiconductor workpieces is improved. Each workpiece cassette elevator 42, 43 has a respective workpiece cassette support 47, 48 for holding workpiece cassettes 16. Each workpiece cassette elevator 42, 43 is utilized to position a workpiece cassette 16 resting thereon in either a transfer position and extraction position. The operation of the workpiece interface modules 38, 39 is described in detail below.

In a preferred embodiment of the present invention, the first workpiece interface module 38 may function as an input workpiece cassette interface for receiving unprocessed semiconductor workpieces into the processing tool 10. The second workpiece interface module 39 may function as an output workpiece cassette interface for holding processed semiconductor workpieces for removal from the processing tool 10. Workpiece transport units 62, 64 within the processing tool 10 may access workpiece cassettes 16 held by either workpiece interface module 38, 39. Such an arrangement facilitates transferring of semiconductor workpieces throughout the processing tool 10.

A semiconductor workpiece conveyor 60 is shown intermediate processing modules 20, 22, 24 and interface modules 38, 39 in FIG. 2. The workpiece conveyor 60 includes workpiece transport units 62, 64 for transferring individual semiconductor workpieces W between each of the workpiece interface modules 38, 39 and the workpiece processing modules 19.

Workpiece conveyor 60 advantageously includes a transport unit guide 66, such as an elongated rail, which defines a plurality of paths 68, 70 for the workpiece transport units 62, 64 within the processing tool 10. A workpiece transport unit 62 on a first path 68 may pass a workpiece transport unit 64 positioned on a second path 70 during movement of the transport units 62, 64 along transport guide 66. The processing tool 10 may include additional workpiece transport units to facilitate the transfer of semiconductor workpieces W between the workpiece processing modules 20, 22, 24 and workpiece interface modules 38, 39.

Each processing module 20, 22, 24 includes at least one semiconductor workpiece holder such as workpiece holder 810 located generally adjacent the workpiece conveyor 60. In particular, each of the workpiece transport units 62, 64 may deposit a semiconductor workpiece upon a semiconductor workpiece support 401 of the appropriate semiconductor processing module 20, 22, 24. Specifically, workpiece transport unit 64 is shown accessing an semiconductor workpiece support 401 of processing module 20. The workpiece transport units may either deposit or retrieve workpieces on or from the workpiece supports 401.

More specifically, the second arm extension 88 may support a semiconductor workpiece W via vacuum support 89. The appropriate workpiece transport unit 62, 64 may approach a workpiece support 401 by moving along transport unit guide 66. After reaching a proper location along guide 66, the first extension 87 and second extension 88 may rotate to approach the workpiece support 401. The second extension 88 is positioned above the workpiece support 401 and subsequently lowered toward engagement finger assemblies 409 on the workpiece support 401. The vacuum is removed from vacuum support 89 and finger assemblies 409 grasp the semiconductor workpiece W positioned therein. Second extension 88 may be lowered and removed from beneath the semiconductor workpiece held by the workpiece engagement fingers.

Following completion of processing of the semiconductor workpiece within the appropriate processing module 20, 22, 24, a workpiece transport unit 62, 64 may retrieve the workpiece and either deliver the workpiece to another processing module 20, 22, 24 or return the workpiece to a workpiece cassette 16 for storage or removal from the processing tool 10.

Each of the workpiece transport units 62, 64 may access a workpiece cassette 16 adjacent the conveyor 60 for retrieving a semiconductor workpiece from the workpiece cassette 16 or depositing a semiconductor workpiece therein. In particular, workpiece transport unit 62 is shown withdrawing a semiconductor workpiece W from workpiece cassette 16 upon elevator 42 in FIG. 2.

More specifically, the second extension 88 and vacuum support 89 connected therewith may be inserted into a workpiece cassette 16 positioned in the extraction position. Second extension 88 and vacuum support 89 enter below the lower surface of the bottom semiconductor workpiece W held by workpiece cassette 16. A vacuum may be applied via vacuum support 89 once support 89 is positioned below the center of the semiconductor workpiece W being removed. The second extension 88, vacuum support 89 and semiconductor workpiece W attached thereto may be slightly raised via transfer arm elevator 90. Finally, first extension 87 and second extension 88 may be rotated to remove the semiconductor workpiece W from the workpiece cassette 16. The workpiece transport unit 62, 64 may thereafter deliver the semiconductor workpiece W to a workpiece processing module 19 for processing.

Thereafter, workpiece transport unit 62 may travel along path 68 to a position adjacent an appropriate processing module 20, 22, 24 for depositing the semiconductor workpiece upon workpiece processing support 401 for processing of the semiconductor workpiece.

Interface Module

Referring to FIG. 3–FIG. 8, the operation of the interface module 38 is shown in detail. The following discussion is limited to workpiece interface module 38 but is also applicable to workpiece interface module 39 inasmuch as each interface module 38, 39 may operate in substantially the same manner.

Preferably, the first workpiece interface module 38 and the second workpiece interface module 39 may function as a respective semiconductor workpiece cassette 16 input module and output module of the processing tool 10. Alternately, both modules can function as both input and output. More specifically, workpiece cassettes 16 holding unprocessed semiconductors workpieces may be brought into the processing tool 10 via port 32 and temporarily stored within the first workpiece interface module 38 until the semiconductor workpieces are to be removed from the workpiece cassette 16 for processing. Processed semiconductor workpieces may be delivered to a workpiece cassette 16 within the second workpiece interface module 39 via workpiece transport units 62, 64 for temporary storage and/or removal from the processing tool 10.

The workpiece interface modules 38, 39 may be directly accessed by each of the workpiece transport units 62, 64 within the processing tool 10 for transferring semiconductor workpieces therebetween. Providing a plurality of workpiece cassette interface modules 38, 39 accessible by each workpiece transport unit 62, 64 facilitates the transport of semiconductor workpieces W throughout the processing tool 10 according to the present invention.

Each workpiece interface module 38, 39 preferably includes a workpiece cassette turnstile 40 and a workpiece cassette elevator 42 adjacent thereto. The access ports 32, 33 are adjacent the respective workpiece cassette turnstiles 40, 41. Workpiece cassettes 16 may be brought into the processing tool 10 or removed therefrom via ports 32, 33.

Workpiece cassettes 16 are preferably placed in a vertical position onto cassette trays 50 prior to delivery into the processing tool 10. Cassette trays 50 are shown in detail in FIG. 9. The vertical position of workpiece cassettes 16 and the semiconductor workpieces therein provides a secure orientation to maintain the semiconductor workpieces within the workpiece cassette 16 for transportation.

Each workpiece cassette turnstile 40, 41 preferably includes two saddles 45, 46 each configured to hold a workpiece cassette 16. Providing two saddles 45, 46 enables two workpiece cassettes 16 to be placed into the processing tool 10 or removed therefrom during a single opening of a respective access door 35, 36 thereby minimizing exposure of the workspace 11 within the processing tool 10 to the clean room environment.

Each saddle 45, 46 includes two forks engageable with the cassette tray 50. Saddles 45, 46 are powered by motors within the workpiece cassette turnstile shaft 49 to position the workpiece cassette 16 in a horizontal or vertical orientation. The workpiece cassettes 16 and semiconductor workpieces therein are preferably vertically oriented for passage through the access ports 32, 33 and horizontally oriented in a transfer or extraction position to provide access of the workpieces therein to the workpiece transport units 62, 64.

The workpiece cassette 16 held by workpiece cassette turnstile 40 in FIG. 3, also referred to as workpiece cassette 15, is in a hold position (also referred to herein as a load position). The semiconductor workpieces within a workpiece cassette 16 in the hold position may be stored for subsequent processing. Alternatively, the semiconductor workpieces within a workpiece cassette 16 in the hold position may be stored for subsequent removal from the processing tool 10 through an access port 32, 33.

Referring to FIG. 3, the workpiece cassette 16 supported by the workpiece cassette elevator 42, also referred to as workpiece cassette 17, is in an extraction or exchange position. Semiconductor workpieces may either be removed from or placed into a workpiece cassette 16 positioned in the extraction position via a workpiece transport unit 62, 64.

The workpiece cassette turnstile 41 and workpiece cassette elevator 42 may exchange workpiece cassettes 15, 17 to transfer a workpiece cassette 17 having processed semiconductor workpieces therein from the extraction position to the hold position for removal from the processing tool 10. Additionally, such an exchange may transfer a workpiece cassette 15 having unprocessed semiconductor workpieces therein from the hold position to the extraction position providing workpiece transport units 62, 64 with access to the semiconductor workpiece therein.

The exchange of workpiece cassettes 15, 17 is described with reference to FIG. 4–FIG. 8. Specifically, saddle 46 is positioned below a powered shaft 44 of workpiece cassette elevator 42. Shaft 44 is coupled with a powered workpiece cassette support 47 for holding a workpiece cassette 16. Shaft 44 and workpiece cassette support 47 attached thereto are lowered as shown in FIG. 4 and shaft 44 passes between the forks of saddle 46.

Referring to FIG. 5, a motor within shaft 44 rotates workpiece cassette support 47 about an axis through shaft 44 providing the workpiece cassette 17 thereon in an opposing relation to the workpiece cassette 15 held by workpiece cassette turnstile 40. Both saddles 45, 46 of workpiece cassette turnstile 40 are subsequently tilted into a horizontal orientation as shown in FIG. 6. The shaft 44 of workpiece cassette elevator 42 is next lowered and workpiece cassette 17 is brought into engagement with saddle 46 as depicted in FIG. 7. The shaft 44 and workpiece cassette support 47 are lowered an additional amount to clear rotation of workpiece cassettes 16. Referring to FIG. 8, workpiece cassette turnstile 40 rotates 180 degrees to transpose workpiece cassettes 15, 17.

Workpiece cassette 17 having processed semiconductor workpieces therein is now accessible via port 32 for removal from the processing tool 10. Workpiece cassette 15 having unprocessed semiconductors therein is now positioned for engagement with workpiece cassette support 47. The transfer process steps shown in FIG. 3–FIG. 8 may be reversed to elevate the workpiece cassette 15 into the extraction position providing access of the semiconductor workpieces to workpiece transport units 62, 64.

Workpiece Cassette Tray

A workpiece cassette tray 50 for holding a workpiece cassette 16 is shown in detail in FIG. 9. Each cassette tray 50 may include a base 51 and an upright portion 54 preferably perpendicular to the base 51. Two lateral supports 52 may be formed on opposing sides of the base 51 and extend upward therefrom. Lateral supports 52 assist with maintaining workpiece cassettes 16 thereon in a fixed position during the movement, rotation and exchange of workpiece cassettes 16. Each lateral support 52 contains a groove 53 preferably extending the length thereof configured to engage with the forks of saddles 45, 46.

The workpiece cassette trays 50 are preferably utilized during the handling of workpiece cassettes 16 within the workpiece cassette interface modules 38, 39 where the workpiece cassettes 16 are transferred from a load position to an extraction position providing access of the semiconductor workpieces W to workpiece transport units 62, 64 within the conveyor 60.

Semiconductor Workpiece Conveyor

The processing tool 10 in accordance with the present invention advantageously provides a semiconductor workpiece conveyor 60 for transporting semiconductor workpieces throughout the processing tool 10. Preferably, semiconductor workpiece conveyor 60 may access each workpiece cassette interface module 38, 39 and each workpiece processing module 19 within processing tool 10 for transferring semiconductor workpieces therebetween. This includes processing modules from either side.

One embodiment of the workpiece conveyor 60 is depicted in FIG. 10. The workpiece conveyor 60 generally includes a workpiece transport unit guide 66 which preferably comprises an elongated spine or rail mounted to frame 65. Alternatively, transport unit guide 66 may be formed as a track or any other configuration for guiding the workpiece transport units 62, 64 thereon. The length of workpiece conveyor 60 may be varied and is configured to permit access of the workpiece transport units 62, 64 to each interface module 38, 39 and processing modules 20, 22, 24.

Figure 11:
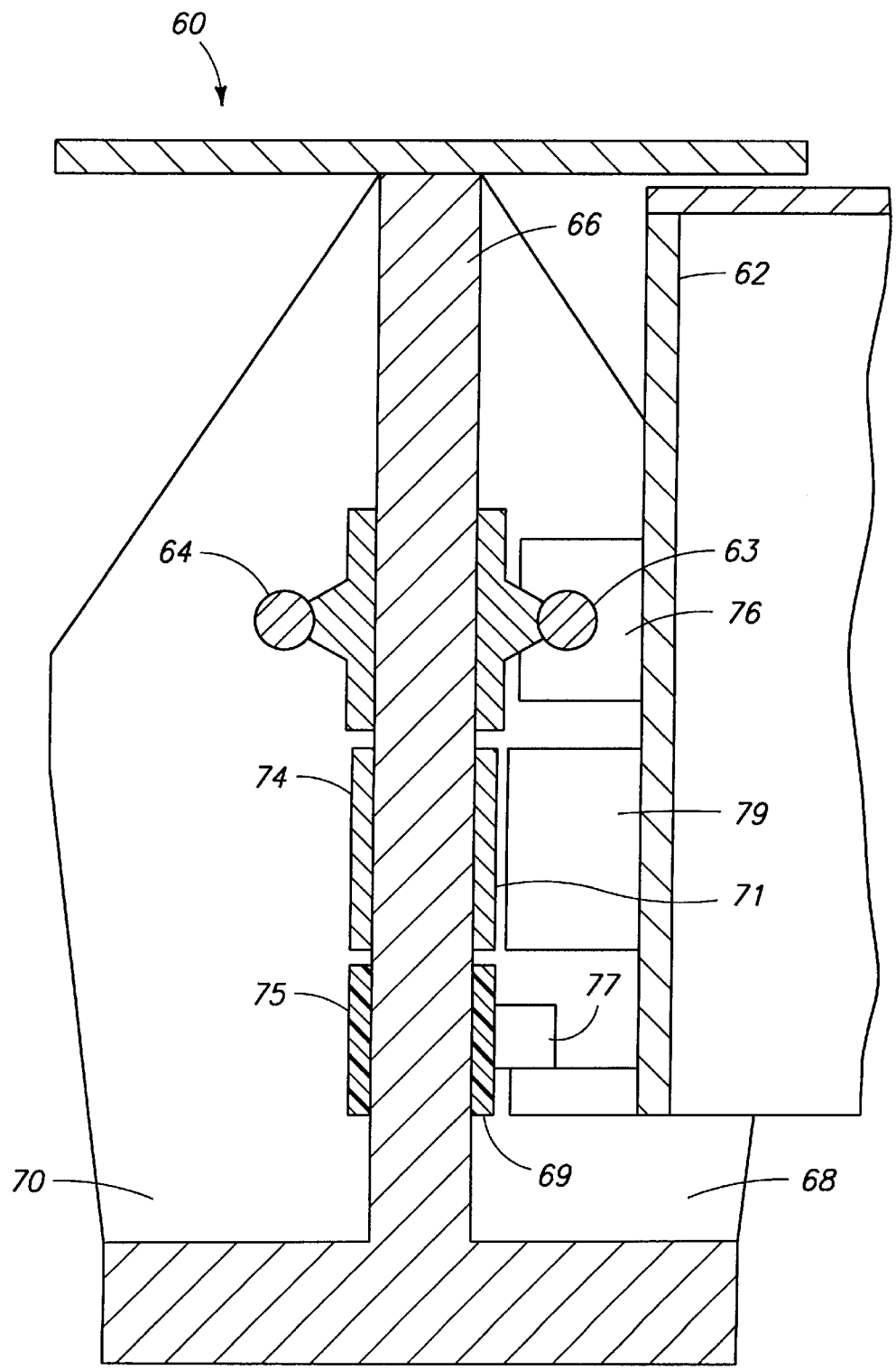
FIG. 11 is a cross-sectional view taken along line 11—11 of the semiconductor workpiece conveyor shown in FIG. 10.

Workpiece transport unit guide 66 defines the paths of movement 68, 70 of workpiece transport units 62, 64 coupled therewith. Referring to FIG. 11, a spine of transport unit guide 66 includes guide rails 63, 64 mounted on opposite sides thereof. Each semiconductor workpiece transport unit 62, 64 preferably engages a respective guide rail 63, 64. Each guide rail can mount one or more transport units 62, 64. Extensions 69, 75 may be fixed to opposing sides of guide 66 for providing stability of the transport units 62, 64 thereagainst and to protect guide 66 from wear. Each workpiece transport unit 62, 64 includes a roller 77 configured to ride along a respective extension 69, 75 of guide 66.

It is to be understood that workpiece conveyor 60 may be formed in alternate configurations dependent upon the arrangement of interface modules 38, 39 and processing modules 20, 22, 24 within the processing tool 10. Ducts 58, 59 are preferably in fluid communication with extensions from each workpiece processing module 19 and an exhaust fan for removing circulated air from the workspace 11 of the processing tool 10.

Each workpiece transport unit 62, 64 is powered along the respective path 68, 70 by a suitable driver. More specifically, drive operators 71, 74 are advantageously mounted to respective sides of transport unit guide 66 to provide controllable axial movement of workpiece transport units 62, 64 along the transport unit guide 66.

The drive operators 71, 74 may be linear magnetic motors for providing precise positioning of workpiece transport units 62, 64 along guide 66. In particular, drive operators 71, 74 are preferably linear brushless direct current motors. Such preferred driver operators 71, 74 utilize a series of angled magnetic segments which magnetically interact with a respective electromagnet 79 mounted on the workpiece transport units 62, 64 to propel the units along the transport unit guide 66.

Cable guards 72, 73 may be connected to respective workpiece transport units 62, 64 and frame 65 for protecting communication and power cables therein. Cable guards 72, 73 may comprise a plurality of interconnected segments to permit a full range of motion of workpiece transport units 62, 64 along transport unit guide 66.

As shown in FIG. 11, a first workpiece transport unit 62 is coupled with a first side of the spine of guide 66. Each workpiece transport unit 62, 64 includes a linear bearing 76 for engagement with linear guide rails 63, 64. Further, the workpiece transport units 62, 64 each preferably include a horizontal roller 77 for engaging a extension 69 formed upon the spine of the guide 66 and providing stability.

FIG. 11 additionally shows an electromagnet 79 of the first workpiece transport unit 62 mounted in a position to magnetically interact with drive actuator 71. Drive actuator 71 and electromagnet 79 provide axial movement and directional control of the workpiece transport units 62, 64 along the transport unit guide 66.

Semiconductor Workpiece Transport Units

Preferred embodiments of the semiconductor workpiece transport units 62, 64 of the workpiece conveyor 60 are described with reference to FIG. 12 and FIG. 13.

In general, each workpiece transport unit 62, 64 includes a movable carriage or tram 84 coupled to a respective side of the transport unit guide 66, a workpiece transfer arm assembly 86 movably connected to the tram 84 for supporting a semiconductor workpiece W, and a workpiece transfer arm elevator 90 for adjusting the elevation of the transfer arm assembly 86 relative to tram 84.

Figure 12:
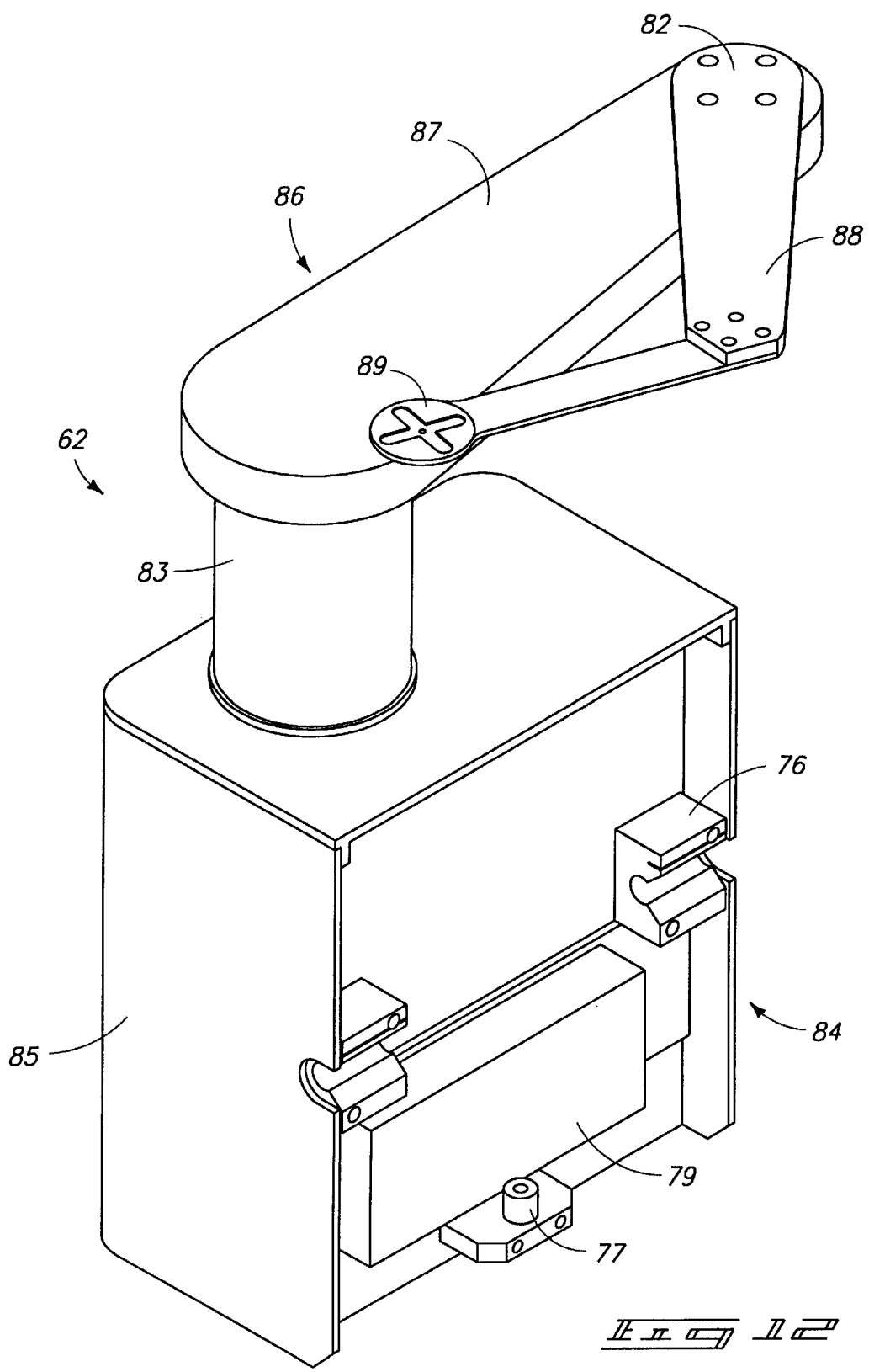
FIG. 12 is a first isometric view of an embodiment of a semiconductor workpiece transport unit of the semiconductor workpiece conveyor shown in FIG. 10.

Referring to FIG. 12, a cover 85 surrounds the portion of tram 84 facing away from the transport unit guide 66. Tram 84 includes linear bearings 76 for engagement with respective guide rails 63, 64 mounted to transport unit guide 66. Linear bearings 76 maintain the tram 84 in a fixed relation with the transport unit guide 66 and permit axial movement of the tram 84 therealong. A roller 77 engages a respective extension 69 for preventing rotation of tram 84 about guide rail 63, 64 and providing stability of workpiece transport unit 62. The electromagnet 79 is also shown connected with the tram 84 in such a position to magnetically interact with a respective transport unit 62, 64 drive actuator 71, 74.

A workpiece transfer arm assembly 86 extends above the top of tram 84. The workpiece transfer arm assembly 86 may include a first arm extension 87 coupled at a first end thereof with a shaft 83. A second arm extension 88 may be advantageously coupled with a second end of the first extension 87. The first arm extension 87 may rotate 360 degrees about shaft 83 and second arm extension 88 may rotate 360 degrees about axis 82 passing through a shaft connecting first and second arm extensions 87, 88.

Second extension 88 preferably includes a wafer support 89 at a distal end thereof for supporting a semiconductor workpiece W during the transporting thereof along workpiece conveyor 60. The transfer arm assembly 86 preferably includes a chamber coupled with the workpiece support 89 for applying a vacuum thereto and holding a semiconductor workpiece W thereon.

Providing adjustable elevation of transfer arm assembly 86, rotation of first arm extension 87 about the axis of shaft 83, and rotation of second extension 88 about axis 82 allows the transfer arm 86 to access each semiconductor workpiece holder 810 of all processing modules 19 and each of the wafer cassettes 16 held by interface modules 38, 39 within the processing tool 10. Such access permits the semiconductor workpiece transport units 62, 64 to transfer semiconductor workpieces therebetween.

Figure 13:
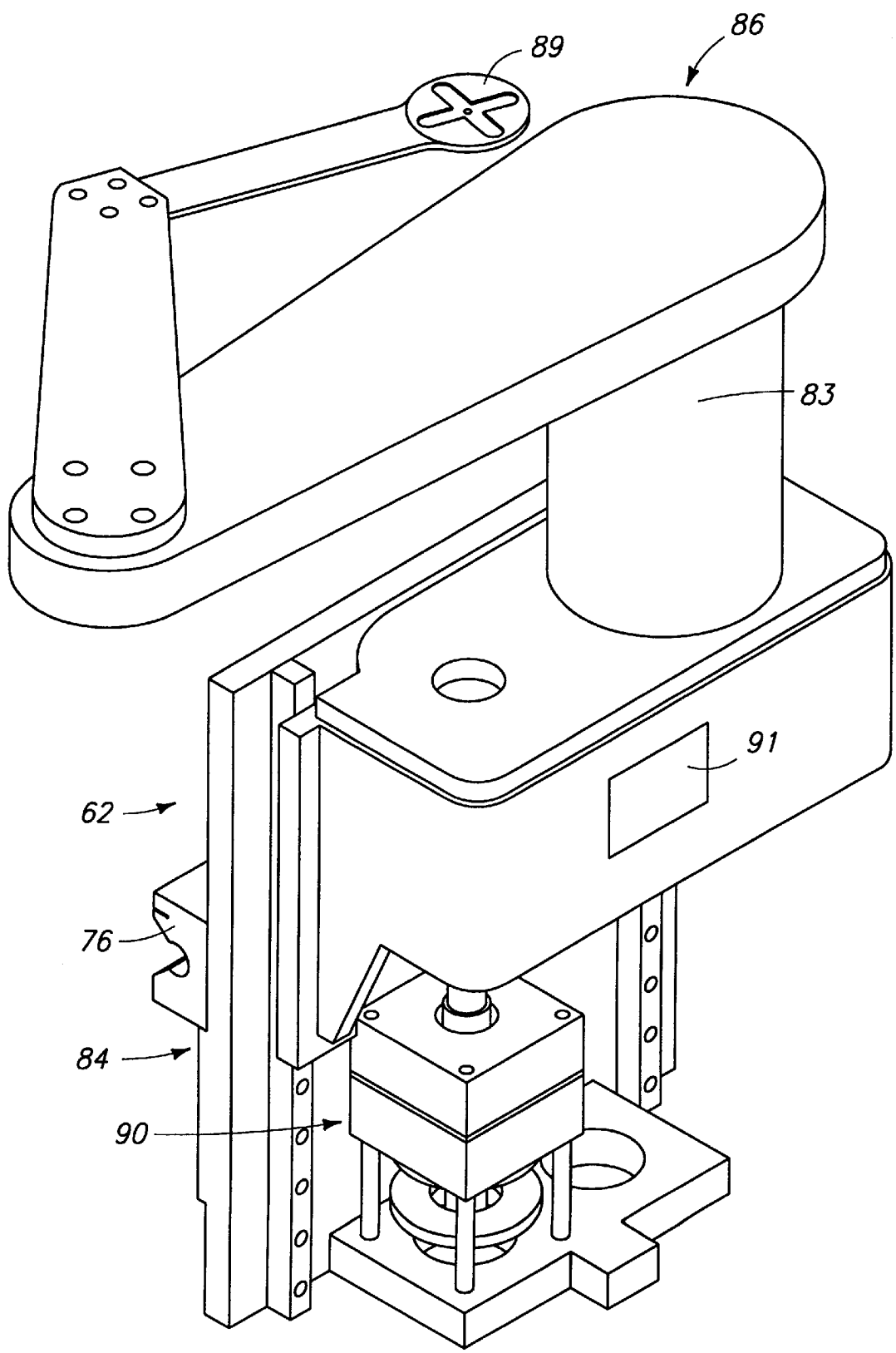
FIG. 13 is a second isometric view of the semiconductor workpiece transport unit shown in FIG. 12 with the cover thereof removed.

The cover 85 has been removed from the workpiece transport unit 62, 64 shown in FIG. 13 to reveal a workpiece transfer arm elevator 90 coupled with tram 84 and transfer arm assembly 86. Transfer arm elevator 90 adjusts the vertical position of the transfer arm assembly 86 relative to the tram 84 during the steps of transferring a semiconductor workpiece between the workpiece support 89 and one of a workpiece holder 810 and the workpiece cassette 16.

The path position of the tram 84 of each workpiece transport unit 62, 64 along the transport unit guide 66 is precisely controlled using a positional indicating array, such as a CCD array 91 of FIG. 13. In one embodiment of the processing tool 10, each semiconductor workpiece holder 810 within a processing module 19 has a corresponding light or other beam emitter 81 mounted on a surface of the processing module 19 as shown in FIG. 2 for directing a beam of light toward the transport unit guide 66. The light emitter 81 may present a continuous beam or alternatively may be configured to generate the beam as a workpiece transport unit 62, 64 approaches the respective workpiece holder 810.

The transfer arm assembly 86 includes an CCD array 91 positioned to receive the laser beam generated by light emitter 81. A position indicating array 91 on shaft 83 detects the presence of the light beam to determine the location of tram 84 along transport unit guide 66. The positional accuracy of the workpiece transport unit position indicator is preferably in the range less than 0.003 inch (approximately less than 0.1 millimeter).

Control System Generally

Figure 14:
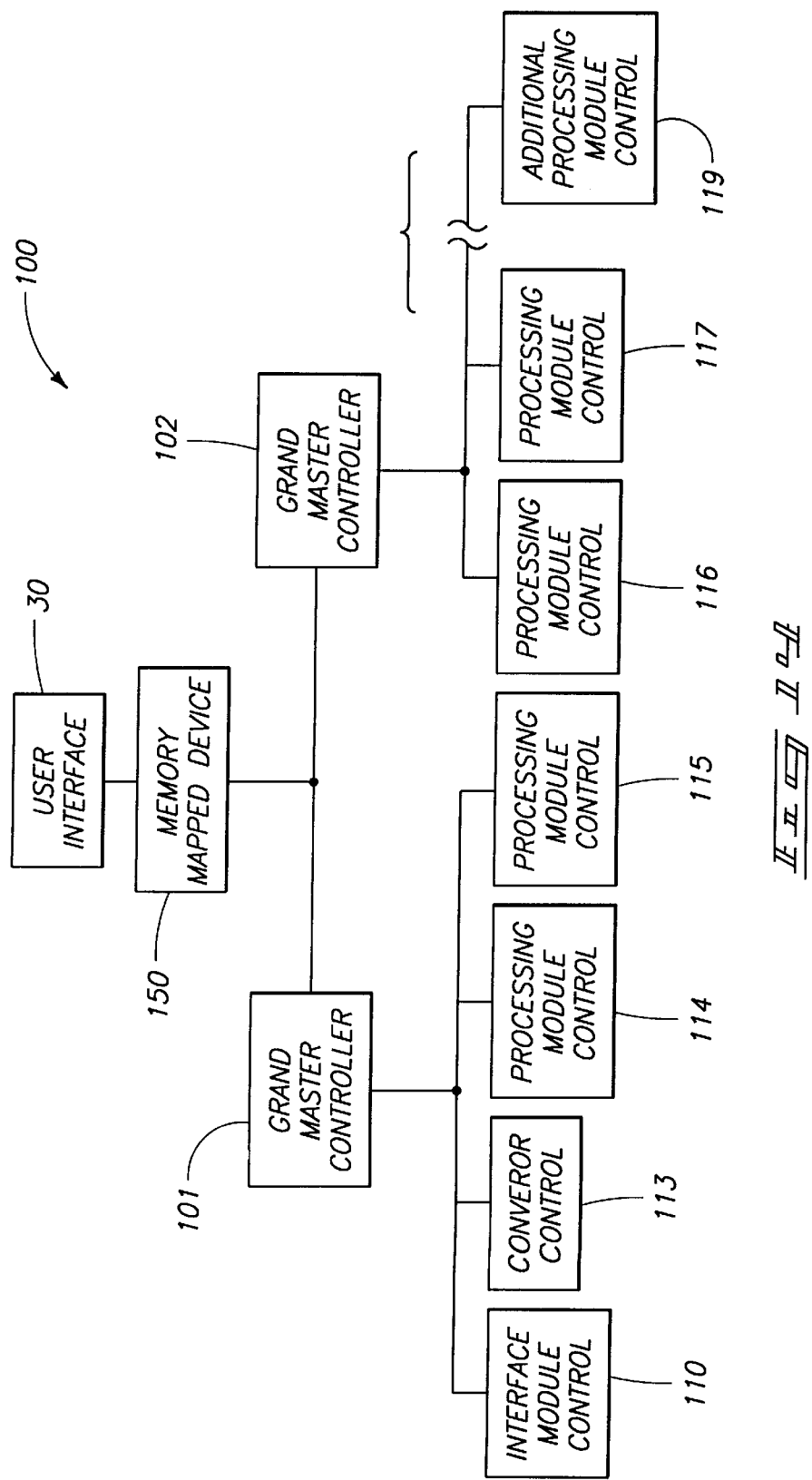
FIG. 14 is a functional block diagram of an embodiment of a control system of the semiconductor workpiece processing tool in accordance with the present invention.

Referring to FIG. 14, a presently preferred embodiment of the control system 100 of the semiconductor workpiece processing tool 10 in accordance with the present invention generally includes at least one grand master controller 101 for controlling and/or monitoring the overall function of the processing tool 10.

The control system 100 is preferably arranged in a hierarchial configuration. The grand master controller 101 includes a processor electrically coupled with a plurality of subsystem control units as shown in FIG. 14. The control subsystems preferably control and monitor the operation of components of the corresponding apparatus (i.e., workpiece conveyor 60, processing modules 20, 22, 24, interface modules 38, 39, etc.). The control subsystems are preferably configured to receive instructional commands or operation instructions such as software code from a respective grand master control 101, 102. The control subsystems 110, 113–119 preferably provide process and status information to respective grand master controllers 101, 102.

More specifically, the grand master control 101 is coupled with an interface module control 110 which may control each of the semiconductor workpiece interface modules 38, 39. Further, grand master control 101 is coupled with a conveyor control 113 for controlling operations of the workpiece conveyor 60 and a plurality of processing module controls 114, 115 corresponding to semiconductor workpiece processing modules 20, 22 within the processing tool 10.

The control system 100 of the processing tool 10 according to the present invention may include additional grand master controllers 102 as shown in FIG. 14 for monitoring or operating additional subsystems, such as additional workpiece processing modules via additional processing module control 119. Four control subsystems may be preferably coupled with each grand master controller 101, 102. The grand master controllers 101, 102 are preferably coupled together and each may transfer process data to the other.

Each grand master controller 101, 102 receives and transmits data to the respective modular control subsystems 110–119. In a preferred embodiment of the control system 100, a bidirectional memory mapped device is provided intermediate the grand master controller and each modular subsystem connected thereto. In particular, memory mapped devices 160, 161, 162 are provided intermediate the grand master controller 101 and master controllers 130, 131, 132 within respective interface module control 110, workpiece conveyor control 113 and processing module control 114.

Each memory mapped device 150, 160–162 within the control system 100 is preferably a dual port RAM provided by Cypress for asynchronouosly storing data. In particular, grand master controller 101 may write data to a memory location corresponding to master controller 130 and master controller 130 may simultaneously read the data. Alternatively, grand master controller 101 may read data from mapped memory device being written by the master controller 130. Utilizing memory mapped devices 160–161 provides data transfer at processor speeds. Memory mapped device 150 is preferably provided intermediate user interface 30 and the grand master controllers 101, 102 for transferring data therebetween.

A user interface 30 is preferably coupled with each of the grand master controllers 101, 102. The user interface 30 may be advantageously mounted on the exterior of the processing tool 10 or at a remote location to provide an operator with processing and status information of the processing tool 10. Additionally, an operator may input control sequences and processing directives for the processing tool 10 via user interface 30. The user interface 30 is preferably supported by a general purpose computer within the processing tool 10. The general purpose computer preferably includes a 486 100 MHz processor, but other processors may be utilized.

Master/Slave Configuration

Each modular control subsystem, including interface module control 110, workpiece conveyor control 113 and each processing module control 114–119, is preferably configured in a master/slave arrangement. The modular control subsystems 110, 113–119 are preferably housed within the respective module such as workpiece interface module 38, 39, workpiece conveyor 60, or each of the processing modules 20, 22, 24. The grand master controller 101 and corresponding master controllers 130, 131, 132 coupled therewith are preferably embodied on a printed circuit board or ISA board mounted within the general purpose computer supporting user interface 30. Each grand master controller 101, 102 preferably includes a 68EC000 processor provided by Motorola and each master controller 130 and slave controller within control system 100 preferably includes a 80251 processor provided by Intel.

Each master controller 130, 131, 132 is coupled with its respective slave controllers via a data link 126, 127, 129 as shown in FIG. 16–FIG. 18. Each data link 126, 127, 129 preferably comprises a optical data medium such as Optilink provided by Hewlett Packard. However, data links 126, 127, 129 may comprise alternate data transfer media.

Figure 15:
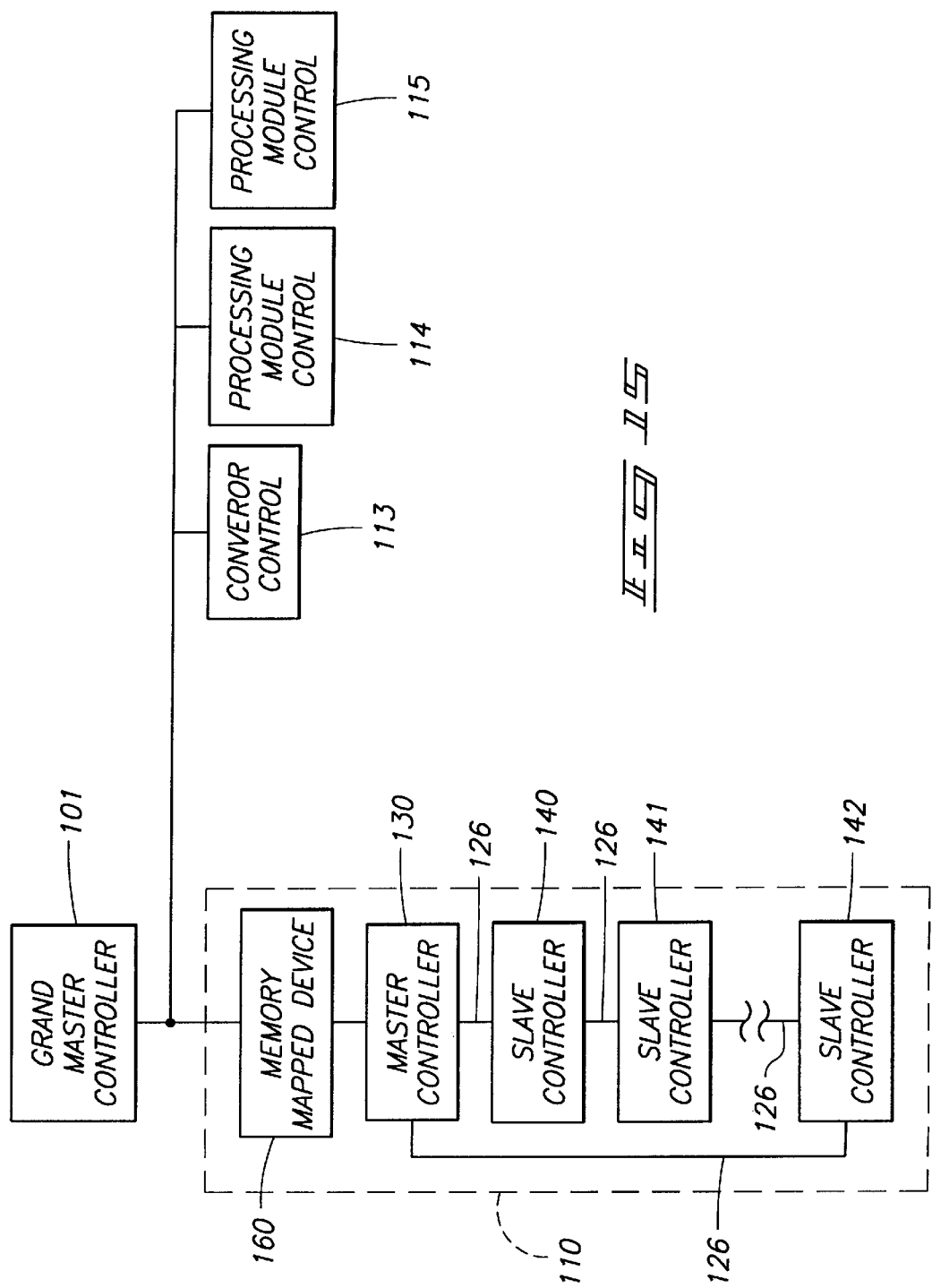
FIG. 15 is a functional block diagram of a master/slave control configuration of an interface module control subsystem for controlling a workpiece cassette interface module of the processing tool.

Referring to FIG. 15, the master/slave control subsystem for the interface module control 110 is illustrated. Each master and related slave configuration preferably corresponds to a single module (i.e., interface, conveyor, processing) within the processing tool 10. However, one master may control or monitor a plurality of modules. The master/slave configuration depicted in FIG. 15 and corresponding to the interface module control 110 may additionally apply to the other modular control subsystems 113, 114, 115.

The grand master controller 101 is connected via memory mapped device 160 to a master controller 130 within the corresponding interface module control 110. The master controller 130 is coupled with a plurality of slave controllers 140, 141, 142. Sixteen slave controllers may be preferably coupled with a single master controller 130–132 and each slave controller may be configured to control and monitor a single motor or process component, or a plurality of motors and process components.

The control system 100 of the processing tool 10 preferably utilizes flash memory. More specifically, the operation instructions or program code for operating each master controller 130–132 and slave controller 140–147 within the control system 100 may be advantageously stored within the memory of the corresponding grand master controller 101, 102. Upon powering up, the grand master controller 101, 102 may poll the corresponding master controllers 130–132 and download the appropriate operation instruction program to operate each master controller 130–132. Similarly, each master controller 130–132 may poll respective slave controllers 140–147 for identification. Thereafter, the master controller 130–132 may initiate downloading of the appropriate program from the grand master controller 101, 102 to the respective slave controller 140–147 via the master controller 130–132.

Each slave controller may be configured to control and monitor a single motor or a plurality of motors within a corresponding processing module 19, interface module 38, 39 and workpiece conveyor 60. In addition, each slave controller 140–147 may be configured to monitor and control process components 184 within a respective module 19. Any one slave controller, such as slave controller 145 shown in FIG. 21, may be configured to control and/or monitor servo motors and process components 184.

Each slave controller includes a slave processor which is coupled with a plurality of port interfaces. Each port interface may be utilized for control and/or monitoring of servo motors and process components 184. For example, a port may be coupled with a servo controller card 176 which is configured to operate a workpiece transfer unit 62, 64. The slave processor 171 may operate the workpiece transfer unit 62, 64 via the port and servo controller 176. More specifically, the slave processor 171 may operate servo motors within the workpiece transfer unit 62, 64 and monitor the state of the motor through the servo controller 176.

Alternatively, different slave controllers 140, 141 may operate different components within a single processing tool device, such as interface module 38. More specifically, the interface module control 110 and components of the interface module 38 are depicted in FIG. 16. Slave controller 140 may operate turnstile motor 185 and monitor the position of the turnstile 40 via incremental turnstile encoder 190. Slave controller 140 is preferably coupled with the turnstile motor 185 and turnstile encoder 190 via a servo control card (shown in FIG. 19). Slave controller 141 may operate and monitor saddle 45 of the turnstile 40 by controlling saddle motor 186 and monitoring saddle encoder 191 via a servo control card.

A port of a slave processor may be coupled with an interface controller card 180 for controlling and monitoring process components within a respective processing module 19. For example, a flow sensor 657 may provide flow information of the delivery of processing fluid to a processing bowl within the module. The interface controller 180 is configured to translate the data provided by the flow sensors 657 or other process components into a form which may be analyzed by the corresponding slave processor 172. Further, the interface controller 180 may operate a process component, such as a flow controller 658, responsive to commands from the corresponding slave processor 172.

One slave controller 140–147 may contain one or more servo controller and one or more interface controller coupled with respective ports of the slave processor 170–172 for permitting control and monitor capabilities of various component motors and processing components from a single slave controller.

Alternatively, a servo controller and interface controller may each contain an onboard processor for improving the speed of processing and operation. Data provided by an encoder or process component to the servo controller or interface controller may be immediately processed by the on board processor which may also control a respective servo motor or processing component responsive to the data. In such a configuration, the slave processor may transfer the data from the interface processor or servo controller processor to the respective master controller and grand master controller.

Conveyor Control Subsystem

The conveyor control subsystem 113 for controlling and monitoring the operation of the workpiece conveyor 60 and the workpiece transport units 62, 64 therein is shown in FIG. 17. In general, a slave controller 143 of conveyor control 113 is coupled with drive actuator 71 for controllably moving and monitoring a workpiece transport unit 62 along the guide 66. Further, slave controller 143 may operate transfer arm assembly 86 of the workpiece transport unit 62 and the transferring of semiconductor workpieces thereby. Similarly, slave controller 144 may be configured to operate workpiece transport unit 64 and drive actuator 74.

Figure 20:
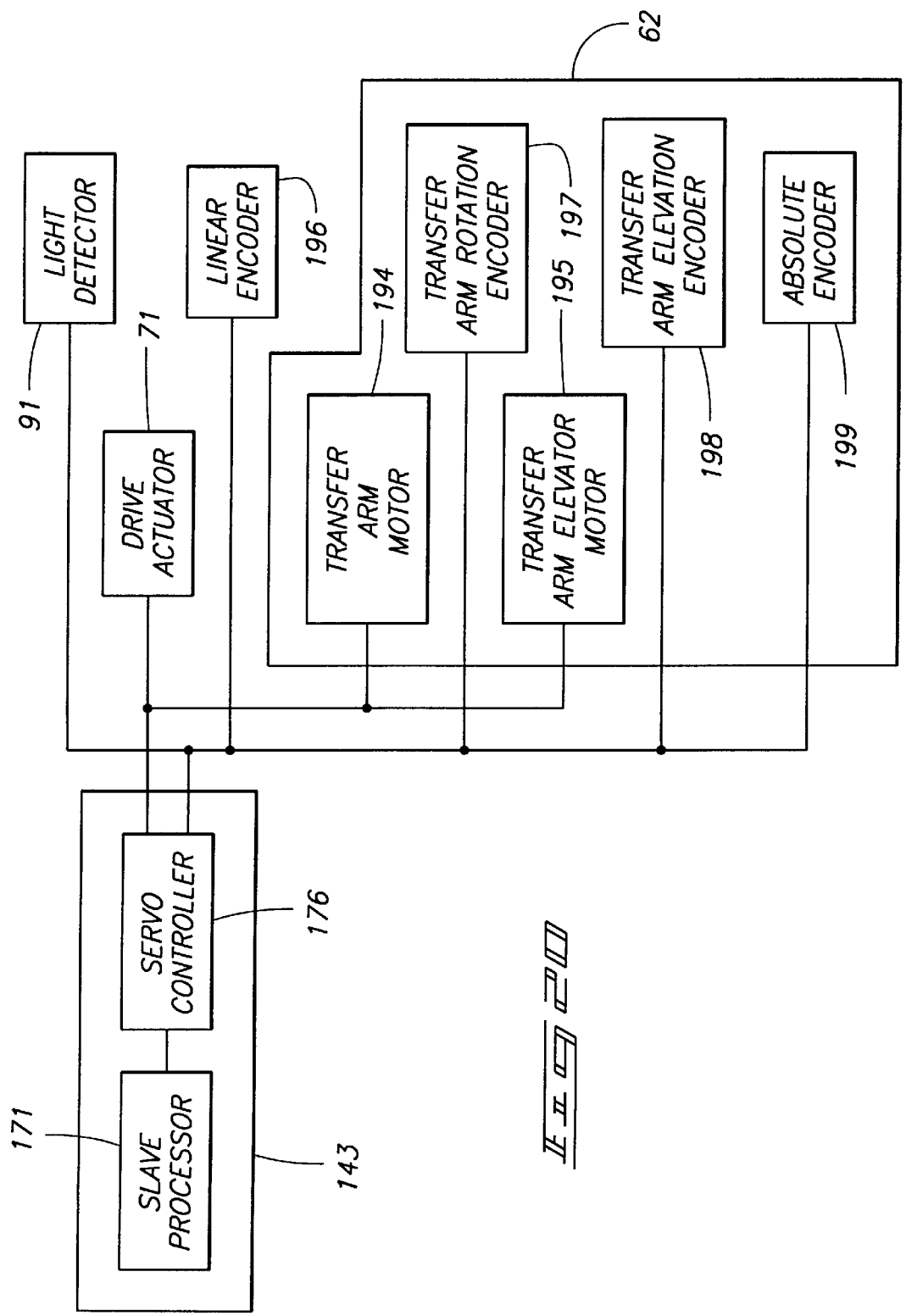
FIG. 20 is a functional block diagram of a slave processor of the workpiece conveyor control subsystem shown in FIG. 17 coupled with components of a workpiece conveyor of the processing tool.

The interfacing of slave controller 143 and light detector 91, drive actuator 71, linear encoder 196 and workpiece transport unit 62 is shown in detail in FIG. 20. The slave processor 171 of slave controller 143 is preferably coupled with a servo controller 176. Slave processor 171 may control the linear position of workpiece transport unit 62 by operating drive actuator 71 via servo controller 176. Light detector 91 may provide linear position information of the workpiece transport unit 62 along guide 66. Additionally, a linear encoder 196 may also be utilized for precisely monitoring the position of workpiece transport unit 62 along guide 66.

The conveyor slave processor 171 may also control and monitor the operation of the transfer arm assembly 86 of the corresponding workpiece transport unit 62. Specifically, the conveyor processor 171 may be coupled with a transfer arm motor 194 within shaft 83 for controllably rotating the first and second arm extensions 87, 88. An incremental transfer arm rotation encoder 197 may be provided within the shaft 83 of each workpiece transport unit 62 for monitoring the rotation of transfer arm assembly 86 and providing rotation data thereof to servo controller 176 and slave processor 171.

Slave controller 143 may be advantageously coupled with transfer arm elevation motor 195 within elevator 90 for controlling the elevational position of the transfer arm assembly 86. An incremental transfer arm elevation encoder 198 may be provided within the transfer arm elevator assembly 90 for monitoring the elevation of the transfer arm assembly 86.

In addition, conveyor slave controller 143 may be coupled with an air supply control valve actuator (not shown) via an interface controller for controlling a vacuum within wafer support 89 for selectively supporting a semiconductor workpiece thereon.

Absolute encoders 199 may be provided within the workpiece conveyor 60, interface modules 38, 39 and processing modules 19 to detect extreme conditions of operation and protect servo motors therein. For example, absolute encoder 199 may detect a condition where the transfer arm assembly 86 has reached a maximum height and absolute encoder 199 may turn off elevator 90 to protect transfer arm elevator motor 195.

Processing Module Control

The control system 100 preferably includes a processing module control subsystem 114–116 corresponding to each workpiece processing module 20, 22, 24 within the processing tool 10 according to the present invention. The control system 100 may also include additional processing module control subsystem 119 for controlling and/or monitoring additional workpiece processing modules 19.

Respective processing module controls 114, 115, 116 may control and monitor the transferring of semiconductor workpieces W between a corresponding workpiece holder 810 and workpiece transport unit 62, 64. Further, processing module controls 114, 115, 116 may advantageously control and/or monitor the processing of the semiconductor workpieces W within each processing module 20, 22, 24.

Figure 21:
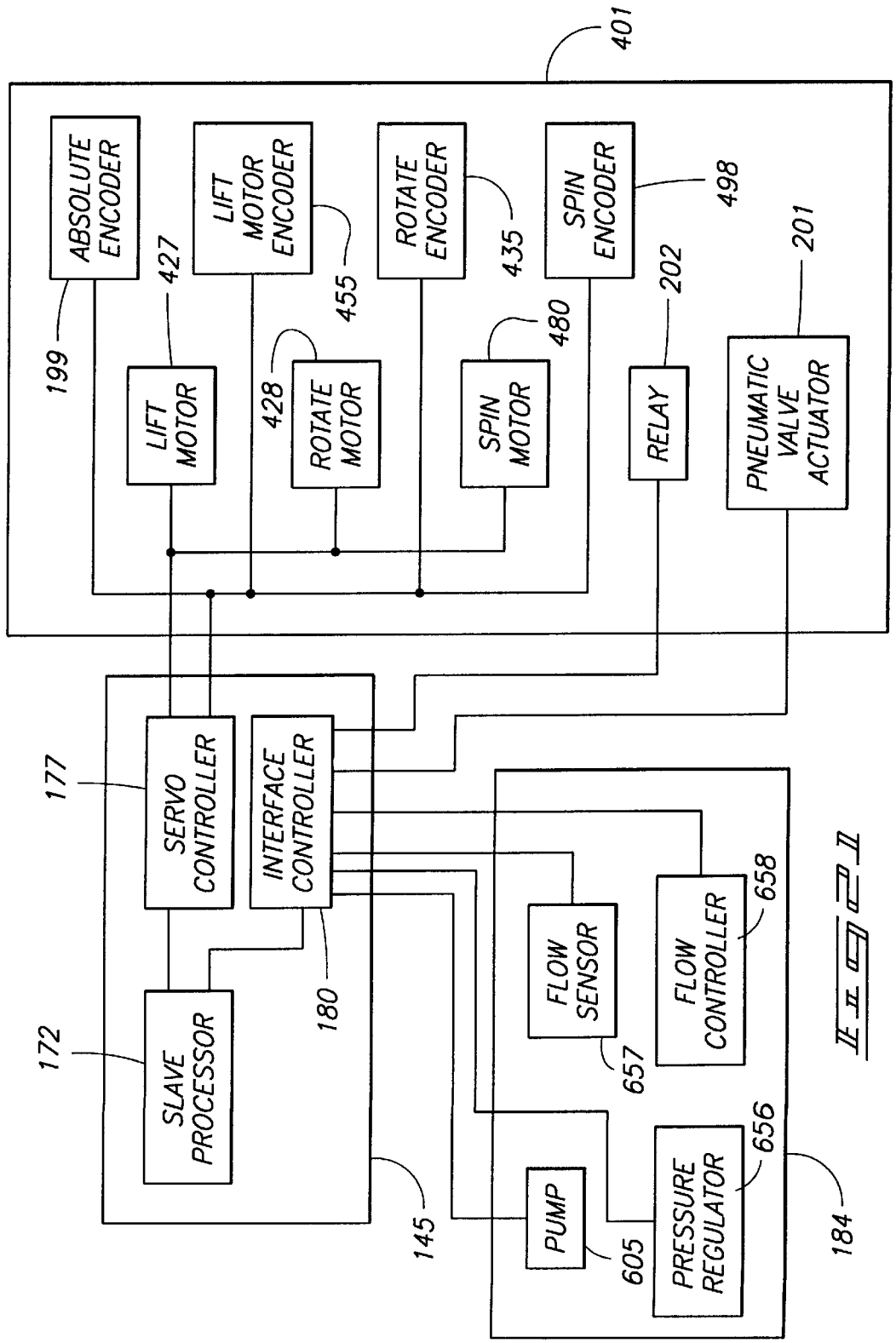
FIG. 21 is a functional block diagram of a slave processor of the workpiece processing module control subsystem shown in FIG. 18 coupled with components of a workpiece processing module of the processing tool.

Referring to FIG. 18, a single slave controller 147 may operate a plurality of workpiece holders 401c–401e within a processing module 20. Alternatively, a single slave controller 145, 146 may operate and monitor a single respective workpiece holder 401a, 401b. An additional slave controller 148 may be utilized to operate and monitor all process components 184 (i.e., flow sensors, valve actuators, heaters, temperature sensors) within a single processing module 19. Further, as shown in FIG. 21, a single slave controller 145 may operate and monitor a workpiece holder 410 and process components 184.

In addition, a single slave controller 145–148 may be configured to operate and monitor one or more workpiece holder 401 and processing components 184. The interfacing of a slave controller 145 to both a workpiece holder 401 and process components is shown in the control system embodiment in FIG. 21. In particular, a servo controller 177 and interface controller 180 may be coupled with respective ports connected to slave processor 172 of slave controller 145.

Slave processor 172 may operate and monitor a plurality of workpiece holder components via servo controller 177. In particular, slave processor 172 may operate lift motor 427 for raising operator arm 407 about lift drive shaft 456. An incremental lift motion encoder 455 may be provided within a workpiece holder 401 to provide rotational information of lift arm 407 to the respective slave processor 172 or a processor within servo controller 177. Slave processor 172 may also control a rotate motor 428 within workpiece holder 401 for rotating a processing head 406 about shafts 429, 430 between a process position and a semiconductor workpiece transfer position. Incremental rotate encoder 435 may provide rotational information regarding the processing head 406 to the corresponding slave processor 172.

Spin motor 480 may also be controlled by a processor within servo controller 177 or slave processor 172 for rotating the workpiece holder 478 during processing of a semiconduct or workpiece W held thereby. An incremental spin encoder 498 is preferably provided to monitor the rate of revolutions of the workpiece holder 478 and supply the rate information to the slave processor 172.

Plating module control 114 advantageously operates the fingertips 414 of the workpiece holder 478 for grasping or releasing a semiconductor workpiece. In particular, slave processor 172 may operate a valve via pneumatic valve actuator 201 for supplying air to pneumatic piston 502 for actuating fingertips 414 for grasping a semiconductor workpiece. The slave controller 145 within the plating module control 114 may thereafter operate the valve actuator 201 to remove the air supply thereby disengaging the fingertips 414 from the semiconductor workpiece. Slave processor 172 may also control the application of electrical current through the finger assembly 824 during the processing of a semiconductor workpiece by operating relay 202.

The processing module controls 114, 115, 116 preferably operate and monitor the processing of semiconductor workpieces within the corresponding workpiece processing modules 20, 22, 24 via instrumentation or process components 184.

Referring to FIG. 21, the control operation for the plating processing module 20 is described. Generally, slave processor 172 monitors and/or controls process components 184 via interface controller 180. Slave processor 172 within the plating module control 114 operates pump 605 to draw processing solution from the process fluid reservoir 604 to the pump discharge filter 607. The processing fluid passes through the filter, into supply manifold 652 and is delivered via bowl supply lines to a plurality of processing plating bowls wherein the semiconductor workpieces are processed. Each bowl supply line preferably includes a flow sensor 657 coupled with the plating processing module control 114 for providing flow information of the processing fluid thereto. Responsive to the flow information, the slave processor 172 may operate an actuator of flow controller 658 within each bowl supply line to control the flow of processing fluid therethrough. Slave processor 172 may also monitor and control a back pressure regulator 656 for maintaining a predetermined pressure level within the supply manifold 652. The pressure regulator 656 may provide pressure information to the slave processor 172 within the plating processing control module 114.

Similarly, processing module control subsystems 115, 116 may be configured to control the processing of semiconductor workpieces within the corresponding prewet module 22 and resist module 24.

Interface Module Control

Each interface module control subsystem 110 preferably controls and monitors the operation of workpiece interface modules 38, 39. More specifically, interface module control 110 controls and monitors the operation of the workpiece cassette turnstiles 40, 41 and elevators 42, 43 of respective semiconductor workpiece interface modules 38, 39 to exchange workpiece cassettes 16.

Slave processor 170 within slave controller 140 of interface module control 110 may operate and monitor the function of the interface modules 38, 39. In particular, slave processor 170 may operate doors 35, 36 for providing access into the processing tool 10 via ports 32, 33. Alternatively, master control 100 may operate doors 35, 36.

Figure 19:
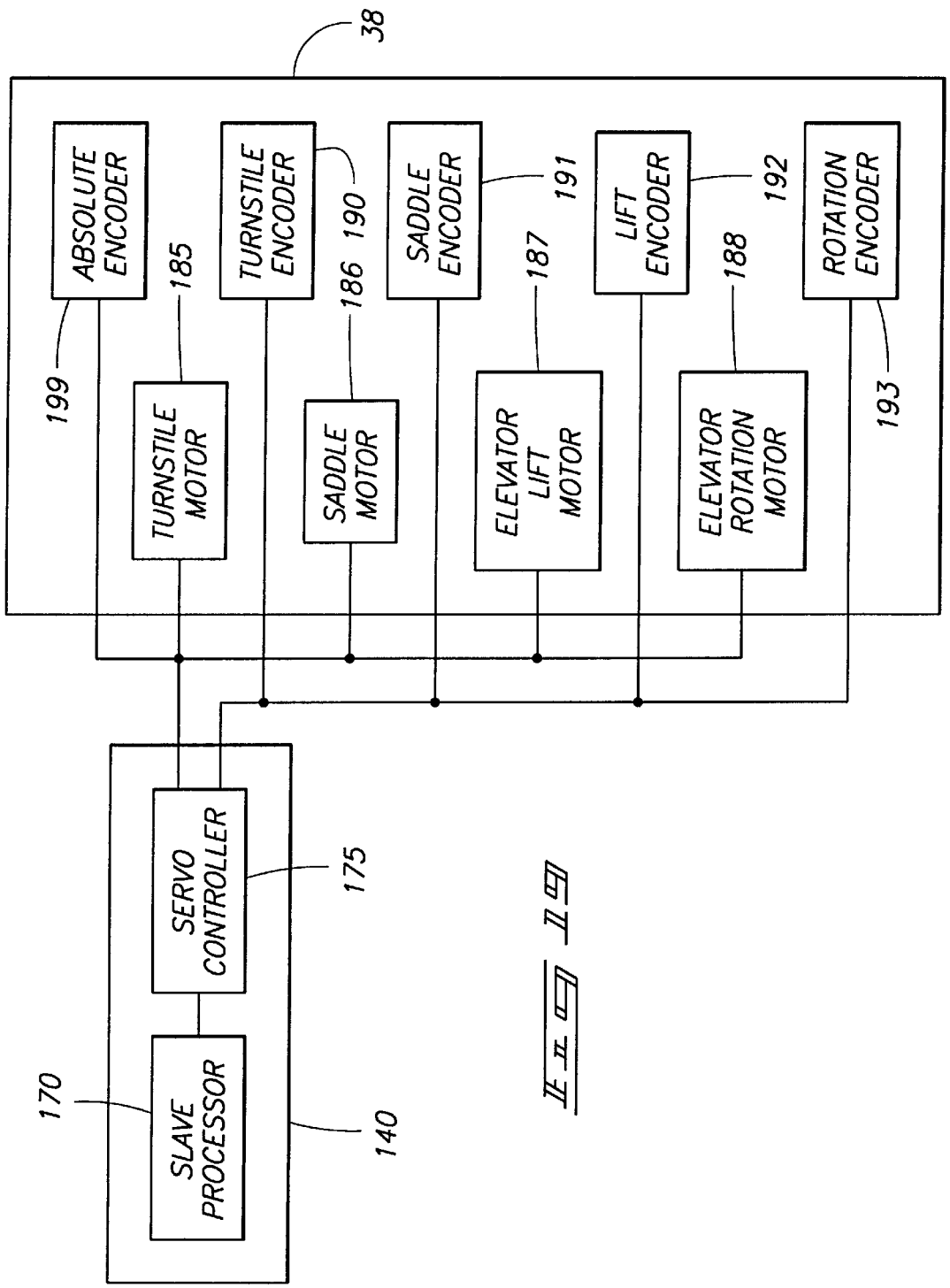
FIG. 19 is a functional block diagram of a slave processor of the interface module control subsystem shown in FIG. 16 coupled with components of a workpiece interface module of the processing tool.

Referring to FIG. 19, an embodiment of the interface module control portion for controlling workpiece interface module 38 is discussed. In particular, the slave processor 170 is coupled with servo controller 175. Either slave processor 170 or a processor on board servo controller 175 may operate the components of interface module 38. In particular, slave processor 170 may control turnstile motor 185 for operating rotate functions of turnstile 40 moving workpiece cassettes 16 between a load position and a transfer position. Incremental turnstile encoder 190 monitors the position of turnstile 40 and provides position data to slave processor 170. Alternatively, servo controller 175 may include a processor for reading information from turnstile encoder 190 and controlling turnstile motor 185 in response thereto. Servo controller 175 may alert slave processor 170 once turnstile 40 has reaches a desired position.

Each workpiece cassette turnstile 40 includes a motor for controlling the positioning of saddles 45, 46 connected thereto. The slave processor 170 may control the position of saddles 45, 46 through operation of the appropriate saddle motor 186 to orient workpiece cassettes 16 attached thereto in one of a vertical and horizontal orientation. Incremental saddle encoders 191 are preferably provided within each workpiece cassette turnstile 40 for providing position information of the saddles 45, 46 to the respective slave processor 170.

Either slave processor 170 or servo controller 175 may be configured to control the operation of the workpiece cassette elevator 42 for transferring a workpiece cassette 16 between either the exchange position and the extraction position. The slave processor 170 may be coupled with an elevator lift motor 187 and elevator rotation motor 188 for controlling the elevation and rotation of elevator 42 and elevator support 47. Incremental lift encoder 192 and incremental rotation encoder 193 may supply elevation and rotation information of the elevator 42 and support 47 to slave processor 170.

Absolute encoders 199 may be utilized to notify slave processor of extreme conditions such as when elevator support 47 reaches a maximum height. Elevator lift motor 187 may be shut down in response to the presence of an extreme condition by absolute encoder 199.

Methods

Additional aspects of this invention include novel methods of handling semiconductor workpieces W within a semiconductor workpiece processing tool 10. The method of handling semiconductor workpieces within a processing tool 10 having at least one workpiece processing module 19 and a workpiece conveyor 60 includes a step of receiving a workpiece cassette 16 having a plurality of semiconductor workpieces W therein into the workpiece processing tool 10. The method additionally includes steps of simultaneously moving a first and second workpiece transport unit 62, 64 along the workpiece conveyor 60 to simultaneously transport individual semiconductor workpieces W between the workpiece cassettes 16 and processing modules 19.

The workpiece cassette 16 may be preferably translated or otherwise reoriented between an approximately vertical orientation and an approximately horizontal orientation within the workpiece processing tool 10. Specifically, each workpiece cassette 16 and the semiconductor workpieces W therein are preferably oriented in a vertical position during the step of loading the workpiece cassette 16 into the processing tool 10 or removing a workpiece cassette 16 therefrom. The workpiece cassettes 16 and semiconductor workpieces therein are preferably oriented in a horizontal position during the step of extracting semiconductor workpieces W from the workpiece cassette 16. Further, a plurality of workpiece cassettes 16 may be stored within the processing tool 10 to limit the exposure of the workspace 11 of the processing tool 10 to the surrounding clean room environment.

The methods can also preferably provide for introducing unprocessed semiconductor workpieces into a first interface module 38 for storage. Workpiece transport units 62, 64 may access the unprocessed semiconductor workpieces within a workpiece cassette 16 held by the first interface module 38. Processed semiconductor workpieces are preferably placed into workpiece cassettes 16 held within the output processing module 39 for removal from the processing tool 10.

The present invention additionally provides for a method of handling semiconductor workpieces W within a processing tool 10 having a plurality of workpiece processing modules 19 adjacent opposing sides of a workpiece conveyor 60. The processing modules are preferably along both sides and are accessible by transport units from either side of conveyor 60. In particular, the method comprises the steps of receiving a workpiece cassette 16 into the processing tool 10 and storing the workpiece cassette 16 therein. The semiconductor workpieces may be individually transferred via the workpiece conveyor 60 to selected workpiece processing modules 19.

The method may include a translation step where the semiconductor workpiece cassettes 16 are advantageously positioned in a vertical orientation for stability during the receiving step and in a horizontal orientation during an extraction step to facilitate access to the semiconductor workpieces within a respective workpiece cassette 16. The workpiece transport units 62, 64 may access each workpiece processing module 19 adjacent opposing sides of the workpiece conveyor 60 to transfer the semiconductor workpieces therebetween. Preferably, each workpiece transport unit 62, 64 travels along paths defined by the workpiece conveyor 60.

The method preferably provides for introducing unprocessed semiconductor workpieces into a first interface module 38 for storage and placing processed semiconductor workpieces into workpiece cassettes 16 held within the output processing module 39 for temporary storage and removal from the processing tool 10.

Workpiece Support

Figure 22:
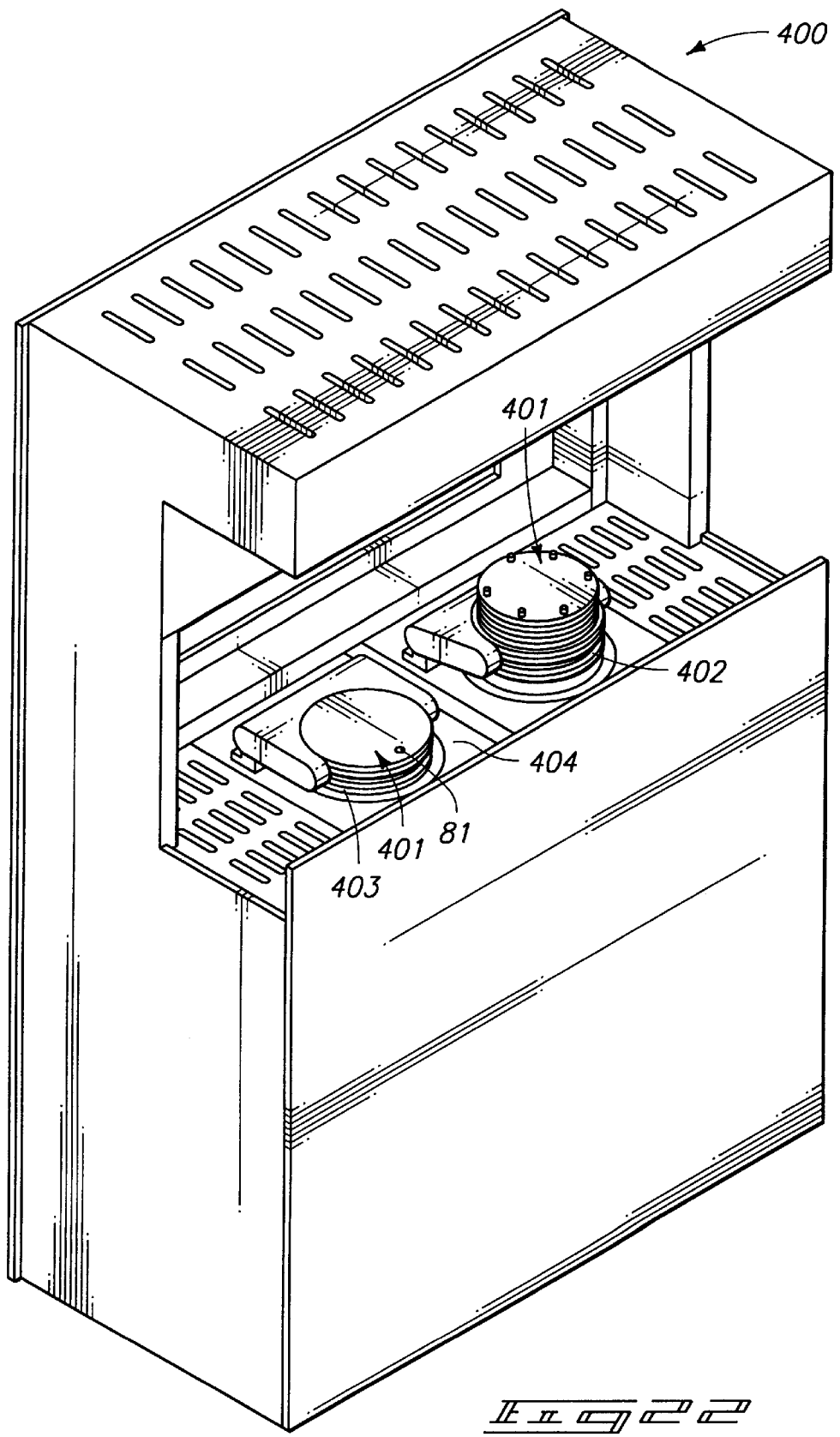
FIG. 22 is an environmental view of the semiconductor processing head of the present invention showing two processing heads in a processing station, one in a deployed, "closed" or "processing" position, and one in an "open" or "receive wafer" position.

Turning now to FIG. 22, a semiconductor processing machine 400 having two workpiece supports 401 is shown. Workpiece support 402 is shown in a "open" or "receive wafer" position in order to receive a workpiece or semiconductor wafer for further processing. Workpiece support 403 is shown in a "closed" or "deployed" position wherein the semiconductor wafer has been received by the workpiece support and is being exposed to the semiconductor manufacturing process in the semiconductor manufacturing chamber 404. FIG. 1 also shows an optional beam emitter 81 for emitting a laser beam detected by robotic wafer conveyors to indicate position of the unit.

Figure 23:
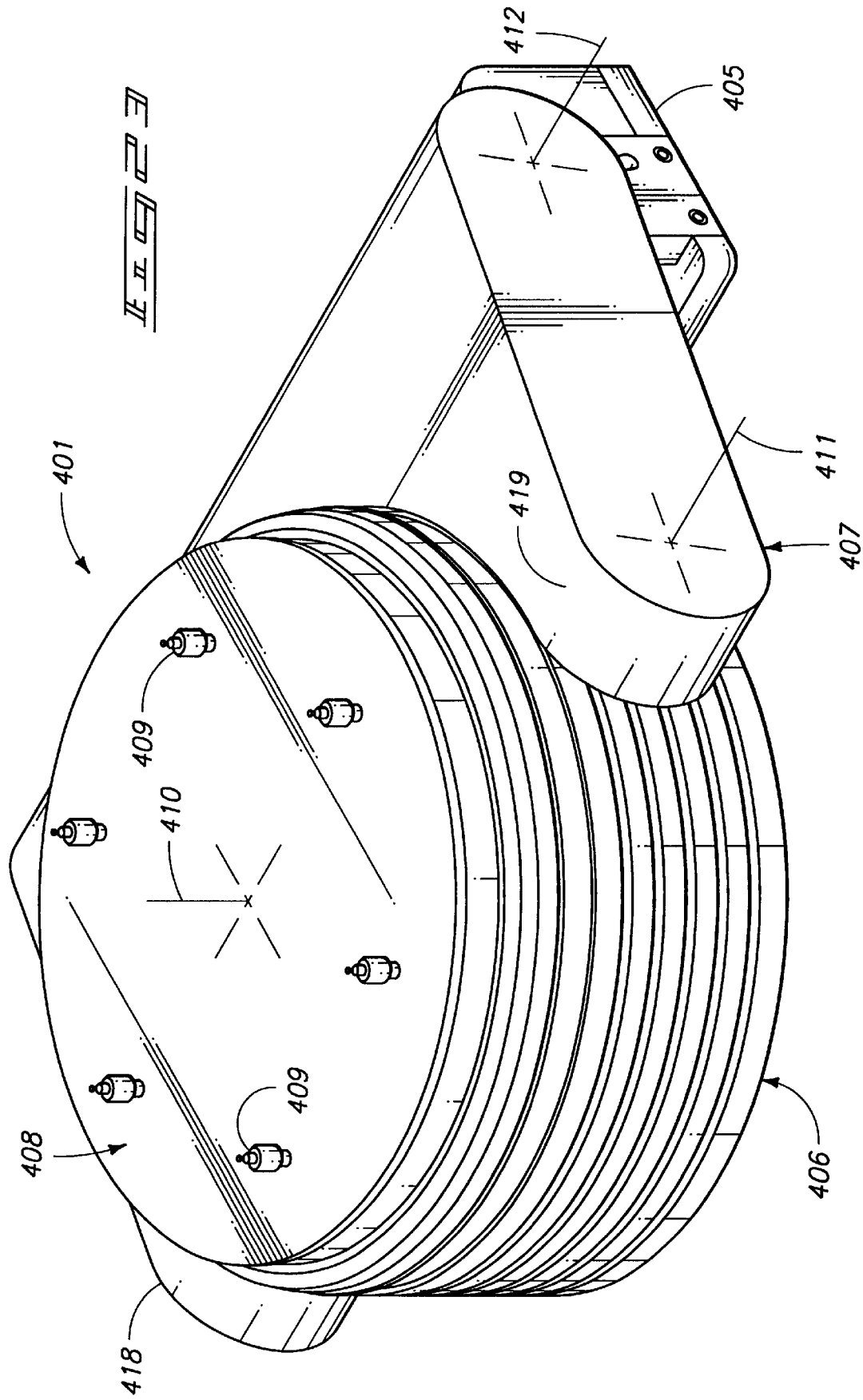
FIG. 23 is an isometric view of the semiconductor processing head of the present invention.

Turning now to FIG. 23, an enlarged view of the workpiece support 401 is shown. Workpiece support 401 advantageously includes operator base 405, a processing head 406, and an operator arm 407. Processing head 406 preferably includes workpiece holder or wafer holder 408 and which further includes fingers 409 for securely holding the workpiece during further process and manufacturing steps. Workpiece holder 408 more preferably spins about workpiece spin axis 410.

The processing head is advantageously rotatable about processing head pivot axis or, more briefly termed, process pivot axis 411. In this manner, a workpiece (not shown) may be disposed between and grasped by the fingers 409, at which point the processing head is preferably rotated about process head pivot axis 411 to place the workpiece in a position to be exposed to the manufacturing process.

In the preferred embodiment, operator arm 407 may be pivoted about operator pivot axis 412. In this manner, the workpiece is advantageously lowered into the process bowl (not shown) to accomplish a step in the manufacture of the semiconductor wafer.

Figure 24:
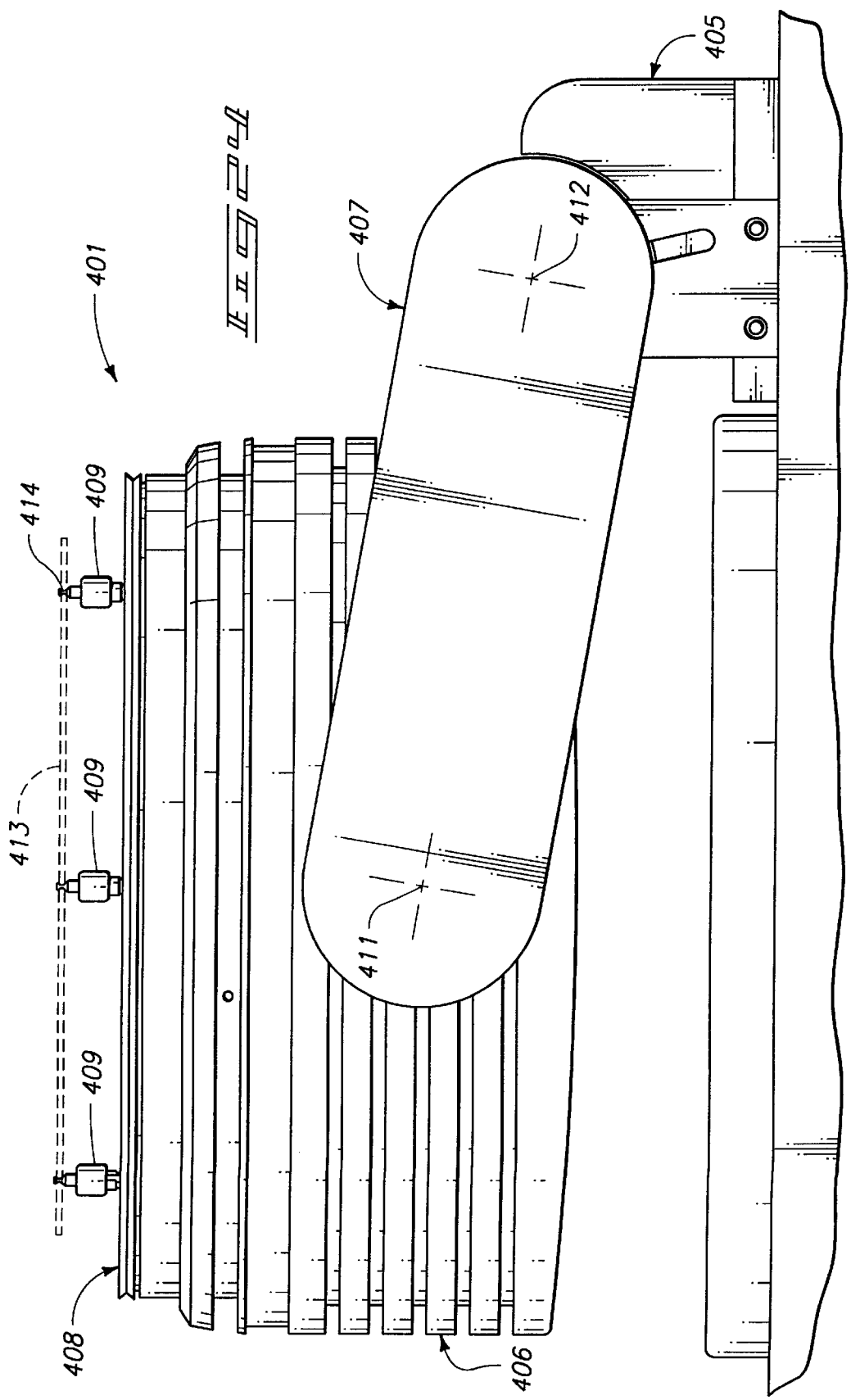
FIG. 24 is a side elevation view of the processing head of the present invention showing the head in a "receive wafer" position.

Turning now to FIGS. 24–26, the sequence of placing a workpiece on the workpiece support and exposing the workpiece to the semiconductor manufacturing process is shown. In FIG. 24, a workpiece W is shown as being held in place by fingertips 414 of fingers 409. Workpiece W is grasped by fingertips 414 after being placed in position by robot or other means.

Once the workpiece W has been securely engaged by fingertips 414, processing head 406 can be rotated about process head pivot axis 411 as shown in FIG. 25. Process head 406 is preferably rotated about axis 411 until workpiece W is at a desired angle, such as approximately horizontal. The operator arm 407 is pivoted about operator arm pivot axis 412 in a manner so as to coordinate the angular position of processing head 406. In the closed position, the processing head is placed against the rim of bowl 416 and the workpiece W is essentially in a horizontal plane. Once the workpiece W has been secured in this position, any of a series of various semiconductor manufacturing process steps may be applied to the workpiece as it is exposed in the processing bowl 417.

Since the processing head 406 is engaged by the operator arm 407 on the left and right side by the preferably horizontal axis 411 connecting the pivot points of processing head 406, a high degree of stability about the horizontal plane is obtained. Further, since the operator arm 407 is likewise connected to the operator base 405 at left and right sides along the essentially horizontal line 412 connecting the pivot points of the operator arm, the workpiece support forms a structure having high rigidity in the horizontal plane parallel to and defined by axes 411 and 412. Finally, since operator base 405 is securely attached to the semiconductor process machine 400, rigidity about the spin axis 410 is also achieved.

Similarly, since processing head 406 is nested within the fork or yoke shaped operator arm 407 having left and right forks 418 and 419, respectively, as shown in FIG. 23, motion due to cantilevering of the processing head is reduced as a result of the reduced moment arm defined by the line connecting pivot axes 411 and 412.

In a typical semiconductor manufacturing process, the workpiece holder 408 will rotate the workpiece, having the process head 406 secured at two points, that is, at the left and right forks 418 and 419, respectively, the vibration induced by the rotation of the workpiece holder 408 will be significantly reduced along the axis 411.

A more complete description of the components of the present invention and their operation and interrelation follows.

Operator Base

Turning now to FIG. 30, operator base 405 is shown. The present invention advantageously includes an operator base 405 which forms an essentially yoke-shaped base having an operator base back portion 420, an operator base left yoke arm 421, and an operator base right yoke arm 422. Yoke arms 421 and 422 are securely connected to the base of the yoke 420. In the preferred embodiment, the yoke arms are secured to the yoke base by the yoke arm fasteners 423. The yoke arm base in turn is advantageously connected to the semiconductor process machine 400 as shown in FIG. 22.

The upper portions of the yoke arm advantageously include receptacles for housing the operator arm bearings 424 which are used to support the pivot shafts of the operator arm 425, described more fully below.

Operator Arm

Still viewing FIG. 30, the present invention advantageously includes an operator arm 407. As described previously, operator arm 407 preferably pivots about the operator arm pivot axis 412 which connects the center line defined by the centers of operator arm pivot bearings 424.

Operator arm or pivot arm 407 is advantageously constructed in such a manner to reduce mass cantilevered about operator arm pivot axis 412. This allows for quicker and more accurate positioning of the pivot arm as it is moved about pivot arm axis 412.

The left fork of the pivot arm 418, shown more clearly in FIG. 32, houses the mechanism for causing the pivot arm to lift or rotate about pivot arm pivot axis 412. Pivot arm right fork 419, shown more clearly in FIG. 31, houses the mechanism for causing the processing head 406 (not shown) to rotate about the process head pivot axis 411.

The process arm rear cavity 426, shown in FIG. 30, houses the lift motor 452 for causing the operator arm 407 to rotate about pivot arm axis 412. Process arm rear cavity 426 also houses rotate motor 428 which is used to cause the processing head 406 to rotate about the processing head pivot axis 411. The rotate motor 428 may more generally be described as a processing head pivot or rotate drive. Processing head 406 is mounted to operator arm 407 at processing head left pivot shaft 429 and processing head right pivot shaft 430.

Operator arm 407 is securely attached to left yoke arm 421 and right yoke arm 422 by operator arm pivot shafts 425 and operator arm pivot bearings 424, the right of which such bearing shaft and bearings are shown in FIG. 30.

Operator Arm-Processing Head Rotate Mechanism

Turning now to FIG. 34, a sectional plan view of the right rear corner of operator arm 407 is shown. The right rear section of operator arm 407 advantageously contains the rotate mechanism which is used to rotate processing head 406 about processing head pivot shafts 430 and 429. Processing head rotate mechanism 431 preferably consists of rotate motor 428 which drives rotate shaft 432, more generally described as a processing head drive shaft. Rotate shaft 432 is inserted within rotate pulley 425 which also functions as the operator arm pivot shaft. As described previously, the operator arm pivot shaft/lift pulley is supported in operator arm pivot bearings 424, which are themselves supported in operator base yoke arm 422. Rotate shaft 432 is secured within left pulley 424 by securing collar 433. Securing collar 433 secures rotate pulley 425 to rotate shaft 432 in a secure manner so as to assure a positive connection between rotate motor 428 and rotate pulley 425. An inner cover 584 is also provided.

Rotate motor 428 is disposed within process arm rear cavity 426 and is supported by rotate motor support 434. Rotate motor 428 preferably is a servo allowing for accurate control of speed and acceleration of the motor. Servo motor 428 is advantageously connected to rotate encoder 435 which is positioned on one end of rotate motor 428. Rotate encoder 435, more generally described as a processing head encoder, allows for accurate measurement of the number of rotations of rotate motor 428, as well as the position, speed, and acceleration of the rotate shaft 432. The information from the rotate encoder may be used in a rotate circuit which may then be used to control the rotate motor when the rotate motor is a servo. This information is useful in obtaining the position and rate of travel of the processing head, as well as controlling the final end point positions of the processing head as it is rotated about process head rotate axis 411.

The relationship between the rotate motor rotations, as measured by rotate encoder 435, may easily be determined once the diameters of the rotate pulley 425 and the processing head pulley 438 are known. These diameters can be used to determine the ratio of rotate motor relations to processing head rotations. This may be accomplished by a microprocessor, as well as other means.

Rotate pulley 425 is further supported within operator arm 407 by rotate pulley inboard bearing 436 which is disposed about an extended flange on the rotate pulley 425. Rotate pulley inboard bearing 436 is secured by the body of the operator arm 407, as shown in FIG. 34.

Rotate pulley 425 advantageously drives rotate belt 437, more generally described as a flexible power transmission coupling. Referring now to FIG. 31, rotate belt 437 is shown in the side view of the right arm 419 of the operator arm 407. Rotate belt 437 is preferably a toothed timing belt to ensure positive engagement with the processing head drive wheel, more particularly described herein as the processing is head pulley 438, (not shown in this view). In order to accommodate the toothed timing belt 437, both the rotate pulley 425 and the processing head pulley 438 are advantageously provided with gear teeth to match the tooth pattern of the timing belt to assure positive engagement of the pulleys with the rotate belt.

Rotate mechanism 431 is preferably provided with rotate belt tensioner 439, useful for adjusting the belt to take up slack as the belt may stretch during use, and to allow for adjustment of the belt to assure positive engagement with both the rotate pulley and the processing head pulley. Rotate belt tensioner 439 adjusts the tension of rotate belt 437 by increasing the length of the belt path between rotate pulley 425 and processing head pulley 438, thereby accommodating any excess length in the belt. Inversely, the length of the belt path may also be shortened by adjusting rotate belt tensioner 439 so as to create a more linear path in the upper portion of rotate belt 437. The tensioner 439 is adjusted by rotating it about tensioner hub 468 and securing it in a new position.

Turning now to FIG. 34, processing head pulley 438 is mounted to processing head rotate shaft 430 in a secured manner so that rotation of processing head pulley 438 will cause processing head rotate shaft 430 to rotate. Processing head shaft 430 is mounted to operator arm right fork 419 by processing head shaft bearing 440, which in turn is secured in the frame of the right fork 419 by processing head rotate bearing 469. In a like manner, processing head shaft 429 is mounted in operator arm left fork 418 by processing head shaft bearing 441, as shown in FIG. 30.

Processing head pivot shafts 430 and 429 are advantageously hollow shafts. This feature is useful in allowing electrical, optical, pneumatic, and other signal and supply services to be provided to the processing head. Service lines such as those just described which are routed through the hollow portions of processing head pivot shafts 429 and 430 are held in place in the operator arms by cable brackets 442 and 443. Cable brackets 442 and 443 serve a dual purpose. First, routing the service lines away from operating components within the operator arm left and right forks. Second, cable brackets 442 and 443 serve a useful function in isolating forces imparted to the service cables by the rotating action of processing head 406 as it rotates about processing head pivot shafts 429 and 430. This rotating of the processing head 406 has the consequence that the service cables are twisted within the pivot shafts as a result of the rotation, thereby imparting forces to the cables. These forces are preferably isolated to a particular area so as to minimize the effects of the forces on the cables. The cable brackets 442 and 443 achieve this isolating effect.

The process head rotate mechanism 431, shown in FIG. 34, is also advantageously provided with a rotate overtravel protect 444, which functions as a rotate switch. Rotate overtravel protect 444 preferably acts as a secondary system to the rotate encoder 435 should the control system fail for some reason to stop servo 428 in accordance with a predetermined position, as would be established by rotate encoder 435. Turning to FIG. 34, the rotate overtravel protect 444 is shown in plan view. The rotate overtravel protect preferably consists of rotate optical switches 445 and 446, which are configured to correspond to the extreme (beginning and end point) portions of the processing head, as well as the primary switch component which preferably is a rotate flag 447. Rotate flag 447 is securely attached to processing head pulley 438 such that when processing head shaft 430 (and consequently processing head 406) are rotated by virtue of drive forces imparted to the processing head pulley 425 by the rotate belt 437, the rotate flag 447 will rotate thereby tracking the rotate motion of processing head 406. Rotate optical switches 445 and 446 are positioned such that rotate flag 447 may pass within the optical path generated by each optical switch, thereby generating a switch signal. The switch signal is used to control an event such as stopping rotate motor 428. Rotate optical switch 445 will guard against overtravel of processing head 406 in one direction, while rotate optical switch 446 will provide against overtravel of the processing head 406 in the opposite direction.

Operator Arm-Lift Mechanism

Operator arm 407 is also advantageously provided with an operator arm lift mechanism 448 which is useful for causing the operator arm to lift, that is, to pivot or rotate about operator arm pivot axis 412. Turning to FIG. 35, the operator arm lift mechanism 448 is shown in the sectional plan view of the right rear corner of operator arm 407.

Operator arm lift mechanism 448 is advantageously driven by lift motor 452. Lift motor 452 may be more generally described as an operator arm drive or operator arm pivot drive. Lift motor 452 is preferably a servo motor and is more preferably provided with an operator encoder, more specifically described as lift motor encoder 456. When lift motor 452 is a servo motor coupled with lift encoder 456, information regarding the speed and absolute rotational position of the lift motor shaft 454 may be known from the lift encoder signal. Additionally, by virtue of being a servo mechanism, the angular speed and acceleration of lift motor 452 may be easily controlled by use of the lift signal by an electrical circuit. Such a lift circuit may be configured to generate desired lift characteristics (speed, angle, acceleration, etc.). FIG. 14 shows that the lift operator may also include a brake 455 which is used to safely stop the arm if power fails.

Lift motor 452 drives lift motor shaft 454 which in turn drives lift gear drive 453. Lift gear drive 453 is a gear reduction drive to produce a reduced number of revolutions at lift drive shaft 456 as the function of input revolutions from lift motor shaft 454.

Lift drive gear shaft 456 is secured to lift anchor 451 which is more clearly shown in FIG. 32. Lift anchor 451 is preferably shaped to have at least one flat side for positively engaging lift bushing 449. Lift anchor 451 is secured to lift drive shaft 456 by anchor plate 458 and anchor fasteners 457. In this manner, when lift drive shaft 456 is rotated, it will positively engage lift bushing 449. Returning to FIG. 35, it is seen that lift bushing 449 is mounted in operator left yoke arm 421, and is thus fixed with respect to operator base 405. Lift bearing 450 is disposed about the lift bushing shank and is supported in operator arm 407 by lift bearing support 460 which is a bushing configured to receive lift bearing 450 on a first end and to support lift gear drive 453 on a second end. Lift bearing support 460 is further supported within operator arm 407 by operator arm frame 461. The lift arm is thus free to pivot about lift bushing 449 by virtue of lift bearing 450.

In operation, as lift motor 452 causes lift gear drive 453 to produce rotations at gear drive shaft 456, lift anchor 451 is forced against lift bushing 449 which is securely positioned within right operator yoke arm 421. The reactive force against the lift anchor 451 will cause lift bearing support 460 to rotate relative to lift bushing 449. Since lift bushing 449 is fixed in operator base 405, and since operator base 405 is fixed to processing machine 400, rotation of lift bearing support 460 will cause lift arm 407 to pivot about operator arm pivot axis 412, thereby moving the processing head 406. It is advantageous to consider the gear drive shaft (or "operator arm shaft") as being fixed with respect to operator base 405 when envisioning the operation of the lift mechanism.

Operator lift mechanism 448 is also advantageously provided with a lift overtravel protect 462 or lift switch. The lift rotate protect operates in a manner similar to that described for the rotate overtravel protect 444 described above. Turning now to FIG. 32, a left side view of the operator arm 407 is shown which shows the lift overtravel protect in detail.

The lift overtravel protect preferably includes a lift optical switch low 463 and a lift optical switch high 464. Other types of limit switches can also be used. The switch high 464 and switch low 463 correspond to beginning and endpoint travel of lift arm 407. The primary lift switch component is lift flag 465, which is firmly attached to left operator base yoke arm 421. The lift optical switches are preferably mounted to the movable operator arm 407. As operator arm 407 travels in an upward direction in pivoting about operator arm pivot axis 412, lift optical switch high 464 will approach the lift flag 465. Should the lift motor encoder 455 fail to stop the lift motor 454 as desired, the lift flag 465 will break the optical path of the lift optical switch high 464 thus producing a signal which can be used to stop the lift motor. In like manner, when the operator arm 407 is being lowered by rotating it in a clockwise direction about the operator arm pivot axis 412, as shown in FIG. 32, overtravel of operator arm 407 will cause lift optical switch low 463 to have its optical path interrupted by lift flag 465, thus producing a signal which may be used to stop lift motor 452. As is shown in FIG. 32, lift flag 465 is mounted to left operator base yoke arm 421 with slotted lift flag mounting slots 467 and removable lift flag fasteners 466. Such an arrangement allows for the lift flag to be adjusted so that the lift overtravel protect system only becomes active after the lift arm 407 has traveled beyond a preferred point.

Processing Head

Figures 27, 28, 29:
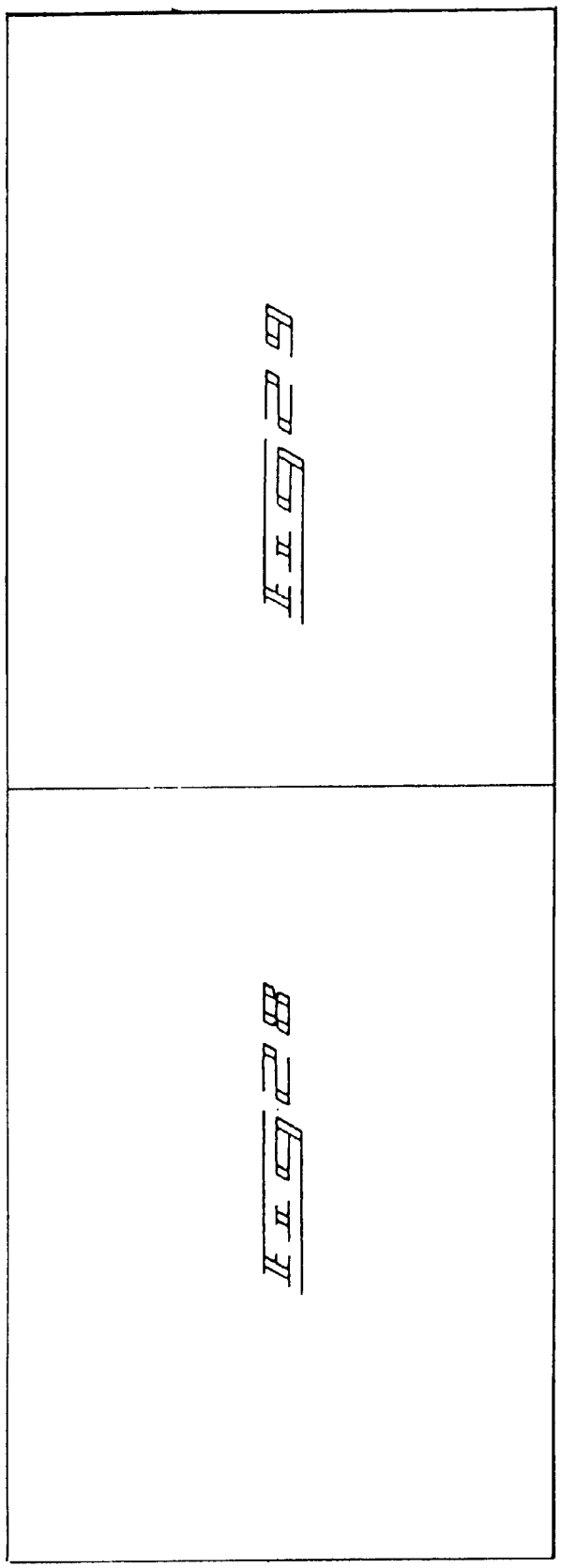
FIG. 27 is a schematic front elevation view of the processing head indicating the portions detailed in FIGS. 28 and 29.
FIG. 28 is a front elevation sectional view of the left half of the processing head of the apparatus of the present invention also showing a first embodiment of the wafer holding fingers.
FIG. 29 is a front elevation sectional view of the left half of the processing head of the apparatus of the present invention also showing a first embodiment of the wafer holding fingers.
Figure 29:
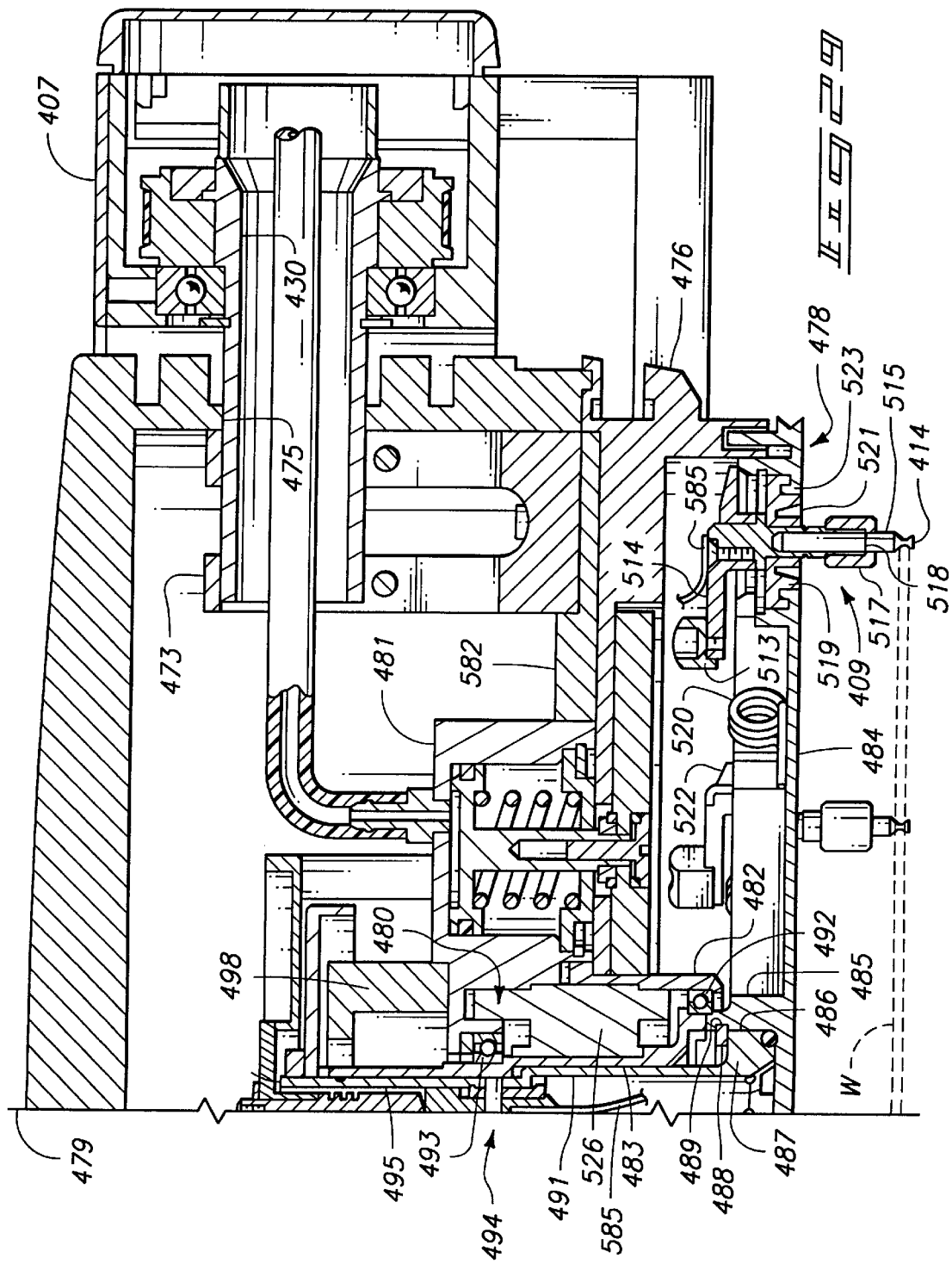

Turning now to FIG. 27, a front elevation schematic view of the processing head 406 is shown. Processing head 406 is described in more detail in FIGS. 28 and 29. Turning now to FIG. 28, a sectional view of the left front side of processing head 406 is shown. Processing head 406 advantageously includes a processing head housing 470 and frame 582. Processing head 406 is preferably round in shape in plan view allowing it to easily pivot about process head pivot axis 411 with no interference from operator arm 407, as demonstrated in FIGS. 24–26. Returning to FIG. 28, processing head housing 470 more preferably has circumferential grooves 471 which are formed into the side of process head housing 470. Circumferential grooves 471 have a functional benefit of increasing heat dissipation from processing head 406.

The sides of processing head housing 470 are advantageously provided with rotate shaft openings 474 and 475 for receiving respectively left and right processing head pivot shafts 429 and 430. Processing head pivot shafts 429 and 430 are secured to the processing head 406 by respective left and right processing head mounts 472 and 473. Processing head mounts 472 and 473 are affirmative connected to processing head frame 582 which also supports processing head door 476 which is itself securely fastened to processing head housing 470. Consequently, processing head pivot shafts 429 and 430 are fixed with respect to processing head 407 and may therefore rotate or pivot with respect to operator arm 407. The details of how processing head pivot shafts 429 and 430 are received within operator arm 407 were discussed supra.

Processing head housing 470 forms a processing head void 477 which is used to house additional processing head components such as the spin motor, the pneumatic finger actuators, and service lines, all discussed more fully below.

The processing head also advantageously includes a workpiece holder and fingers for holding a workpiece, as is also more fully described below.

Processing Head Spin Motor

In a large number of semiconductor manufacturing processes, is desirable to spin the semiconductor wafer or workpiece during the process, for example to assure even distribution of applied process fluids across the face of the semiconductor wafer, or to aid drying of the wafer after a wet chemistry process. It is therefore desirable to be able to rotate the semiconductor workpiece while it is held by the processing head.

The semiconductor workpiece is held during the process by workpiece holder 478 described more fully below. In order to spin workpiece holder 478 relative to processing head 406 about spin axis 479, an electric, pneumatic, or other type of spin motor or workpiece spin drive is advantageously provided.

Turning to FIG. 29, spin motor 480 has armatures 526 which drive spin motor shaft 483 in rotational movement to spin workpiece holder 478. Spin motor 480 is supported by bottom motor bearing 492 in bottom motor housing 482. Bottom motor housing 482 is secured to processing head 406 by door 476. Spin motor 480 is thus free to rotate relative to processing head housing 470 and door 476. Spin motor 480 is preferably additionally held in place by top motor housing 481 which rests on processing head door 476. Spin motor 480 is rotationally isolated from top motor housing 481 by top motor bearing 493, which is disposed between the spin motor shaft 483 and top motor housing 481.

The spin motor is preferably an electric motor which is provided with an electrical supply source through pivot shaft 429 and/or 430. Spin motor 480 will drive spin motor shaft 483 about spin axis 479.

To secure workpiece holder rotor 484 to spin motor shaft 483, workpiece holder rotor 484 is preferably provided with a rotor hub 485. Rotor hub 485 defines a rotor hub recess 486 which receives a flared end of workpiece holder shaft 491. The flared end 487 of workpiece holder shaft 491 is secured within the rotor hub recess 486 by workpiece shaft snap-ring 488 which fits within rotor recess groove 489 above the flared portion 487 of workpiece holder shaft 491.

The workpiece holder shaft 491 is fitted inside of spin motor shaft 483 and protrudes from the top of the spin motor shaft. The top of workpiece holder shaft 491 is threaded to receive thin nut 527 (see FIG. 28). Thin nut 527 is tightened against optical tachometer 499 (describe more fully below). Optical tachometer 499 is securely attached to spin motor shaft 483 such that as the spin motor 480 rotationally drives the spin motor shaft 483, the workpiece holder shaft 491 is also driven.

Workpiece holders may be easily changed out to accommodate various configurations which may be required for the various processes encountered in manufacturing of the semiconductors. This is accomplished by removing spin encoder 498 (described below), and then thin nut 527. Once the thin nut has been removed the workpiece holder 478 will drop away from the processing head 406.

The processing head is also advantageously provided with a spin encoder 498, more generally described as a workpiece holder encoder, and an optical tachometer 499. As shown in FIG. 28, spin encoder 498 is mounted to top motor housing 481 by encoder support 528 so as to remain stationary with respect to the processing head 406. Optical tachometer 499 is mounted on spin motor shaft 483 so as to rotate with the motor 480. When operated in conjunction, the spin encoder 498 and optical tachometer 499 allow the speed, acceleration, and precise rotational position of the spin motor shaft (and therefore the workpiece holder 478) to be known. In this manner, and when spin motor 480 is provided as a servo motor, a high degree of control over the spin rate, acceleration, and rotational angular position of the workpiece with respect to the process head 407 may be obtained.

In one application of the present invention the workpiece support is used to support a semiconductor workpiece in an electroplating process. To accomplish the electroplating an electric current is provided to the workpiece through an alternate embodiment of the fingers (described more fully below). To provide electric current to the finger, conductive wires are run from the tops of the fingers inside of the workpiece holder 478 through the electrode wire holes 525 in the flared lower part of workpiece holder shaft 491. The electrode wires are provided electric current from electrical lines run through processing pivot shaft 429 and/or 430.

The electrical line run through pivot shaft 430/429 will by nature be stationary with respect to processing head housing 470. However, since the workpiece holder rotor is intended to be capable of rotation during the electroplating process, the wires passing into workpiece support shaft 491 through electrode wire holes 525 may rotate with respect to processing head housing 470. Since the rotating electrode wires within workpiece shaft 491 and the stationary electrical supply lines run through pivot shaft 430/429 must be in electrical communication, the rotational/stationary problem must be overcome. In the preferred embodiment, this is accomplished by use of electrical slip ring 494.

Electrical slip ring 494, shown in FIG. 28, has a lower wire junction 529 for receiving the conductive ends of the electrical wires passing into workpiece holder shaft 491 by electrode wire holes 525. Lower wire junction 529 is held in place within workpiece holder shaft 491 by insulating cylindrical collar 497 and thus rotates with spin motor shaft 483. The electrode wires terminate in a single electrical contact 531 at the top of the lower wire junction 529. Electrical slip ring 494 further has a contact pad 530 which is suspended within the top of workpiece holder shaft 491. Contact pad 530 is mechanically fastened to spin encoder 498, which, as described previously, remains stationary with respect to processing head housing 470. The stationary-to-rotational transition is made at the tip of contact pad 530, which is in contact with the rotating electrical contact 531. Contact pad 530 is electrically conductive and is in electrical communication with electrical contact 531. In the preferred embodiment, contact pad 530 is made of copper-beryllium. A wire 585 carries current to finger assemblies when current supply is needed, such as on the alternative embodiment described below.

Processing Head Finger Actuators

Workpiece holder 478, described more fully below, advantageously includes fingers for holding the workpiece W in the workpiece holder, as shown in FIGS. 28 and 29. Since the workpiece holder 478 may be removed as described above, it is possible to replace one style of workpiece holder with another. Since a variety of workpiece holders with a variety of fingers for holding the workpiece is possible, it is desirable to have a finger actuator mechanism disposed within processing head 407 which is compatible with any given finger arrangement. The invention is therefore advantageously provided with a finger actuator mechanism.

Turning to FIG. 28, a finger actuator mechanism 500 is shown. Finger actuator mechanism 500 is preferably a pneumatically operated mechanism. A pneumatic cylinder is formed by a cavity 501 within top motor housing 481. Pneumatic piston 502 is disposed within cavity 501. Pneumatic piston 502 is biased in an upward position within cavity 501 by actuator spring 505. Actuator spring 505 is confined within cavity 501 by cavity end cap 507, which is itself constrained by retaining ring 508. Pneumatic fluid is provided to the top of pneumatic piston 502 via pneumatic inlet 503. Pneumatic fluid is provided to pneumatic inlet 503 by pneumatic supply line 504 which is routed through processing head pivot shaft 429 and hence through the left fork 418 of the operator arm 407. Turning to FIG. 29, it can be seen that a second pneumatic cylinder which is identical to the pneumatic cylinder just described is also provided.

Pneumatic piston 502 is attached to actuator plate 509 by actuator plate connect screw 510. Wave springs 529 provide flexibility to the connecting at screws 510. Actuator plate 509 is preferably an annular plate concentric with the spin motor 580 and disposed about the bottom motor housing 482, and is symmetrical about spin axis 479. Actuator plate 509 is secured against pneumatic piston 502 by bushing 512 which is disposed in pneumatic piston recess 511 about pneumatic piston 502. Bushing 512 acts as a support for wave springs 529 to allow a slight tilting of the actuator plate 509. Such an arrangement is beneficial for providing equal action against the finger actuator contracts 513 about the entire actuator plate or ring 509.

When pneumatic fluid is provided to the space above the pneumatic piston 502, the pneumatic piston 502 travels in a downward direction compressing actuator spring 505. As pneumatic piston 502 travels downward, actuator plate 509 is likewise pushed downward by flexible bushing 512. Actuator plate 509 will contact finger actuator contacts 513 causing the fingers to operate as more fully described below.

Actuator seals 506 are provided to prevent pneumatic gas from bypassing the top of the pneumatic piston 502 and entering the area occupied by actuator spring 505.

Processing Head Workpiece Holder

Workpiece holder 478 is used to hold the workpiece W, which is typically a semiconductor wafer, in position during the semiconductor manufacturing process.

Turning now to FIG. 29, a finger 409 is shown in cross section. Finger 409 advantageously includes a finger actuator contact 513 which is contacted by actuator plate 509, as described above. Finger actuator contact 513 is connected to finger actuator lever 514 (more generally, "finger extension") which is cantilevered from and connected to the finger stem 515. Finger stem 515 is inserted into finger actuator lever 514. Disposed about the portion of the finger actuator lever which encompasses and secures finger stem 515 is finger diaphragm 519. Finger diaphragm 519 is preferably made of a flexible material such as Tetrafluoroethylene, also known as Teflon® (registered trademark of E. I. DuPont de Nemours Company). Finger 409 is mounted to workpiece holder rotor 484 using finger diaphragm 519. Finger diaphragm 519 is inserted into the finger opening 521 in rotor 484. The finger diaphragm 519 is inserted into the rotor from the side opposite that to which the workpiece will be presented. Finger diaphragm 519 is secured to rotor 484 against rotor diaphragm lip 523. Forces are intentionally imparted as a result of contact between the actuator plate 509 and the finger actuator contact 513 when the finger actuator mechanism 500 is actuated.

Finger actuator lever 514 is advantageously biased in a horizontal position by finger spring 520 which acts on finger actuator tab 522 which in turn is connected to finger actuator lever 514. Finger spring 520 is preferably a torsion spring secured to the workpiece holder rotor 484.

Finger stem 515 is also preferably provided with finger collar or nut 517 which holds the finger stem 515 against shoulder 518. Finger collar 517 threads or otherwise securely fits over the lower end of finger actuator lever 514. Below the finger collar 517, finger stem 515 extends for a short distance and terminates in fingertip 414. Fingertip 414 contains a slight groove or notch which is beneficially shaped to receive the edge of the workpiece W.

In actuation, finger actuator plate 509 is pushed downward by finger actuator mechanism 500. Finger actuator plate 509 continues its downward travel contacting finger actuator contacts 513. As actuator plate 509 continues its downward travel, finger actuator contacts are pushed in a downward direction. As a result of the downward direction, the finger actuator levers 514 are caused to pivot.

In the preferred embodiment, a plurality of fingers are used to hold the workpiece. In one example, six fingers were used. Once the actuator plate 509 has traveled its full extent, the finger stems 515 will be tilted away from the spin axis 479. The circumference described by the fingertips in this spread-apart position should be greater than the circumference of the workpiece W. Once a workpiece W has been positioned proximate to the fingertips, the pneumatic pressure is relieved on the finger actuator and the actuator spring 505 causes the pneumatic piston 502 to return to the top of the cavity 501. In so doing, the actuator plate 509 is retracted and the finger actuator levers are returned to their initial position by virtue of finger springs 520.

Semiconductor Workpiece Holder—Electroplating Embodiment

FIG. 36 is a side elevational view of a semiconductor workpiece holder 810 constructed according to a preferred aspect of the invention.

Workpiece holder 810 is used for processing a semiconductor workpiece such as a semiconductor wafer shown in phantom at W. One preferred type of processing undertaken with workpiece holder 810 is a workpiece electroplating process in which a semiconductor workpiece held by workpiece holder 810 and an electrical potential is applied to the workpiece to enable plating material to be plated thereon. Such can be, and preferably is accomplished utilizing a processing enclosure or chamber which includes a bottom half or bowl 811 shown in phantom lines in FIG. 1. Bottom half 811 together with workpiece holder 810 forms a sealed, protected chamber for semiconductor workpiece processing. Accordingly, preferred reactants can be introduced into the chamber for further processing. Another preferred aspect of workpiece holder 810 is that such moves, rotates or otherwise spins the held workpiece during processing as will be described in more detail below.

Processing Head and Processing Head Operator

Turning now to FIG. 36, semiconductor workpiece holder 810 includes a workpiece support 812. Workpiece support 812 advantageously supports a workpiece during processing. Workpiece support 812 includes a processing head or spin head assembly 814. Workpiece support 812 also includes a head operator or lift/rotate assembly 816. Spin head assembly 814 is operatively coupled with lift/rotate assembly 816. Spin head assembly 814 advantageously enables a held workpiece to be spun or moved about a defined axis during processing. Such enhances conformal coverage of the preferred plating material over the held workpiece. Lift/rotate assembly 816 advantageously lifts spin head assembly 814 out of engagement with the bottom half 811 of the enclosure in which the preferred processing takes place. Such lifting is preferably about an axis $x_1$. Once so lifted, lift/rotate assembly 816 also rotates the spin head and held workpiece about an axis $x_2$ so that the workpiece can be presented face-up and easily removed from workpiece support 812. In the illustrated and preferred embodiment, such rotation is about 180° from the disposition shown in FIG. 36. Advantageously, a new workpiece can be fixed or otherwise attached to the workpiece holder for further processing as described in detail below.

The workpiece can be removed from or fixed to workpiece holder 810 automatically by means of a robotically controlled arm. Alternatively, the workpiece can be manually removed from or fixed to workpiece holder 810. Additionally, more than one workpiece holder can be provided to support processing of multiple semiconductor workpieces. Other means of removing and fixing a semiconductor workpiece are possible.

FIG. 37 is a front sectional view of the FIG. 36 semiconductor workpiece holder. As shown, workpiece support 812 includes a motor 818 which is operatively coupled with a rotor 820. Rotor 820 is advantageously mounted for rotation about a rotor spin axis 822 and serves as a staging platform upon which at least one finger assembly 824 is mounted. Preferably, more than one finger assembly is mounted on rotor 820, and even more preferably, four or more such finger assemblies are mounted thereon and described in detail below although only two are shown in FIG. 37. The preferred finger assemblies are instrumental in fixing or otherwise holding a semiconductor workpiece on semiconductor workpiece holder 810. Each finger assembly is advantageously operatively connected or associated with a actuator 825. The actuator is preferably a pneumatic linkage which serves to assist in moving the finger assemblies between a disengaged position in which a workpiece may be removed from or added to the workpiece holding, and an engaged position in which the workpiece is fixed upon the workpiece holder for processing. Such is described in more detail below.

Figure 38:
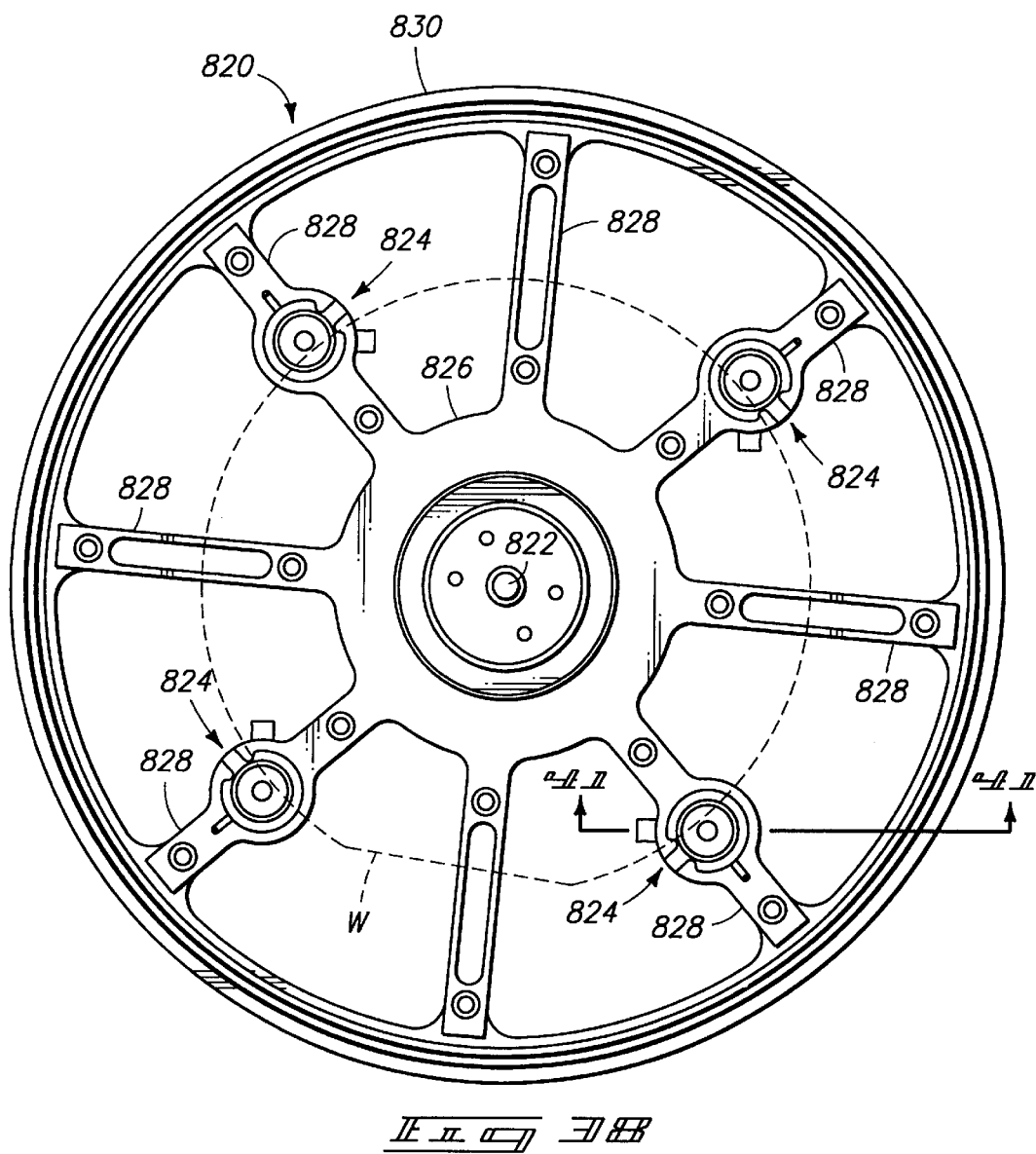
FIG. 38 is a top plan view of a rotor which is constructed in accordance with a preferred aspect of this invention, and which is taken along line 3—3 in FIG. 37.

FIG. 38 is a top or plan view of rotor 820 which is effectively taken along line 3—3 in FIG. 37. FIG. 37 shows the preferred four finger assemblies 824. As shown, rotor 820 is generally circular and resembles from the top a spoked wheel with a nearly continuous bottom surface. Rotor 820 includes a rotor center piece 826 at the center of which lies rotor axis 822. A plurality of struts or spokes 828 are joined or connected to rotor center 826 and extend outwardly to join with and support a rotor perimeter piece 830. Advantageously, four of spokes 828 support respective preferred finger assemblies 824. Finger assemblies 824 are advantageously positioned to engage a semiconductor workpiece, such as a wafer W which is shown in phantom lines in the position such would occupy during processing. When a workpiece is so engaged, it is fixedly held in place relative to the rotor so that processing can be effected. Such processing can include exposing the workpiece to processing conditions which are effective to form a layer of material on one or more surfaces or potions of a wafer or other workpiece. Such processing can also include moving the workpiece within a processing environment to enhance or improve conformal coverage of a layering material. Such processing can, and preferably does include exposing the workpiece to processing conditions which are effective to form an electroplated layer on or over the workpiece.

Finger Assembly

Figure 40:
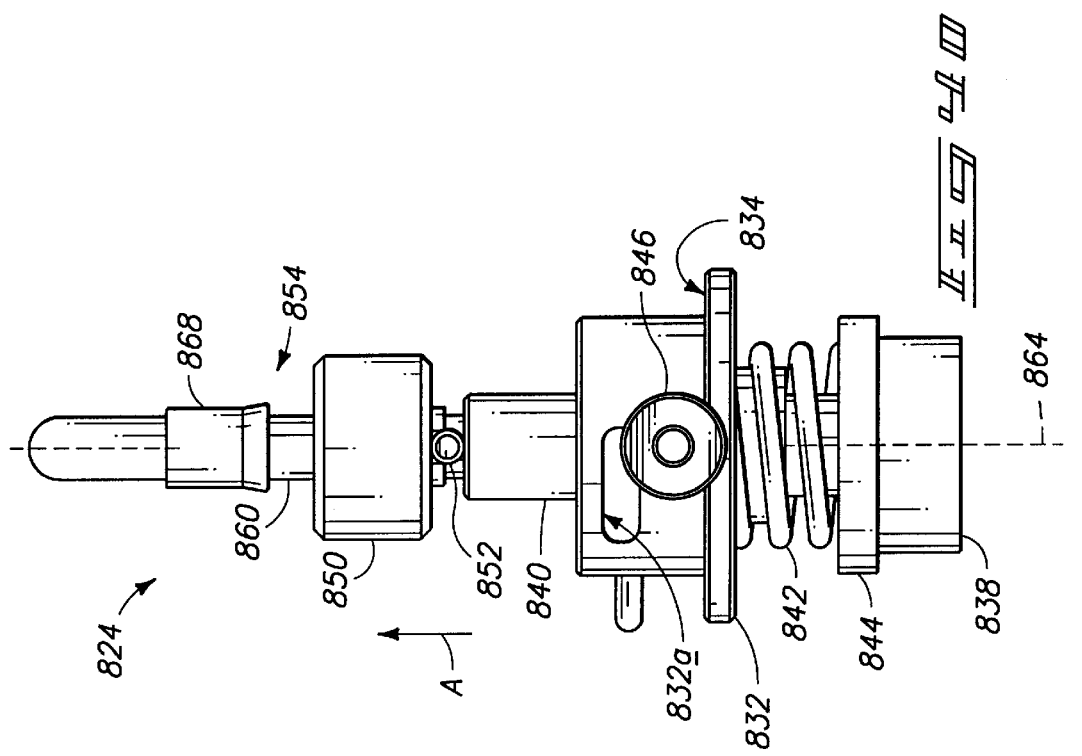
FIG. 40 is a side elevational view of the finger assembly of FIG. 39.
Figure 39:
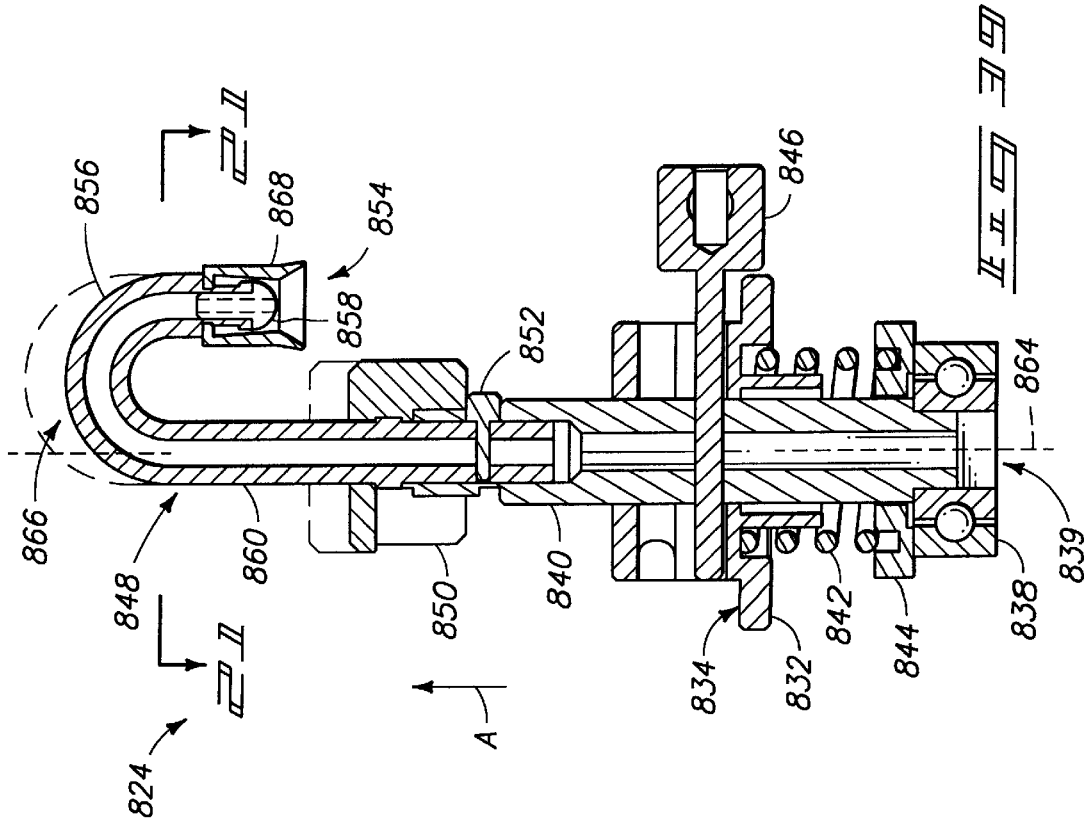
FIG. 39 is an isolated side sectional view of a finger assembly constructed in accordance with a preferred aspect of the invention and which is configured for mounting upon the FIG. 38 rotor.

Referring now to FIGS. 39–41, various views of a preferred finger assembly are shown. The preferred individual finger assemblies are constructed in accordance with the description below. FIG. 39 is an isolated side sectional view of a finger assembly constructed in accordance with a preferred aspect of the invention. FIG. 40 is a side elevational view of the finger assembly turned 90° from the view of FIG. 39. FIG. 41 is a fragmentary cross-sectional enlarged view of a finger assembly and associated rotor structure. The finger assembly as set forth in FIGS. 39 and 40 is shown in the relative position such as it would occupy when processing head or spin head assembly 814 (FIGS. 36 and 37) is moved or rotated by head operator or lift/rotate assembly 816 into a position for receiving a semiconductor workpiece. The finger assembly is shown in FIGS. 39 and 41 in an orientation of about 180° from the position shown in FIG. 41. This typically varies because spin head assembly 814 is rotated 180° from the position shown in FIGS. 36 and 37 in order to receive a semiconductor workpiece. Accordingly, finger assemblies 824 would be so rotated. Lesser degrees of rotation are possible.

Finger assembly 824 includes a finger assembly frame 832. Preferably, finger assembly frame 832 is provided in the form of a sealed contact sleeve which includes an angled slot 832a, only a portion of which is shown in FIG. 40. Angled slot 832a advantageously enables the finger assembly to be moved, preferably pneumatically, both longitudinally and rotationally as will be explained below. Such preferred movement enables a semiconductor workpiece to be engaged, electrically contacted, and processed in accordance with the invention.

Finger assembly frame 832 includes a finger assembly frame outer flange 834 which, as shown in FIG. 41, engages an inner drive plate portion 836 of rotor 820. Such engagement advantageously fixes or seats finger assembly frame 832 relative to rotor 820. Such, in turn, enables the finger assembly, or a portion thereof, to be moved relative to the rotor for engaging the semiconductor workpiece.

Finger Assembly Drive System

Referring to FIGS. 37 and 39–41, the finger assembly includes a finger assembly drive system which is utilized to move the finger assembly between engaged and disengaged positions. The finger assembly drive system includes a bearing 838 and a collet 840 operatively adjacent the bearing. Bearing 838 includes a bearing receptacle 839 for receiving a pneumatically driven source, a fragmented portion of which is shown directly above the receptacle in FIG. 41. The pneumatically driven source serves to longitudinally reciprocate and rotate collet 840, and hence a preferred portion of finger assembly 824. A preferred pneumatically driven source is described below in more detail in connection with the preferred longitudinal and rotational movement effectuated thereby. Such longitudinal reciprocation is affected by a biasing mechanism in the form of a spring 842 which is operatively mounted between finger assembly frame 832 and a spring seat 844. The construction develop a bias between finger assembly frame 832 and spring seat 844 to bias the finger into engagement against a wafer. Advantageously, the cooperation between the above mentioned pneumatically driven source as affected by the biasing mechanism of the finger assembly drive system, enable collet 840 to be longitudinally reciprocated in both extending and retracting modes of movement. As such, finger assembly 824 includes a biased portion which is biased toward a first position and which is movable to a second position away from the first position. Other manners of longitudinally reciprocating the finger assembly are possible.

Finger Assembly Electrical System

Referring to FIGS. 37 and 40, the finger assembly preferably includes a finger assembly electrical system which is utilized to effectuate an electrical bias to a held workpiece and supply electrical current relative thereto. The finger assembly electrical system includes a pin connector 846 and a finger 848. Pin connector 846 advantageously provides an electrical connection to a power source (not shown) via wire 585 and associate slip ring mechanism, described above in connection with FIG. 28 and other Figs. This is for delivering an electrical bias and current to an electrode which is described below. Pin connector 846 also rides within angled slot 832a thereby mechanically defining the limits to which the finger assembly may be both longitudinally and rotationally moved.

Finger 848 is advantageously fixed or secured to or within collet 840 by a nut 850 which threadably engages a distal end portion of collet 840 as shown best in FIG. 39. An anti-rotation pin 852 advantageously secures finger 848 within collet 840 and prevents relative rotation therebetween. Electrical current is conducted from connector 846 through collet 840 to finger 860, all of which are conductive, such as from stainless steel. The finger and collet can be coated with a suitable dielectric coating 856, such as TEFLON or others. The collet 840 and finger member 860 are in one form of the invention made hollow and tubular to conduct a purge gas therethrough.

Finger assembly 824 may also optionally include a distal tip or finger tip 854. Tip 854 may also have a purge gas passage formed therethrough. Finger tip 854 advantageously engages against a semiconductor workpiece (see FIG. 41) and assists in holding or fixing the position of the workpiece relative to workpiece holder 810. Finger tip 854 also assists in providing an operative electrical connection between the finger assembly and a workpiece to which an electrical biased is to be applied and through which current can move. Finger tip 85 can include an electrode contact 858 for electrically contacting a surface of a semiconductor workpiece once such workpiece is secured as describe below.

Finger Assembly Drive System Interface

A finger assembly drive system interface is operatively coupled with the finger assembly drive system to effectuate movement of the finger assembly between the engaged and disengaged positions. A preferred finger assembly drive system interface is described with reference to FIGS. 37 and 41. One component of the finger assembly drive system interface is a finger actuator 862. Finger actuator 862 is advantageously provided for moving the finger assembly between the engaged and disengaged position. Finger actuator 862 acts by engaging bearing receptacle 839 and moving finger assembly 824 between an engaged position and a disengaged position. In the engaged position, finger tip 854 is engaged against a semiconductor workpiece. In the disengaged position finger tip 854 is moved away from the workpiece.

The finger assembly drive system interface includes pneumatic actuator 825 (FIG. 37). Pneumatic actuators 825 are operatively connected to an actuation ring 863 and operates thereupon causing the drive plate to move reciprocally in the vertical direction as viewed in FIG. 37. Finger actuator 862 is operatively connected to actuation ring 863 in a manner which, upon pneumatic actuation, moves the finger actuator into engagement with bearing receptacle 839 along the dashed line in FIG. 41. Such allows or enables the finger assembly to be moved longitudinally along a first movement path axis 864.

Pneumatic actuator linkage 825 also includes a secondary linkage 865. Secondary linkage 865 is pneumatic as well and includes a link arm 867. Link arm 867 is connected or joined to an actuator torque ring 869. Preferably, torque ring 869 is concentric with rotor 820 (FIG. 38) and circuitously links each of the finger actuators together. A pneumatic operator 871 is advantageously linked with the secondary linkage 865 for applying force and operating the linkage by angularly displacing torque ring 869. This in turn rotates the finger assemblies into and away from the engaged position.

Preferably finger actuator engagement bits 862, under the influence of pneumatic linkage 825, moves the finger assembly, and more specifically collet 840 and finger 848 along a first axial movement path along axis 864. The finger actuator engagement bits 862, then under the influence of pneumatic operator 871 are turned about the axes of each bit like a screwdriver. This moves collet 840 and finger 848 in a second angular movement. Such second movement turns the fingers sufficiently to produce the angular displacement shown in FIG. 42. According to a preferred aspect of this invention, such movement of the finger assemblies between the engaged and disengaged positions takes place when spin head assembly 814 has been moved 180° from its FIG. 36 disposition into a face-up condition.

The engagement bits 862 can be provided with a purge gas passage therethrough. Gas is supplied via tube 893 and is passed through the finger assemblies.

Engaged and Disengaged Positions

FIG. 42 is a view of a portion of a finger assembly, taken along line 7—7 in FIG. 39. Such shows in more detail the above-described engaged and disengaged positions and movement therebetween relative to a workpiece W. In the disengaged position, finger 848 is positioned adjacent the semiconductor workpiece and the finger tip and electrode contact do not overlap with workpiece W. In the engaged position, the finger tip overlaps with the workpiece and the electrode is brought to bear against the workpiece. From the disengaged position, finger assembly 824, upon the preferred actuation, is moved in a first direction away from the disengaged position. Preferably, such first direction is longitudinal and along first movement path axis 864. Such longitudinal movement is linear and in the direction of arrow A as shown in FIGS. 39 and 40. The movement moves the finger assembly to the position shown in dashed lines in FIG. 39. Such movement is effectuated by pneumatic operator 825 which operates upon actuation ring 863 (FIG. 37). This in turn, causes finger actuator 862 to engage with finger assembly 824. Such linear movement is limited by angled slot 832a. Thereafter, the finger assembly is preferably moved in a second direction which is different from the first direction and preferably rotational about the first movement path axis 864. Such is illustrated in FIG. 42 where the second direction defines a generally arcuate path between the engaged and disengaged positions. Such rotational movement is effectuated by secondary linkage 865 which pneumatically engages the finger actuator to effect rotation thereof. As so moved, the finger assembly swings into a ready position in which a semiconductor workpiece is ready to be engaged and held for processing. Once the finger assembly is moved or swung into place overlapping a workpiece, the preferred finger actuator is spring biased and released to bear against the workpiece. An engaged workpiece is shown in FIG. 41 after the workpiece has been engaged by finger tip 854 against a workpiece standoff 865, and spin head assembly 814 has been rotated back into the position shown in FIG. 36. Such preferred pneumatically assisted engagement takes place preferably along movement path axis 864 and in a direction which is into the plane of the page upon which FIG. 42 appears.

As shown in FIG. 39, finger 848 extends away from collet 840 and preferably includes a bend 866 between collet 840 and finger tip 854. The preferred bend is a reverse bend of around 180° which serves to point finger tip 854 toward workpiece W when the finger assembly is moved toward or into the engaged position (FIG. 42). Advantageously, the collet 840 and hence finger 848 are longitudinally reciprocally movable into and out of the engaged position.

Finger Assembly Seal

The finger assembly preferably includes a finger assembly seal 868 which is effectuated between finger 848 and a desired workpiece when the finger assembly is moved into the engaged position. Preferably, adjacent finger tip 854. Seal 868 is mounted adjacent electrode contact 858 and effectively seals the electrode contact therewithin when finger assembly 824 is moved to engage a workpiece. The seal can be made of a suitable flexible, preferably elastomeric material, such as VITON.

More specifically, and referring to FIG. 43, seal 868 can include a rim portion 870 which engages workpiece surface W and forms a sealing contact therebetween when the finger assembly is moved to the engaged position. Such seal advantageously isolates finger electrode 860 from the processing environment and materials which may plate out or otherwise be encountered therein. Seal 868 can be provided with an optional bellows wall structure 894 (FIG. 43), that allows more axial flexibility of the seal.

FIG. 43 shows, in solid lines, seal 868 in a disengaged position in which rim portion 870 is not engaged with workpiece W. FIG. 43 also shows, in phantom lines, an engaged position in which rim portion 870 is engaged with and forms a seal relative to workpiece W. Preferably and advantageously, electrode contact 858 is maintained in a generally retracted position within seal 868 when the finger assembly is in the disengaged position. However, when the finger assembly is moved into the engaged position, seal 868 and rim portion 870 thereof splay outwardly or otherwise yieldably deform to effectively enable the electrode and hence electrode contact 858 to move into the engaged position against the workpiece. One factor which assists in forming the preferred seal between the rim portion and the workpiece is the force which is developed by spring 842 which advantageously urges collet 840 and hence finger 860 and finger tip 858 in the direction of and against the captured workpiece. Such developed force assists in maintaining the integrity of the seal which is developed in the engaged position. Another factor which assists in forming the preferred seal is the yieldability or deformability of the finger tip when it is brought into contact with the workpiece. Such factors effectively create a continuous seal about the periphery of electrode contact 858 thereby protecting it from any materials, such as the preferred plating materials which are used during electroplate processing.

Methods and Operation

In accordance with a preferred processing aspect of the present invention, and in connection with the above-described semiconductor workpiece holder, a sheathed electrode, such as electrode 856, is positioned against a semiconductor workpiece surface in a manner which permits the electrode to impart a voltage bias and current flow to the workpiece to effectuate preferred electroplating processing of the workpiece. Such positioning not only allows a desired electrical bias to be imparted to a held workpiece, but also allows the workpiece itself to be mechanically held or fixed relative to the workpiece holder. That is, finger assembly 824 provides an electrical/mechanical connection between a workpiece and the workpiece holder as is discussed in more detail below.

Sheathed electrode 856 includes a sheathed electrode tip or electrode contact 858 which engages the workpiece surface. A seal is thus formed about the periphery of the electrode tip or contact 858 so that a desired electrical bias may be imparted to the workpiece to enable plating material to be plated thereon. According to a preferred aspect of the processing method, the sheathed electrode is moved in a first direction, preferably longitudinally along a movement axis, away from a disengaged position in which the workpiece surface is not engaged by the sheathed electrode tip or contact 858. Subsequently, the sheathed electrode is rotated about the same movement axis and toward an engaged position in which the electrode tip may engage, so as to fix, and thereafter bias the workpiece surface. Such preferred movement is effectuated by pneumatic linkage 825 and pneumatic operator 871 as described above.

According to a preferred aspect of the invention, the seal which is effectuated between the sheath tip and the workpiece is formed by utilizing a yieldable, deformable sheath tip or terminal end 868 which includes a sheath tip rim portion 870. The sheath tip rim portion 870 advantageously splays outwardly upon contacting the workpiece surface to form a continuous seal about the periphery of the electrode tip as shown in FIG. 8. The preferred electrode tip is brought into engagement with the workpiece surface by advancing the electrode tip from a retracted position within the sheath tip to an unretracted position in which the workpiece surface is engaged thereby. Such movement of the electrode tip between the retracted and unretracted positions is advantageously accommodated by the yieldable features of the sheath tip or terminal end 868.

In addition to providing the preferred electrical contact between the workpiece and the electrode tip, the finger assembly also forms a mechanical contact or connection between the assembly and the workpiece which effectively fixes the workpiece relative to the workpiece holder. Such is advantageous because one aspect of the preferred processing method includes rotating the workpiece about rotor axis 822 while the workpiece is exposed to the preferred plating material. Such not only ensures that the electrical connection and hence the electrical bias relative to the workpiece is maintained during processing, but that the mechanical fixation of the workpiece on the workpiece holder is maintained as well.

The above described pneumatically effectuated movement of the preferred finger assemblies between the engaged and disengaged positions is but one manner of effectuating such movement. Other manners of effectuating such movement are possible.

Methods Re Presenting Workpiece

The invention also includes novel methods for presenting a workpiece to a semiconductor process. In such methods, a workpiece is first secured to a workpiece holder. The methods work equally well for workpiece holders known in the art and for the novel workpiece holders disclosed herein.

In the next step in the sequence, the workpiece holder is rotated about a horizontal axis from an initial or first position where the workpiece holder was provided with the workpiece to a second position. The second position will be at an angle to the horizontal. The angle of the workpiece holder to the horizontal is defined by the angle between the plane of the workpiece and the horizontal. In the method, the workpiece holder is advantageously suspended about a second horizontal axis which is parallel to the first horizontal axis of the workpiece holder. At this point in the method, the angle between the first and second horizontal axes and a horizontal plane corresponds to the angle between the workpiece holder and the horizontal. The workpiece holder is then pivoted about the second horizontal axis to move the workpiece and the workpiece holder from its initial location to a final location in a horizontal plane. Advantageously, when the workpiece holder is pivoted about the second horizontal axis, the first horizontal axis also pivots about the second horizontal axis.

Preferably, during the step of rotating the workpiece holder about the first horizontal axis, the angle of the workpiece holder with respect to some known point, which is fixed with respect to the workpiece holder during the rotation process, is continually monitored. Monitoring allows for precise positioning of the workpiece holder with respect to the horizontal surface.

Likewise, during pivoting of the workpiece holder about the second horizontal axis, it is preferable that the angle defined by the line connecting the first and second horizontal axes and the horizontal plane be continually monitored. In this manner, the absolute position of the workpiece holder (and hence the workpiece itself) will be known with respect to the horizontal plane. This is important since the horizontal plane typically will contain the process to which the workpiece will be exposed.

It should be noted that in the above and following description, while the workpiece is described as being presented to a horizontal plane, it is possible that the workpiece may also be presented to a vertical plane or a plane at any angle between the vertical and the horizontal. Typically, the processing plane will be a horizontal plane due to the desire to avoid gravitational effects on process fluids to which the workpiece is exposed. In one embodiment after the workpiece has been presented to the processing plane, the workpiece holder is rotated about a spin axis to cause the workpiece to spin in the horizontal plane. Although not required in all semiconductor manufacturing processes, this is a common step which may be added in the appropriate circumstance.

The next advantageous step in the method consists of pivoting the workpiece holder about the second horizontal axis back along the path that the workpiece holder was initially pivoted along when presenting the workpiece to the horizontal process plane. There is no requirement that the workpiece holder be pivoted back to the same position whence it began, although doing so may have certain advantages as more fully described below.

The method advantageously further consists of the step of rotating the workpiece holder about the first horizontal axis to return the workpiece to the position when it was initially presented to and engaged by the workpiece holder. It is advantageous to rotate the workpiece holder about the first axis in a direction opposite from the initial rotation of the workpiece holder.

The advantage of having the workpiece holder terminate at an end position which corresponds to the initial position when the workpiece was loaded into the workpiece holder is efficiency. That is, additional machine movements are not required to position the workpiece holder to receive a new workpiece.

The method more preferably includes the step of rotating the workpiece holder about the first horizontal axis at at least two support points along the first horizontal axis. This beneficially provides support and stability to the workpiece holder during the rotation process and subsequent movement of the apparatus.

The method also more preferably includes the step of pivoting the workpiece holder along with the first horizontal axis about the second horizontal axis at at least two support points along the second horizontal axis. This beneficially provides additional support for the workpiece holder while allowing the workpiece holder to be moved in a vertical or "Z-axis" direction.

Importantly, the only motion described in the above method is rotational motion about several axes. In the method described, there is no translational motion of the workpiece holder in a X-, Y-, or Z-axis without corresponding movement in another axis as a result of rotating through an arc.

Electroplating Processing Station

The workpiece process tool may comprise several different modules for performing a variety of manufacturing process steps on the workpiece or semiconductor wafer. The workpiece processing tool may advantageously contain electroplating module 20, alternately known more generally as a workpiece processing station.

The plating module 20 of FIG. 44 is shown as a 5 bay plating module. This allows for up to 5 workpieces to be processed simultaneously. Each of the 5 electroplating bays may alternately be known as a workpiece processing station. Each workpiece processing station is advantageously provided with a workpiece support 401. Each workpiece support is further advantageously provided with a processing head 406, an operator arm 407, and an operator base 405. The details of the workpiece support 401 are described below. The operator base 405 of the workpiece support 401 is mounted to the workpiece processing station by securing it to the chassis or shelf of the workpiece module.

Workpiece support 601 is shown in a "open" or "receive wafer" position whereby a robotic arm or other means will provide a workpiece to the workpiece support. The workpiece support will positively engage the workpiece (described more fully below) by fingers 409 (or more precisely, by finger tips of finger assemblies, which are also described more fully below). The processing head 406 will then rotate about the operator arm 407 to place the workpiece in an essentially downward facing position. Operator arm 407 will then pivot about operator base 405 to place the workpiece in the processing bowl as shown at 602 of FIG. 2. The manufacturing step or process will then be performed upon the workpiece. Following the manufacturing step, the workpiece will be returned to the open position shown by workpiece support 601 at which time the workpiece will be removed from fingers 409.

Although the invention is described for an electroplating process, it is to be noted that the general arrangements and configurations of the workpiece processing stations and their combination into a multi-workpiece processing station unit may be applied to a variety of processes used in manufacturing.

FIG. 44 also shows an optional beam emitter 81 for emitting a laser beam detected by robotic wafer conveyors (not shown) to indicate position of the unit.

Figure 45:
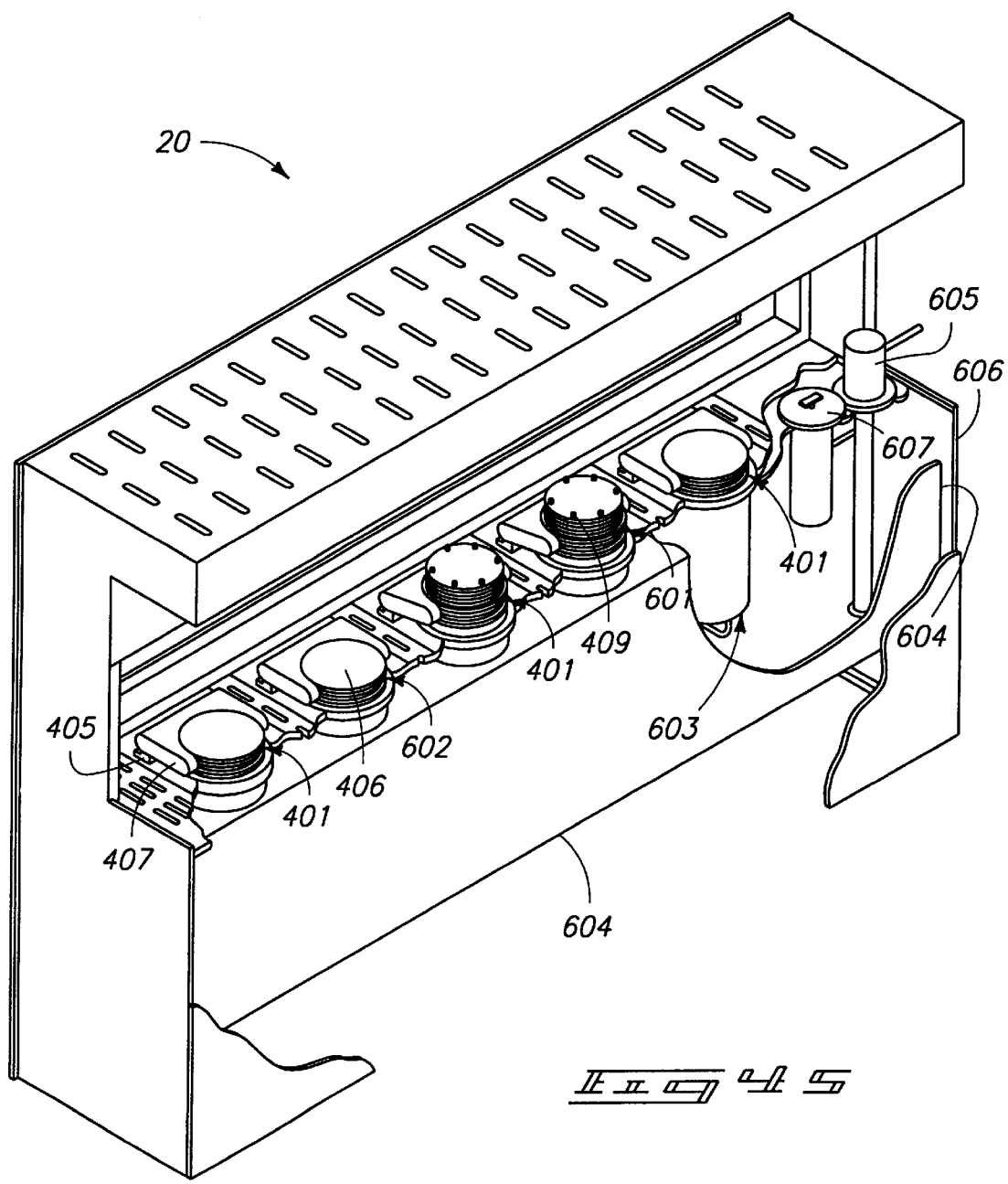
FIG. 45 is an isometric view of one embodiment of the apparatus of the system of FIG. 44 showing the internal components of the five unit plating module.
Figure 61:
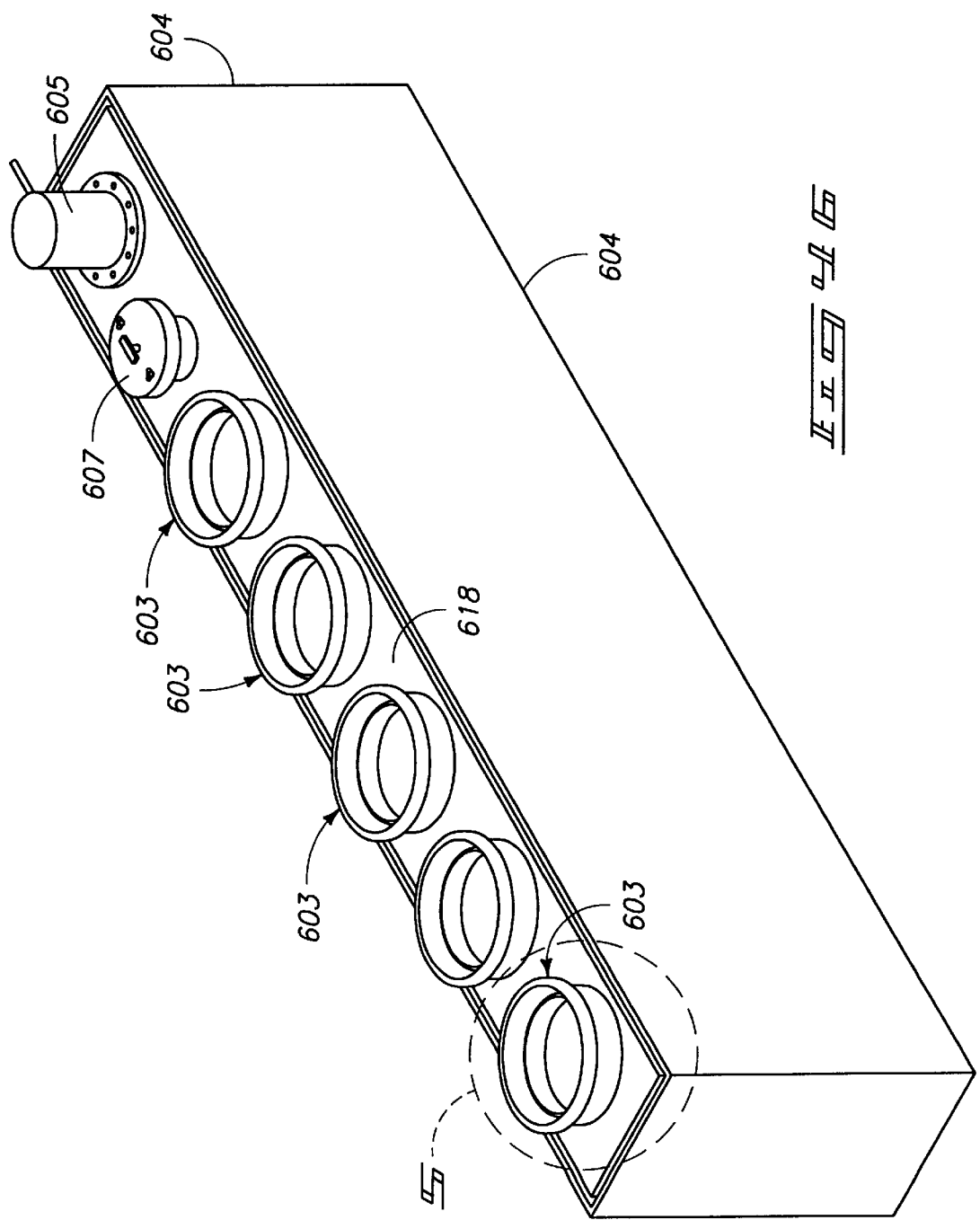
Figure 47:
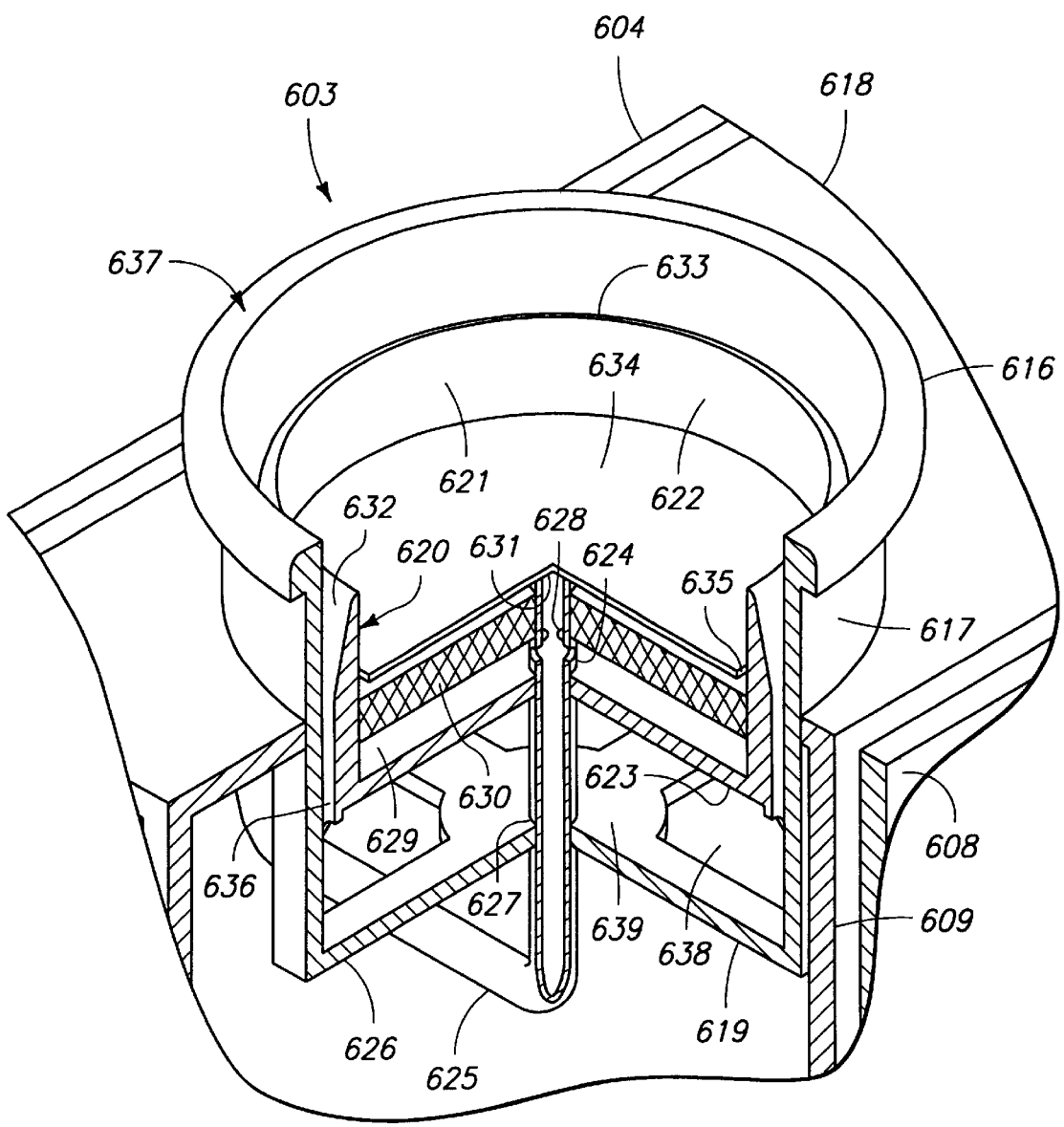

Turning to FIG. 45, an isometric view of the electroplating module 20 with the front panel cut away reveals that the module is advantageously provided with a series of process bowl assemblies or plating chamber assemblies 603, a process fluid reservoir 604, and an immersible pump 605. Each process bowl assembly 603 is connected to the immersible pump 605 by fluid transfer lines which preferably are provided with instrumentation and control features described more fully below.

The details of the bowl assemblies and their arrangement and configuration with the other components of the invention described herein are described more fully below.

The process fluid reservoir 604 is mounted within the processing module 20 by attaching it to the module frame or chassis 606. Turning to FIG. 4, the fluid reservoir 604 is shown in isolation with process bowl assembly 603, immersible pump 605, and pump discharge filter 607.

Figure 49:
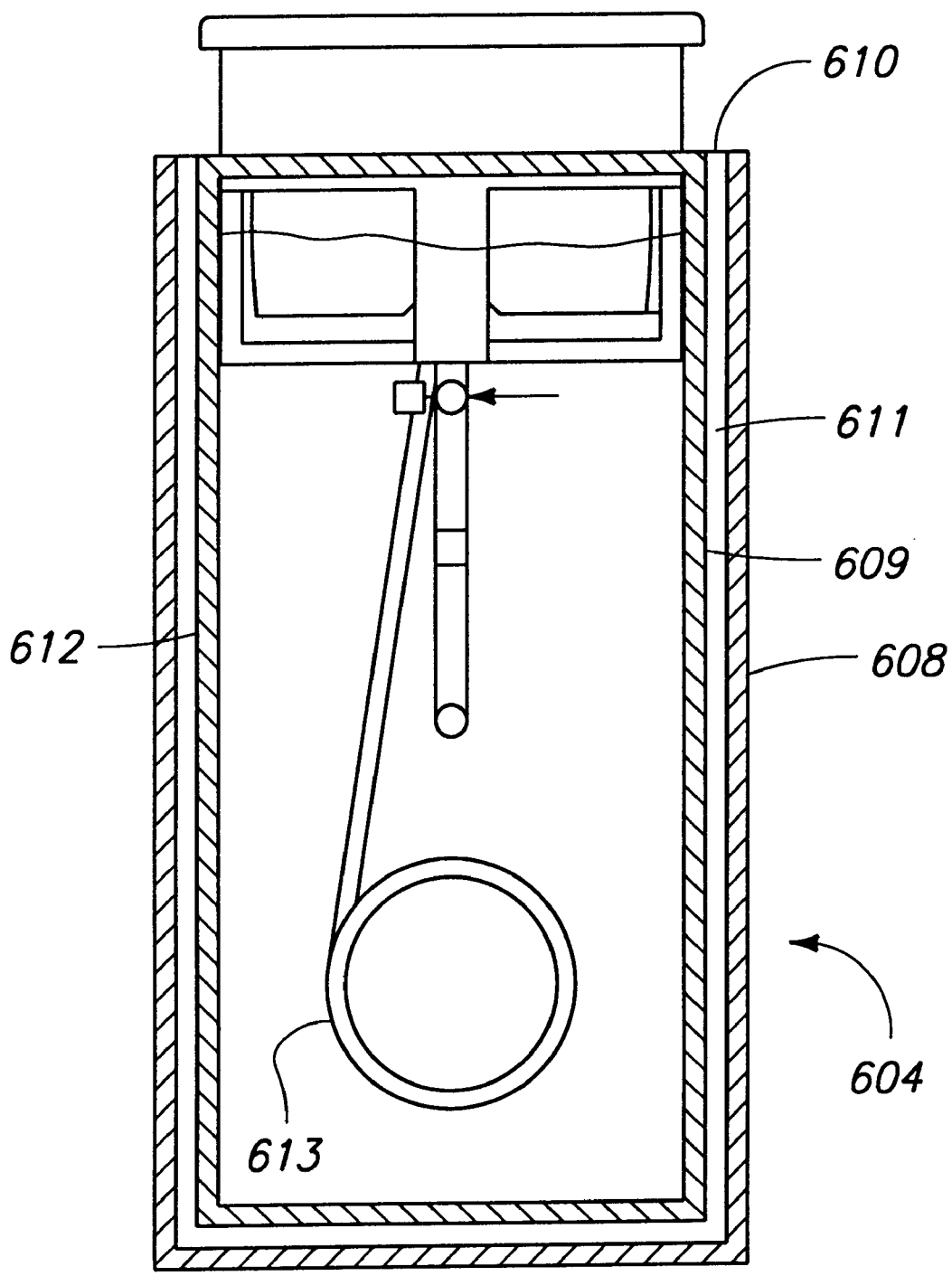
FIG. 49 is side elevation sectional view of the present invention showing the plating tank and a plating chamber.

Turning briefly to FIG. 49, a side sectional view of the fluid reservoir 604 is shown. As can be seen in FIG. 49, process fluid reservoir 604 is advantageously a double-walled vessel having an outer reservoir wall 608 and an inner reservoir wall 609 defining a reservoir safety volume 611 therebetween. Fluid reservoir 604 is preferably a double-walled vessel in the event that the inner wall 609 should leak. A double-walled vessel construction design would allow the leak to be contained within the reservoir safety volume 611 between the outer wall 608 and the inner wall 609. Should the reservoir safety volume become filled with fluid leaking from the inner vessel 612, the fluid would overflow through reservoir overflow opening 610. Reservoir opening 610 is preferably provided with guttering or the like to channel overflow fluid to a safe collection point (not shown). Further, the reservoir safety volume may be provided with liquid detection sensors (not shown) to alert operators in the event that the inner wall of reservoir 604 should become breached and fluid enter the reservoir safety volume 611.

Figure 48:
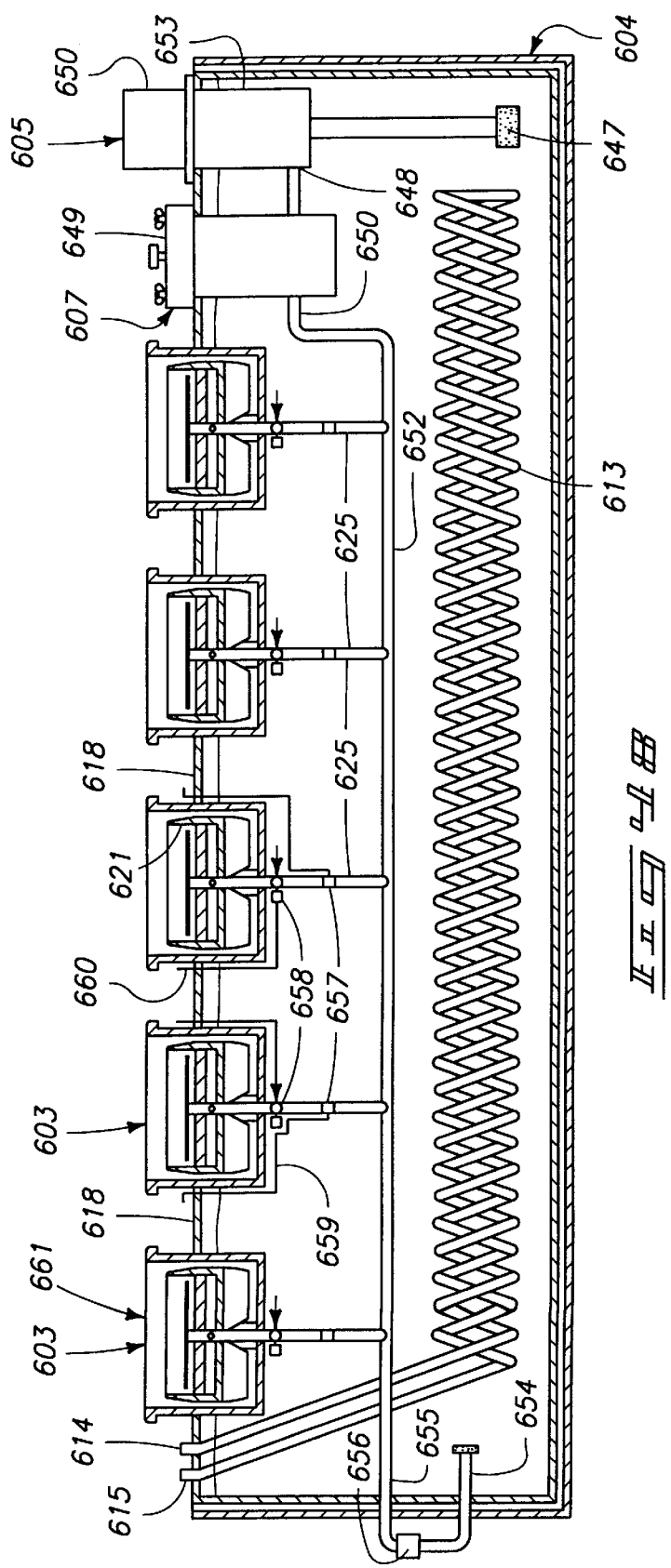
FIG. 48 is front elevation sectional view of the present invention showing the plating tank, the plating chambers, and the associated plumbing.

The process module may also be provided with a heat exchanger 613. Turning to FIG. 48, the heat exchanger 613 is shown in front elevation view of the process fluid reservoir 604. The heat exchanger shown in FIG. 48 is a double helix-type having an exchanger inlet 614 and an exchanger outlet 615. The exchanger 613 may be used for either cooling or heating the process fluid by circulating respectively either a cooler or warmer fluid through the exchanger than is present in the reservoir. Alternate designs of heat exchangers may also effectively be used in the apparatus of the present invention.

Bowl Assembly

Returning to FIG. 46, a plurality of bowl assembly 603 are shown mounted in reservoir top 618. The indicated process chamber 603 is shown in isometric detail in FIG. 47.

Figure 47:
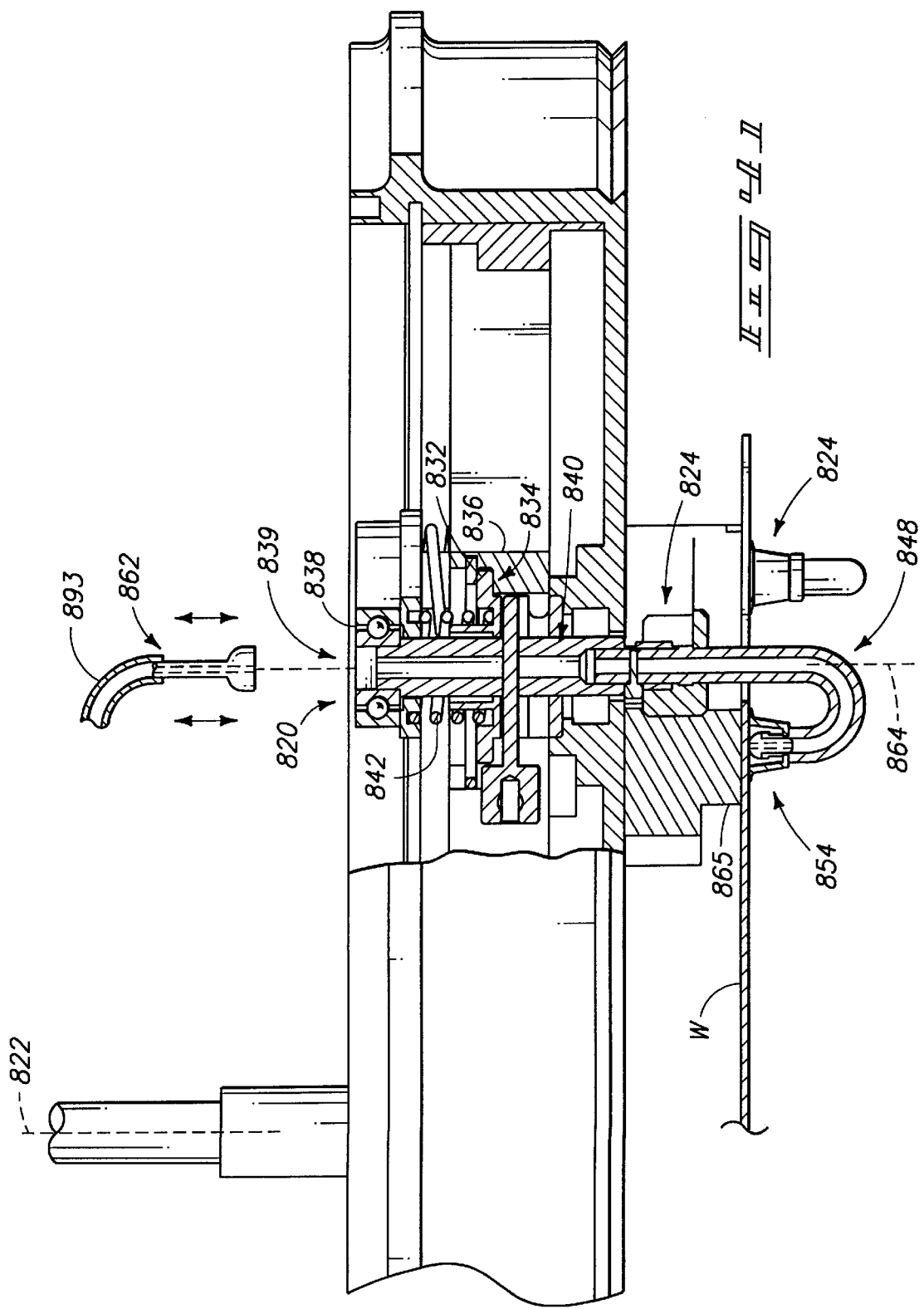
FIG. 47 is an isometric detail of a plating chamber of the apparatus of the present invention.

Turning to FIG. 47, it is seen that the bowl assembly 603 is secured within reservoir top 618. The process bowl assembly consists of a process bowl or plating chamber 616 having a bowl side 617 and a bowl bottom 619. The process bowl is preferably circular in a horizontal cross section and generally cylindrical in shape although the process bowl may be tapered as well.

The invention further advantageously includes a cup assembly 620 which is disposed within process bowl 616. Cup assembly 620 includes a fluid cup 621 having a cup side 622 and a cup bottom 623. As with the process bowl, the fluid cup 621 is preferably circular in horizontal cross section and cylindrical in shape, although a tapered cup may be used with a tapered process bowl.

Process fluid is provided to the process bowl 616 through fluid inlet line 625. Fluid inlet line rises through bowl bottom opening 627 and through cup fluid inlet opening 624 and terminates at inlet line end point 631. Fluid outlet openings 628 are disposed within the fluid inlet line 625 in the region between the cup fluid inlet opening 624 and fluid line end point 631. In this way, fluid may flow from the fluid inlet line 625 into the cup 621 by way of the inlet plenum 629.

The cup assembly 620 preferably includes a cup filter 630 which is disposed above the fluid inlet openings and securely fits between the inner cup wall 622 and the fluid inlet line 625 so that fluid must pass through the filter before entering the upper portion of cup 621.

In an electroplating process, the cup assembly 620 is advantageously provided with a metallic anode 634. Anode 634 is secured within the cup assembly by attaching it to the end point 631 of the fluid inlet line. Anode 634 is thus disposed above the cup filter 630 as well as above fluid inlet opening 628. Anode 634 is preferably circular in shape and of a smaller diameter than the inside diameter of cup 621. Anode 634 is secured to the end point 631 of fluid inlet line 625 so as to center the anode 634 within cup 621 creating an annular gap or space 635 between the inner cup wall 622 and the edge of anode 634. Anode 634 should be so placed such as to cause the anode annular opening 635 to be of a constant width throughout its circumference.

The outer cup wall 636 is advantageously of a smaller diameter than the inside diameter of bowl 616. Cup assembly 620 is preferably positioned within bowl 616 such that a first annular space or process fluid overflow space 632 is formed between bowl side 617 and cup outer wall 636. The cup assembly is more preferably positioned such that the annular fluid overflow space 632 is of a constant width throughout its circumference.

Cup assembly 620 is further advantageously positioned within bowl 616 such that cup upper edge 633 is below bowl upper edge 637. Cup 621 is preferably height-adjustable with respect to bowl upper edge 637, as more fully described below.

Bowl bottom 619 is preferably configured so as to have a large open area allowing the free transfer of fluid therethrough. In the preferred embodiment, this is achieved by the structure shown in FIG. 47 wherein the process bowl bottom 619 is composed of crossbars 626 which intersect at bowl bottom center plate 639 creating fluid return openings 638. Bowl bottom center plate 639 is provided with bowl bottom opening 627 to allow fluid inlet line 625 to pass therethrough. In the preferred embodiment, the bowl sides 617 below the reservoir top 618 are also similarly constructed so that bowl sides below reservoir top 618 are essentially composed of 4 rectangular sections which then turn inward towards bowl bottom center plate 639 intersecting thereat. Such a configuration allows for a high degree of fluid flow to pass through the bowl lower portion which is disposed within reservoir 604.

Thus, in operation, process fluid is provided through process fluid inlet line 625 and discharges through fluid outlet openings 628 within the lower part of the cup assembly 620. By virtue of cup filter 620, fluid entering the fluid inlet plenum 629 is distributed across the plenum and then flows upward through filter 630 to the bottom of anode 634.

From the top side of filter 630, the process fluid continues to flow in an upward direction by virtue of continuing feed of process fluid through process inlet line 625. The process fluid flows around the annular gap 635 between the anode 634 and the inner cup wall 622. As the process fluid continues to well up within cup 621, it will eventually reach upper cup edge 633 and will overflow into the overflow annular gap 632 between the outer cup wall 636 and the inner wall of bowl 616.

The overflowing fluid will flow from the overflow gap 632 downward through the gap and back into reservoir 604 where it will be collected for reuse, recycling, or disposal. In this manner, no process fluid return line is required and no elaborate fluid collection system is necessary to collect surplus fluid from the process.

As a further advantage, the location of the cup filter 630 and anode 634 within the cup 621 provides an even distribution of fluid inlet into the cup. The even distribution beneficially assists in providing a quiescent fluid surface at the top of cup 621. In like manner, maintaining a constant distance between the outer wall of cup 636 and the inner wall of bowl 616 in providing the overflow gap 632 will assist in providing an even flow of fluid out of cup 621 and into the reservoir 604. This further beneficially assists in providing the desired quiescence state of the process fluid at the top of cup 621.

The material selection for cup filter 620 will be dictated by the process and other operating needs. Typically, the filter will have the capability of filtering particles as small as 0.1 microns. Likewise, the choice of materials for anode 634 will be dictated by the desired metal to be electroplated onto the workpiece.

While the above bowl assembly has been described particularly for an electroplating process, it can be seen that for a process where a flow of fluid is required but no anode is required removing the anode 634 from the cup assembly 603 will provide a quiescent pool of liquid for the process. In such an arrangement, the end point 631 of the fluid inlet line 625 would be capped or plugged by a cap or plug rather than by the anode 634.

To assist in ensuring that process fluid overflows into the annular gap 632 evenly, it is necessary to ensure that the cup upper edge 633 is level such that fluid does not flow off of one side of cup 621 faster than on another side. To accomplish this objective, levelers are preferably provided with the process bowl assembly 603.

Turning now to FIG. 50, the process bowl assembly of FIG. 47 is shown in cross section along with the workpiece support 401. The process bowl assembly 603 is shown mounted to the process module deck plate 666. Plating chamber assembly 603 is preferably provided with levelers 640 (only one of which is shown in this view) which allow the plating chamber assembly to be leveled relative to the top of reservoir 618. The levelers may consist of jack screws threaded within the edge of module deck plate 666 and in contact with the process module frame 606 so as to elevate the process bowl assembly 603 relative to the process module 20. The process bowl assembly 603 is preferably provided with three such bowl levelers distributed about the bowl periphery. This allows for leveling in both an X and Y axis or what may be generically described as "left and right leveling and front and rear leveling."

Since process bowl assembly 603 is free to move with respect to fluid reservoir 604, when process bowl assembly 603 is fit closely within fluid reservoir 604 as shown in FIG. 50, the process bowl/fluid reservoir junction preferably has a compliant bowl seal 665 disposed therebetween to allow movement of the proces bowl 616 with resepct to reservoir inner wall 609. Compliant seal 665 further prevents process fluid from passing through the opening between the process bowl and the reservoir wall.

Cup assembly 620 is preferably provided with cup height adjuster 641. The cup height adjuster shown and described herein consists of a cup height adjustment jack 643 which is positioned about an externally portion of inlet line 625. Cup 621 is secured to cup height adjustment jack 643 with cup lock nut 642. Cup lock nut 642 is used to secure cup 621 in its height position following adjustment. The upper end of cup height adjustment jack 641 is provided with adjustment tool access holes 667 to allow for adjusting of the height of the cup from the top of the bowl rather than the underside. The cup height adjuster 641 may additionally be provided with a fluid seal such as an o-ring (not shown) disposed within the annular space formed between the adjsutment jack 643 and the cup bottom 623.

The process bowl assembly 603 is more preferably provided with an additional height adjuster for the anode 634. Since it is desirable to be able to adjust the distance between the anode 634 and the workpiece based upon the particular electroplating process being used, anode height adjuster 646 is beneficially provided. Anode height adjuster 646 is formed by mounting the anode 634 on the threaded anode post 664. A threaded anode adjustment sleeve 663 is used to connect the threaded upper end of inlet line 625. Anode adjustment sleeve 663 is provided with sleeve openings 668 to allow fluid to pass from fluid outlet openings 628 into the inlet plenum 629. The space between the bottom of anode post 664 and the upper end of fluid inlet line 625, and bounded by the anode adjustment sleeve 663, defines a fluid outlet chamber 662. Fluid outlet chamber is of variable volume as the anode post 664 moves upward and downward with height adjustment of the anode 634.

On the bowl leveler 640 and the height adjusters 641 and 646 described above, it is additionally desirable to provide them with locking mechanisms so that once the desired positioning of the device (i.e., the bowl, the cup, or the anode) is achieved, the position may be maintained by securing the adjusters so that they do not move out of adjustment as a result of vibration or other physical events.

Allowing independent height adjustment of the cup and anode each with respect to the bowl provides a large degree of flexability in adjusting the process bowl assembly 603 to accomodate a wide selection of processes.

Fluid Transfer Equipment

To provide process fluid to the process bowl assembly in the electroplating module of the present invention, the module is advantageously provided with fluid transfer equipment. The fluid transfer equipment is provided to draw process fluid from a reservoir, supply it to the process bowl assemblies, and return it to a common collection point.

Turning now to FIG. 48, a cross section of the reservoir and process bowl assemblies and additional equipment shown in FIG. 46 is shown. FIG. 48 shows a immersible pump 605 which is mounted to the reservoir top 618. The plating module is advantageously provided with such a pump which further consists of a fluid suction or pump suction 647 which draws process fluid from the reservoir 604. The immersible pump pumps fluid from the pump suction 640 into the pump body 653 and out through the fluid discharge or pump discharge 648. Immersible pump 605 is preferably driven by an electric pump motor 650.

In alternate embodiments of the present invention, a submersible pump may be deployed. However, the immersible pump has the advantage that it may be easily removed for servicing and the like. In yet another embodiment, individual pumps for each of the process bowl assemblies may be deployed or, process bowls assemblies may share a set of common pumps. Each such pump would have a process fluid inlet suction and a process fluid discharge.

Returning to the preferred embodiment of FIG. 48, the plating module preferably has a pump discharge filter 607 which is connected in line with pump discharge 648. Pump discharge filter 607 is preferably provided with a removable filter top 649 so that filter cartridges within the filter may be replaced. The filter type, size and screen size will be dictated by the needs of the particular process being deployed at the time.

From the pump discharge filter 607, the process fluid exits through filter outlet 651 and into supply manifold 652. The supply manifold supplies all of the process bowl assemblies 603 with process fluid. Branching off from the supply manifold 652 are the individual fluid inlet lines 625. The fluid inlet lines 625 are preferably provided with flow control devices which are more fully described below.

At the down stream end of the supply manifold 652 after the final processing bowl assembly 661, the manifold is routed to fluid return line 654. Although the supply manifold could be terminated at an open ended point at optional end point 655, in the preferred embodiment, the supply manifold 652 is additionally provided with a back pressure regulator 656, which is described more fully below. Since it is advantageous to have the back pressure regulator outside of the fluid reservoir for ease of access, the fluid return line 654 is provided when the back pressure regulator 656 is employed.

Control Devices

In the preferred embodiment, the work station processing module of the present invention further includes devices for controlling the flow and distribution of the process fluid to the process bowl assemblies.

With reference to FIG. 48, the apparatus of the present invention is beneficially provided with flow sensors 657 which are disposed within the fluid inlet line 625 for each individual process bowl assembly 603. The flow sensors 657 will measure the amount of process fluid flowing through each fluid inlet line and will generate a signal which will be transmitted by flow signal line 659. A signal will typically be an electrical signal but may also be a pneumatic or other type of signal.

The processing modules 603 are also preferrably provided with flow restrictors 658 which are disposed in fluid inlet lines 625 after the flow sensor 657 but before the fluid outlet opening 628 within cup 621 (shown in FIG. 47). The flow restrictor may alternately be known as a variable orifice or a control valve. The flow restrictor 658 may either be manually adjustable, or may be responsive to a signal provided by flow control signal line 660. The flow control signal line may be a pneumatic, electrical or other type of signal. The objective of the flow controller is to control the quantity of process fluid being provided to the fluid cup 621 during the processing step of manufacturing the semiconductor. When the flow restrictor is responsive to a control signal, the information provided from the flow signal line 659 may be used to modify or generate the flow control signal which is then provided to the flow controller 658. This control may be provided by a micro processor or by other control devices which are commercially available.

More preferably, the semiconductor processing module is provided with back pressure regulator 656. As pump discharge filter 607 becomes restricted due to captured filtrate, the pressure within supply manifold 652 will drop, reducing flow of process fluid to the fluid cups 621. Back pressure regulator 656 is used to maintain a preselected pressure in the supply manifold 652 to ensure that sufficient pressure is available to provide the required flow of process fluid to the fluid cups. Back pressure regulator 656 further comprises an internal pressure sensor and preferably includes a signal generator for generating a control signal to open or close the back pressure regulator to increase or decrease the pressure in the supply manifold. The back pressure regulator may be controlled by an external controller such as a micro processor or it may have a local set point and be controlled by an internal local control mechanism.

In an alternate embodiment, where a dedicated process pump is used for each process bowl assembly, a back pressure regulator would typically not be required.

Plating Methods

The present invention also includes a novel method for processing a semiconductor workpiece during manufacturing.

In the preferred embodiments of the method, a semiconductor workpiece or wafer is presented to the semiconductor manufacturing process. This may be accomplished by use of the workpiece support 401 shown in FIG. 50 and described more fully herein. FIG. 51 shows the workpiece W being presented to the process. At the time that the workpiece is presented to the process, the process fluid, which in an electroplating process is an electrolytic solution, is cause to flow within a processing chamber (herein the cup 621) to the workpiece. This assures that a sufficient quantity of fluid is available for the required process step.

The workpiece W is preferably presented to the process in a precisely located position so that all surfaces of the workpiece are exposed to the solution. In an electroplating process, it is advantageous to expose only the downward facing or working surface of the wafer to the electrolytic solution and not the backside of the wafer. This requires accurate positioning of the wafer with respect to the fluid surface. In an electroplating process, the method also requires the step of accurately positioning the workpiece with respect to the anode 634 so that the anode and workpiece are separated by an equal distance at all points.

Once the workpiece has been positioned as the process may specifically require, the next step in the method is performing the actual processing step itself. For example, in an electroplating application, the processing step would include applying an electric current to the workpiece so as to generate the current through the electrolytic solution thereby plating out a layer of a desired metallic substance on the wafer. Typically a current will be applied to the anode as well, with a negative current being applied to the workpiece. The processing step is applied for the length of time which is dictated by the process itself.

The process further includes the step of continuing a flow of the process fluid such that the process fluid overflows the processing chamber and falls under gravitational forces into a process fluid reservoir. Preferably the process fluid reservoir is the same reservoir which provides the process fluid or solution to the process.

As an additional step in the method of processing the semiconductor wafer in the electroplating process, the method includes the further step of spinning or rotating the workpiece about a vertical axis while it is exposed to the electrolytic solution. The rate of rotation varies between about 5 and 30 rpm and is more preferably approximately 10 rpm. The rotation step provides the beneficial result of additional assurance of even distribution of the electrolytic solution across the face of the workpiece during the electroplating process.

After the processing has been performed on the semiconductor wafer, the method advantageously includes the step of removing the workpiece from the process and returning it to a position where it may be removed for further processing or removal from the semiconductor workpiece process tool.

The method preferably includes the step of performing the above-described steps at a series of process bowls having a common fluid reservoir such that the overflowing fluid gravity drains into a common fluid reservoir.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A workpiece processing tool, comprising:

a plurality of workpiece processing modules for processing a workpiece;

each of said workpiece processing modules being interchangeable;

a workpiece conveyor disposed between said workpiece processing modules and having at least two workpiece transport units, said workpiece processing modules being positioned adjacent opposing sides of said workpiece conveyor;

said workpiece conveyor including a first transport unit guide having at least one motion actuator for controllably moving one of said at least two workpiece transport units therealong and a second transport unit guide having at least one motion actuator for controllably moving the other of said at least two workpiece transport units therealong;

said at least two workpiece transport units including a first workpiece transport unit coupled with the first transport unit guide and a second workpiece transport unit coupled with the second transport unit guide;

said at least two workpiece transport units each configured to support a single workpiece and access each of said workpiece processing modules for transferring workpieces therebetween.

2. The workpiece processing tool of claim 1 wherein said at least one motion actuator comprises at least one portion of a linear magnetic motor.

3. The workpiece processing tool of claim 1 wherein each of said first and second workpiece transport units includes a magnet coupled for operation with said at least one motion actuator.

4. The workpiece processing tool of claim 1 wherein each of said first and second workpiece transport units includes:

a tram;

a workpiece transfer arm movably connected to said tram and having a workpiece support mounted at a distal end thereof for holding a workpiece;

a transfer arm elevator intermediate said tram and said workpiece transfer arm for adjusting the vertical position of said workpiece transfer arm.

5. The workpiece processing tool of claim 1 wherein each of said first and second workpiece transport units includes a position indicator for determining the position of the respective one of said of said first and second workpiece transport units relative to a respective one of said workpiece processing modules.

6. The workpiece processing tool of claim 1 further comprising at least one workpiece interface module adjacent said workpiece conveyor for supporting a workpiece cassette having a plurality of workpieces therein;

said workpiece interface configured to present said workpiece cassette in an extraction position which permits at least one of said two workpiece transport units to access the workpieces.

7. The workpiece processing tool of claim 6 wherein each said at least one workpiece interface includes:

a workpiece cassette turnstile for moving a workpiece cassette between a load position and a transfer position;

a workpiece cassette elevator adjacent said workpiece cassette turnstile and configured to transfer workpiece cassettes therebetween and provide the workpiece cassette in the extraction position.

8. The workpiece processing tool of claim 6 further comprising a process load door adjacent said at least one workpiece interface module and configured to permit workpiece cassettes to pass therethrough.

9. The workpiece processing tool of claim 1 further comprising:

a first workpiece interface module for receiving unprocessed workpieces;

a second workpiece interface module for receiving processed workpieces.

10. The workpiece processing tool of claim 9 wherein each of said first and second workpiece transport units may access said first workpiece interface module and said second workpiece interface module.

11. The workpiece processing tool of claim 1 further comprising an air supply intermediate opposing ones of said workpiece processing modules for supplying clean air to said workpiece processing tool.

12. The workpiece processing tool of claim 11 further comprising at least one exhaust duct adjacent said transport unit guide for removing the air.

13. The workpiece processing tool of claim 1 wherein each of said first and second workpiece transport units supports an individual workpiece.

14. The workpiece processing tool of claim 1 wherein each of said workpiece processing modules includes a workpiece holder configured to receive a workpiece from each of said first and second transport units.

* * * * *